United States Patent
Shizuno

(10) Patent No.: US 7,525,167 B2
(45) Date of Patent: Apr. 28, 2009

(54) SEMICONDUCTOR DEVICE WITH SIMPLIFIED CONSTITUTION

(75) Inventor: Yoshinori Shizuno, Kanagawa (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 485 days.

(21) Appl. No.: 10/697,315

(22) Filed: Oct. 31, 2003

(65) Prior Publication Data

US 2006/0043514 A1 Mar. 2, 2006

(30) Foreign Application Priority Data

Nov. 8, 2002 (JP) ............................. 2002/325771

(51) Int. Cl.
*H01L 29/78* (2006.01)
(52) U.S. Cl. ........................................ 257/434; 438/48
(58) Field of Classification Search ................. 257/434
See application file for complete search history.

(56) References Cited

U.S. PATENT DOCUMENTS

| | | | |
|---|---|---|---|
| 4,418,284 A * | 11/1983 | Ogawa et al. | 250/208.1 |
| 5,716,759 A | 2/1998 | Badehi | |
| 5,959,358 A * | 9/1999 | Lanford et al. | 257/762 |
| 6,040,235 A | 3/2000 | Badehi | |
| 6,159,837 A * | 12/2000 | Yamaji et al. | 438/613 |
| 6,333,565 B1 * | 12/2001 | Hashimoto | 257/781 |
| 6,441,478 B2 | 8/2002 | Park | |
| 6,455,920 B2 | 9/2002 | Fukasawa et al. | |
| 6,740,950 B2 * | 5/2004 | Paek | 257/433 |
| 2002/0064935 A1 * | 5/2002 | Honda | 438/622 |

FOREIGN PATENT DOCUMENTS

| | | |
|---|---|---|
| JP | 9-064049 | 3/1997 |
| JP | 9-199701 | 7/1997 |
| JP | 11251493 A | 9/1999 |
| JP | 2000-323510 | 11/2000 |
| JP | 2000-353762 | 12/2000 |
| JP | 2001094041 A | 4/2001 |
| JP | 2001-144204 | 5/2001 |
| JP | 2001156250 A | 6/2001 |
| JP | 2001189413 A | 7/2001 |
| JP | 2001-298050 | 10/2001 |
| JP | 2001358997 | 12/2001 |
| JP | 2002-118207 | 4/2002 |
| JP | 2002-270859 | 9/2002 |
| WO | WO 99/40624 | 8/1999 |

* cited by examiner

*Primary Examiner*—Thao X Le
*Assistant Examiner*—Ajay K Arora
(74) *Attorney, Agent, or Firm*—Rabin & Berdo, P.C.

(57) ABSTRACT

An image-capturing semiconductor device is provided with a simplified constitution and by means of fewer steps than conventional techniques. In a semiconductor device which is packaged at substantially identical outer dimensions to the outer dimensions of a first semiconductor chip, first pads serving as electrode pads are formed along a main surface of the semiconductor chip so as to be electrically connected to a circuit element provided on the semiconductor chip. A sensor portion is formed on the main surface such that a light-receiving surface thereof is exposed. A glass plate for transmitting incoming light to the sensor portion is formed in a position covering the light-receiving surface of the sensor portion. A wiring layer is formed so as to extend over the main surface of the first semiconductor chip and such that one end thereof is connected to the first pads. Solder balls are electrically connected to the first pads via the wiring layer.

12 Claims, 28 Drawing Sheets

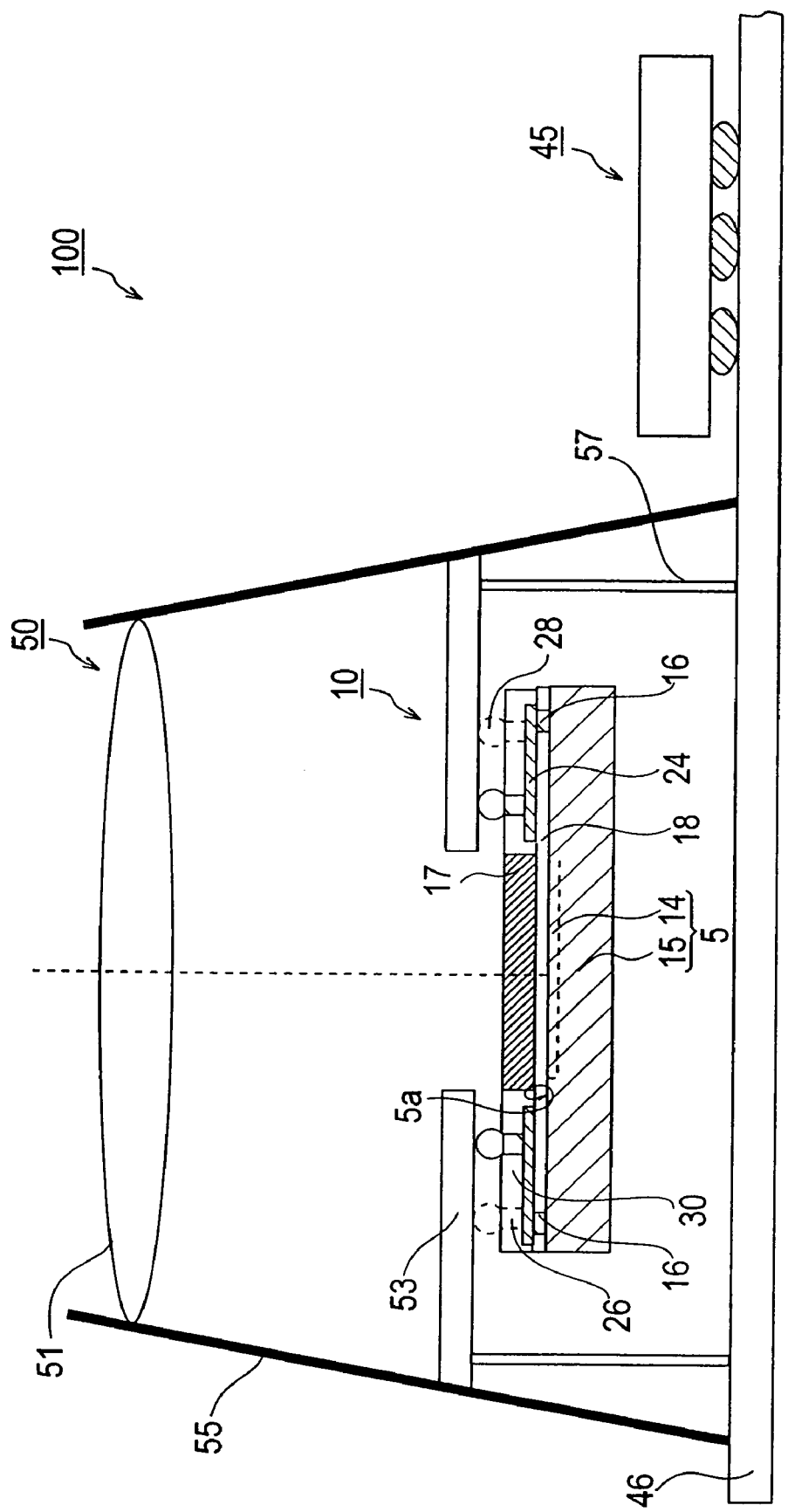

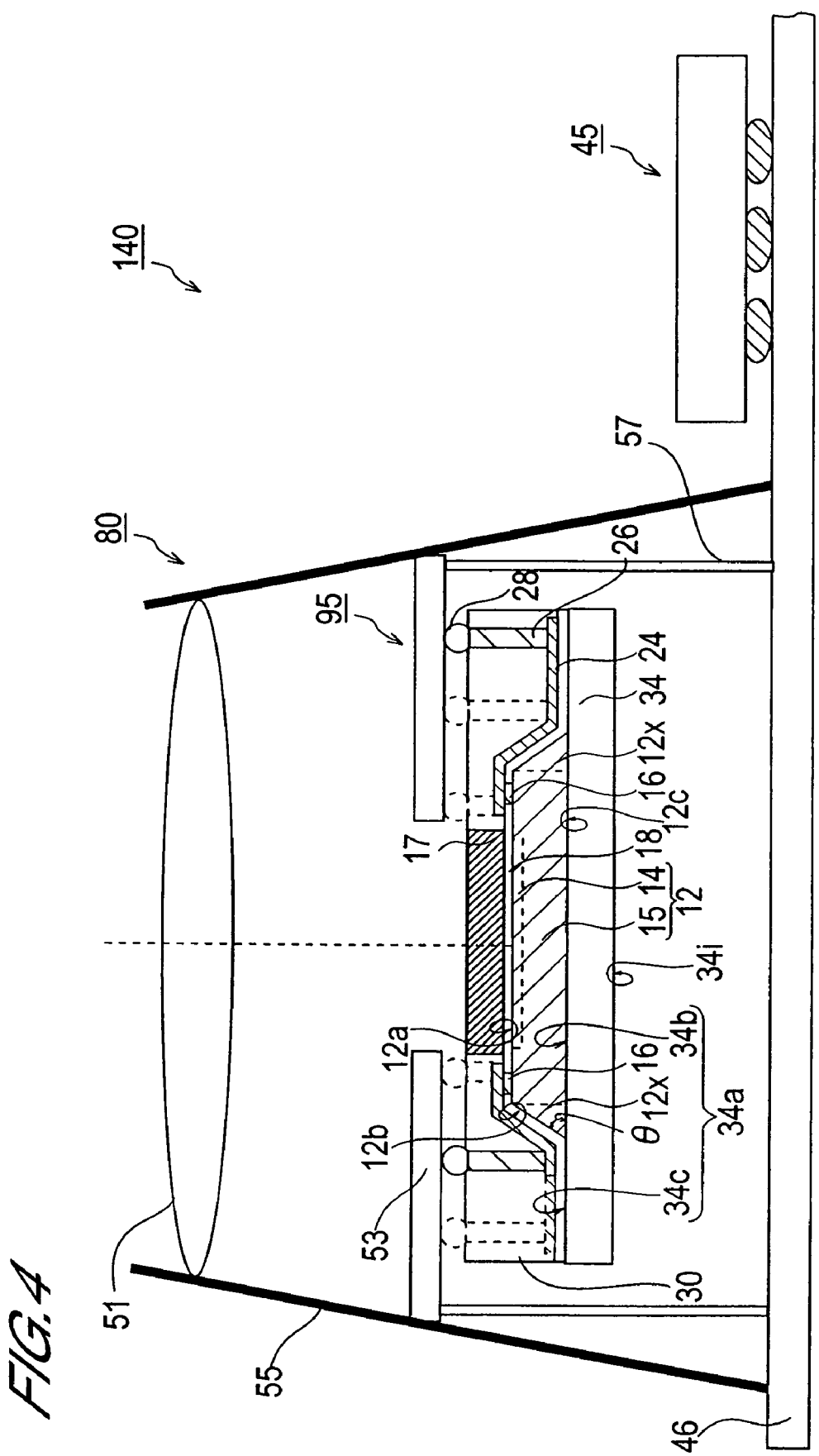

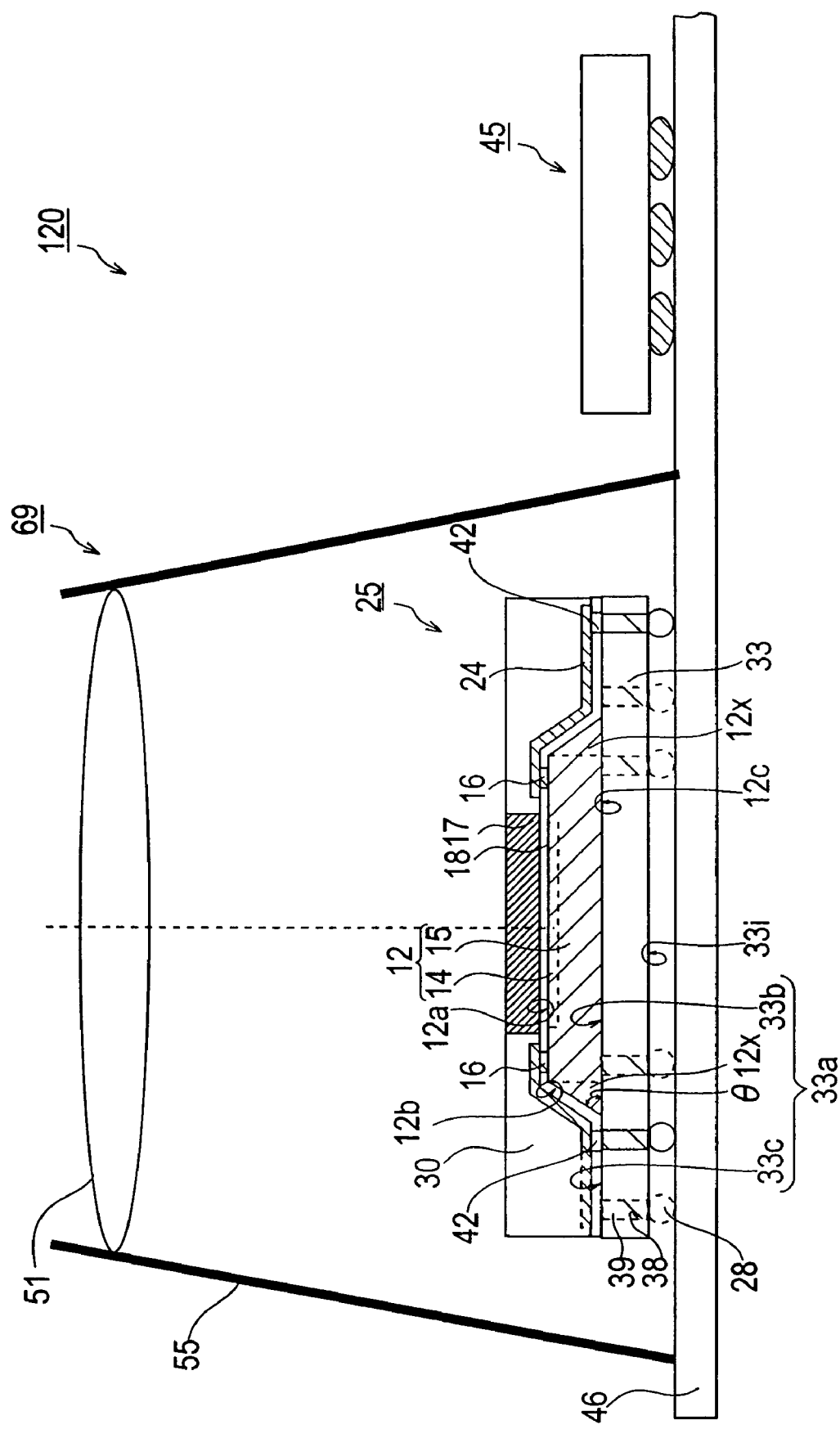

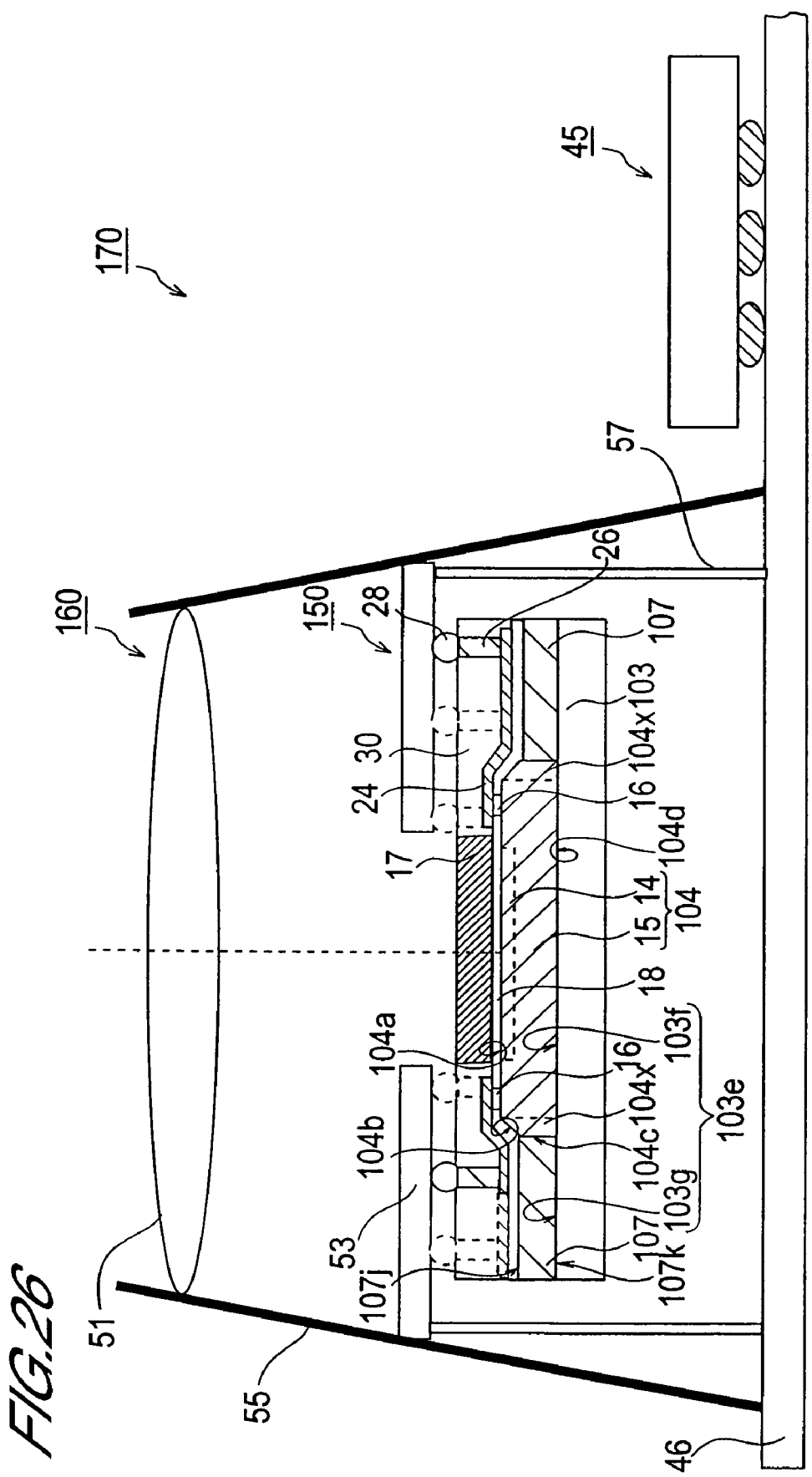

SEMICONDUCTOR DEVICE WITH SIMPLIFIED CONSTITUTION

BACKGROUND OF THE INVENTION

1. Field of the Invention

This invention relates to a semiconductor device, and more particularly to a semiconductor device suitable for use in a camera system (camera unit) constitution.

2. Description of Related Art

In recent years, electronic devices such as portable telephones and personal computers have come to be installed with a camera system (camera unit) comprising a CCD image sensor, CMOS image sensor, or similar.

Such camera systems are mainly constituted by a camera portion, an image processing device (for example a DSP (Digital Signal Processor) or the like) for processing image signals (signal charges) generated by the camera portion in response to incident light on the camera portion, and a display device or the like for displaying an image corresponding to the image signals processed by the image processing device.

The camera portion is mainly constituted by a semiconductor device for capturing images (also to be referred to simply as "image-capturing semiconductor device" hereinafter) comprising a light-receiving element portion which is mounted on a printed circuit board (mother board), and a lens. In the camera portion, condensed light from the lens which enters the light-receiving element portion in the image-capturing semiconductor device is converted into a signal charge, whereupon this signal charge is outputted to the image processing device.

Conventionally, such image-capturing semiconductor devices are mounted on a printed circuit board via thin metal wires (a wire bonding method).

When such a wire bonding method is used, however, inductance in the bonding parts rises, making impedance matching between the circuits in the image-capturing semiconductor device difficult.

Moreover, the wire loop causes the volume required by the image-capturing semiconductor device to increase. The region occupied by the image-capturing semiconductor device itself is also large, and hence many problems need to be solved.

Thus in recent years research into wireless bonding methods in which the image-capturing semiconductor device and the printed circuit board are connected by external terminals such as solder balls has been flourishing.

Currently, WCSP (Wafer-level Chip Size Package) is being proposed as a constitution employing a wireless bonding method (see, for example, KOHYO Publication No. 2002-512436)

A WCSP is a CSP which is packaged at substantially identical outer dimensions to the outer dimensions of the semiconductor chip, and particularly one which is separated into individual packages following the completion of an external terminal forming step when in wafer form in order to reduce manufacturing costs.

An advantage of this WCSP is that the external terminals which are electrically connected to the semiconductor chip can be redisposed in a desired position by means of a rewiring layer, and thus wiring design freedom is increased. Moreover, signal attenuation can be suppressed in comparison with a WB system, and matching of the characteristic impedance of the signal line with the impedance of the semiconductor chip can be easily achieved, providing an excellent high frequency characteristic.

In accordance with the recent trend toward electronic device miniaturization, the development of high density packaging technologies for semiconductor devices is advancing.

In order to realize such high density packaging, an MCP (Multi Chip Package) in which a plurality of chips is disposed two-dimensionally in one package or stacked in the direction of thickness of the semiconductor chips has been proposed.

In conventional image-capturing semiconductor devices employing a WCSP constitution (see KOHYO Publication No. 2002-512436), however, the rewiring layer which electrically connects the semiconductor chip and external terminals is bent in a complex fashion to form a reversed "c".

As a result, the device constitution itself and the manufacturing process thereof become complicated, and there has been concern about consequent rises in the cost of semiconductor devices.

It is therefore an object of this invention to provide a semiconductor device having a constitution which is simplified in comparison with a conventional device and which can be constructed using fewer processes than a conventional device on the basis of a WCSP constitution and manufacturing process, the scope of application of which is expected to increase in the future due to the significance thereof, and also to provide a camera system having smaller dimensions than a conventional camera system.

SUMMARY OF THE INVENTION

A semiconductor device of this invention is constituted in the following manner.

That is, the semiconductor device of this invention is constituted so as to be packaged at substantially identical outer dimensions to the outer dimensions of a first semiconductor chip.

First pads which are electrode pads for electrically connecting a circuit element provided on the semiconductor chip are formed on a main surface of the semiconductor chip. A light-receiving element portion is formed on the main surface of the semiconductor chip such that a light-receiving surface thereof is exposed. A light-transmitting portion for transmitting incoming light to the light-receiving element portion is formed in a position covering the light-receiving surface of the light-receiving element portion. A wiring layer is formed to be electrically connected to the first pads and to extend from the first pads over the main surface of the first semiconductor chip. External terminals are formed in a position opposing the wiring later and electrically connected to the first pads via the wiring layer.

The semiconductor device of this invention is manufactured as follows.

First, according to this manufacturing method, a first semiconductor chip having a main surface on which first pads are provided and a light-receiving element portion which is formed on the main surface such that a light-receiving surface thereof is exposed on the main surface is prepared. The manufacturing method of this invention comprises the following processing steps which are performed in respect of the first semiconductor chip: forming a wiring layer, one end of which is electrically connected to the first pads, and which extends over the main surface of the semiconductor chip; forming a light-transmitting portion for transmitting incoming light to the light-receiving element portion in a position covering the light-receiving surface of the light-receiving element portion; and forming external terminals in a position opposing the wiring layer so as to be electrically connected to the first pads via the wiring layer.

In order to manufacture the semiconductor device of this invention, the following manufactured methods are preferably employed.

(1) A manufacturing method comprising the steps of:

forming a wiring layer on a first semiconductor chip, which includes a main surface on which first pads are provided and which is formed with a light-receiving element portion having a light-receiving surface exposed on the main surface, so as to be electrically connected to the first pads and extending from the first pads to the main surface;

forming a light-transmitting portion for transmitting incoming light to the light-receiving element portion in a position covering the light-receiving surface of the light-receiving element portion; and forming external terminals in positions opposing the wiring layer so as to be electrically connected to the first pads via the wiring layer.

(2) A manufacturing method comprising the steps of:

forming side wall surfaces on a first semiconductor chip which includes a first main surface on which first pads are provided and a second main surface which opposes the first main surface and has a larger surface area than the first main surface, and which is formed with a light-receiving element portion having a light-receiving surface which is exposed on the first main surface, so as to connect the first main surface and second main surface;

placing the first semiconductor chip on which the side wall surfaces are formed over a first region of a semiconductor chip carrying portion which includes a third main surface including the first region and a second region which surrounds the first region and a fourth main surface which opposes the third main surface;

forming a wiring layer which is electrically connected to the first pads and which extends from the first pads, along the first main surface and side wall surfaces, to the second region;

forming a light-transmitting portion for transmitting incoming light to the light-receiving element portion in a position covering the light-receiving surface of the light-receiving element portion; and forming external terminals over the second region so as to be electrically connected to the first pads via the wiring layer.

(3) A manufacturing method comprising the steps of:

forming side wall surfaces on a first semiconductor chip which includes a first main surface on which first pads are provided and a second main surface which opposes the first main surface and has a larger surface area than the first main surface, and which is formed with a light-receiving element portion having a light-receiving surface which is exposed on the first main surface, so as to connect the first main surface and second main surface;

placing the first semiconductor chip on which the side wall surfaces are formed on a first region of a semiconductor chip carrying portion which includes a third main surface comprising the first region and a second region which surrounds the first region and a fourth main surface which opposes the third main surface;

forming a wiring layer which is electrically connected to the first pads and which extends from the first pads, along the first main surface and side wall surfaces, to the second region;

forming a light-transmitting portion for transmitting incoming light to the light-receiving element portion in a position covering the light-receiving surface of the light-receiving element portion; and forming external terminals over the fourth main surface side so as to be electrically connected to the wiring layer via conductive portions formed in a through hole which penetrates from the front to rear of the carrying portion.

Note that a sealing material applying step for applying a light-transmitting sealing material to the upper side of the semiconductor chip carrying portion and the first semiconductor chip such that the first semiconductor chip is buried is preferably performed after the wiring layer forming step and before the light-transmitting portion forming step, and that the light-transmitting portion forming step is preferably performed before the sealing material applied in a position covering the light-receiving element portion is hardened.

Further, if, after the wiring layer forming step and before the light-transmitting portion forming step, a light-transmitting sealing material having an expansion coefficient which is greater than an expansion coefficient of the semiconductor chip carrying portion is applied in a position covering the light-receiving surface of the light-receiving element portion upon the sealing material applying step for forming a sealing layer over the semiconductor chip carrying portion and the first semiconductor chip such that the first semiconductor chip is buried, then it is preferable that a sealing material having a smaller expansion coefficient than the expansion coefficient of the light-transmitting film be applied over at least the second region, and that the light-transmitting portion forming step be performed before the light-transmitting sealing material applied in a position covering the light-receiving surface of the light-receiving element portion is hardened.

Further, when the surface area of the surface of the light-transmitting portion which opposes the light-receiving surface of the light-receiving element portion is set to be larger than the surface area of the light-receiving surface in the light-transmitting portion forming step, the light-transmitting portion is preferably formed with a convex portion in a position opposing the light-receiving surface and a concave portion in a position on the periphery of the convex portion opposing the wiring layer and not in contact therewith.

(4) A manufacturing method comprises the steps of:

forming an inclined side wall face on a first semiconductor chip which includes a first main surface on which first pads are provided and a second main surface which opposes the first main surface and has a larger surface area than the first main surface, and which is formed with a light-receiving element portion having a light-receiving surface which is exposed on the first main surface, by chamfering an edge portion of a side wall surface which connects the first main surface and second main surface;

forming a frame-shape portion comprising a third main surface, a fourth main surface which opposes the third main surface, and an opening portion for disposing the first semiconductor chip such that at least a surface region of the inclined side wall surface on the first main surface side is exposed on a support portion such that the fourth main surface opposes the support portion;

placing the first semiconductor chip on the support portion by disposing the first semiconductor chip within the opening portion;

forming a wiring layer which is electrically connected to the first pads and extends from the first pads over the first main surface and inclined side wall surface to the third main surface;

forming a light-transmitting portion for transmitting incoming light to the light-receiving element portion in a position covering the light-receiving surface of the light-receiving element portion; and forming external terminals on the third main surface so as to be electrically connected to the first pads via the wiring layer.

Note that a support portion removing step for removing the support portion is preferably included after the placing step.

Further, in the light-transmitting portion forming step in the manufacturing methods (1), (2), and (3) above, it is preferable that a jig to which a plurality of light-transmitting portions is adhered at predetermined distances be disposed and adhered in a predetermined position at which the light-transmitting portion covers the light-receiving surface of the light-receiving element portion, and that the light-transmitting portion be removed from the jig thereafter such that the light-transmitting portion remains.

In the light-transmitting portion forming step in the manufacturing methods (1) through (4) above, it is preferable that light-transmitting portions be formed simultaneously in respect of a plurality of first semiconductor chips using a common light-transmitting portion continuous body for the plurality of first semiconductor chips.

According to such a constitution, a semiconductor device having a simpler constitution than a conventional WCSP constitution (see KOHYO Publication No. 2002-512436) can be obtained by means of fewer processes than conventionally.

Furthermore, according to this constitution a smaller semiconductor device than a conventional semiconductor device employing a WB system can be obtained.

BRIEF DESCRIPTION OF THE DRAWINGS

The foregoings and other objects, features and advantageous of the present invention will be better understood from the following description taken in connection with the accompanying drawings, in which:

FIG. 1 is a schematic sectional view showing a camera system comprising a semiconductor device according to a first embodiment of this invention;

FIG. 4 is a schematic sectional view showing a camera system comprising a semiconductor device according to a second embodiment of this invention;

FIG. 13 is a schematic sectional view showing a camera system comprising a semiconductor device according to a sixth embodiment of this invention;

FIG. 26 is a schematic side view showing a camera system comprising a semiconductor device according to an eleventh embodiment of this invention;

DESCRIPTION OF THE PREFERRED EMBODIMENTS

Figure 2A:
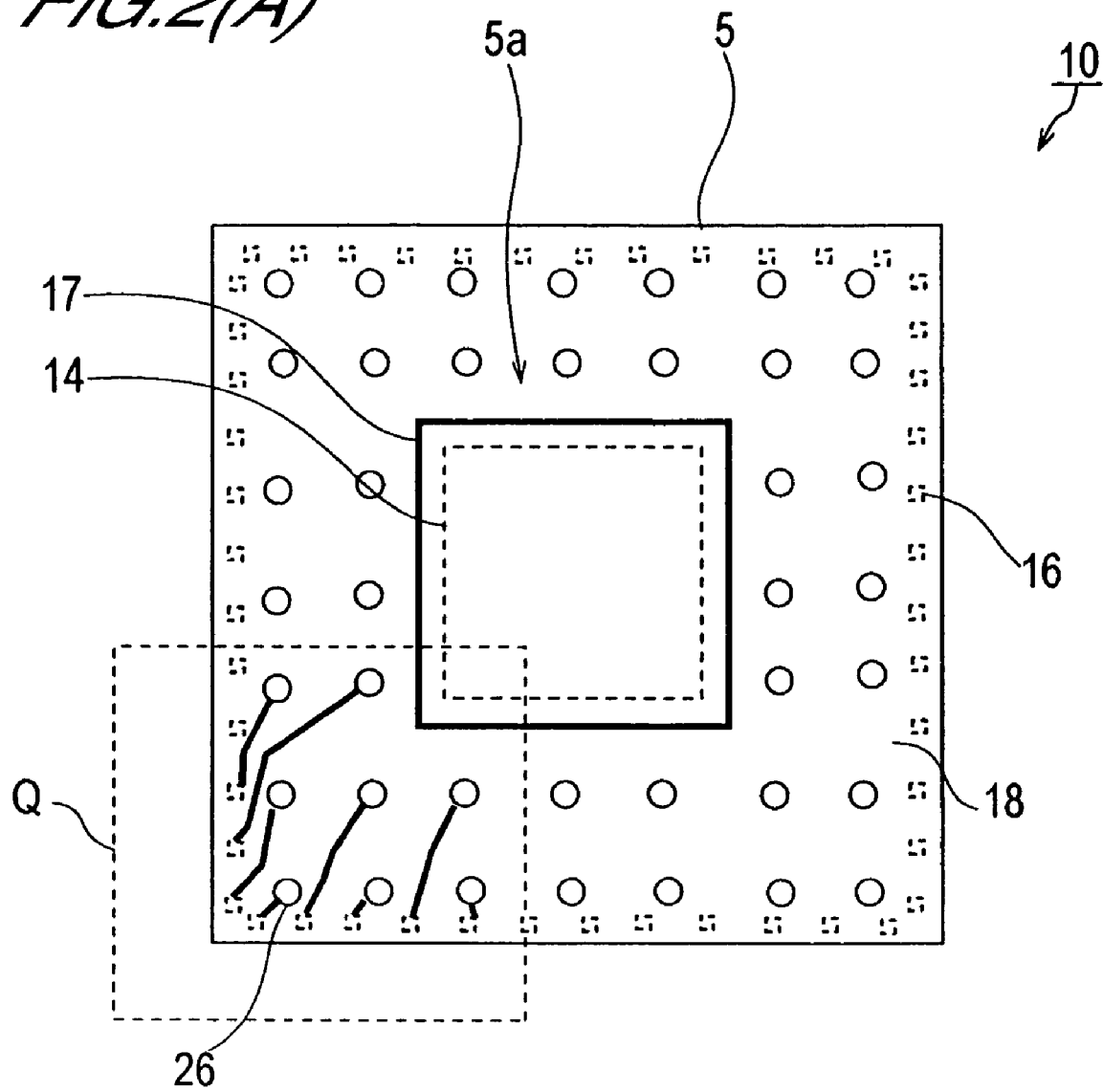
FIG. 2(A) is a schematic plan view showing the semiconductor device according to the first embodiment of this invention.

Embodiments of this invention will be described below with reference to FIGS. 1 through 30. Note that in each of the drawings, one constitutional example of the semiconductor device according to this invention is illustrated schematically. Further, each drawing merely illustrates the form, magnitude, and positional relationships of each constitutional component schematically in order to facilitate understanding of this invention, and this invention is not limited by these illustrated examples. In order to facilitate understanding of the drawings, shading (diagonal lines) indicating a cross section has been omitted except in one part. Further, although specific materials, conditions, and so on are used in the following description, these materials and conditions are merely one preferred example thereof and therefore do not place any limitations on this invention. Similar constitutional components in the drawings are allocated and illustrated with identical reference symbols, and duplicate description thereof has occasionally been omitted. Moreover, the planar form of the semiconductor device and semiconductor chip in the following description is illustrated as a square shape, but this form may be modified appropriately at will in accordance with design specifications.

In the following embodiments, the semiconductor device according to this invention is described using as an example thereof an image-capturing semiconductor device provided in a camera system.

First Embodiment

An image-capturing semiconductor device 10 according to a first embodiment of this invention and a manufacturing method therefor will now be described-with reference to FIGS. 1 through 3.

Figure 2B:
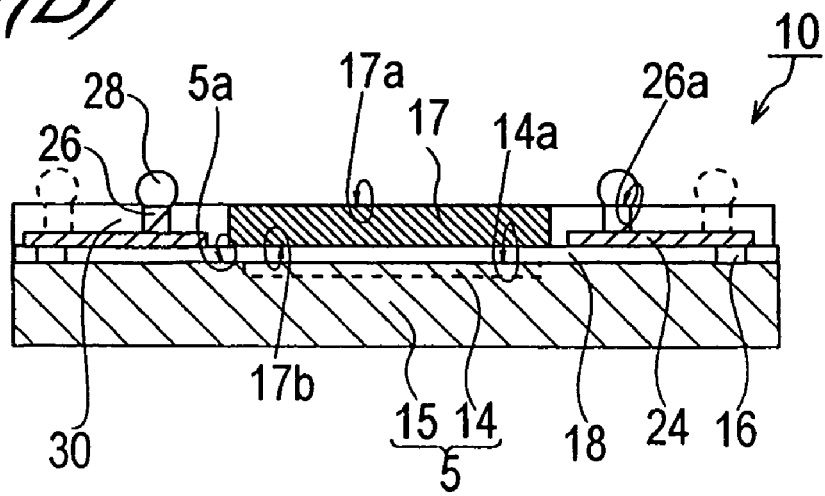
FIG. 2(B) is a schematic sectional view showing a part of the semiconductor device according to the first embodiment of this invention.

FIG. 1 is a partial schematic cross section of a camera system (camera unit) 100 according to this embodiment for illustrating an example of the main constitutional parts thereof. FIG. 2(A) is a schematic plan view of the image-capturing semiconductor device 10 provided in a camera portion 50 of the camera system 100 of this embodiment. FIG. 2(B), although not corresponding exactly to FIG. 2(A), is a schematic sectional view showing a modification of the connection relationships and disposal positions of each constitutional element of the semiconductor device 10 in order to illustrate these connection relationships and disposal positions. Note that in FIG. 2(A), external terminals (solder balls) 28 and the like which are formed on post portions 26 are not illustrated, and that first pads 16, a wiring layer 24, and the outline of a part of the post portions 26 are only illustrated in a region (to be referred to as "region Q" hereinafter) surrounded by a broken line Q in the drawing (likewise in each of the following embodiments).

As shown in FIG. 1, the camera system 100 of this embodiment is constituted by the camera portion 50 and an image processing device 45 such as a DSP arranged on a common first printed circuit board (mother board) 46 (note that for convenience, a display device and so on normally comprised in a camera system have been omitted (likewise in each of the following embodiments)).

The camera portion 50 in this constitutional example comprises an image-capturing semiconductor device 10 provided with a sensor portion 14 which serves as a light-receiving element portion, an image-capturing lens 51 for condensing light which enters the image-capturing semiconductor device 10, a second printed circuit board 53 on which the external terminals (solder balls) 28 provided on the image-capturing semiconductor device 10 are mounted, a cover 55 which serves as a support portion for supporting the lens 51 and second printed circuit board 53, and pins 57 made of an iron (Fe)/nickel (Ni) alloy or copper (Cu), for example, for electrically connecting the first printed circuit board 46 and second printed circuit board 53. Note that the lens, which serves as a light transmitting portion, may be a lens which transmits visible light, ultraviolet light, or infrared light according to the intended purpose. In the following embodiments, description is provided using an example in which the incoming light is visible light.

In this constitutional example, a glass plate 17 which serves as a light-transmitting portion of the packaged image-capturing semiconductor device 10 is formed on the same plane as the solder balls 28. In other words the image-capturing semiconductor device 10 has a face-down constitution.

The image-capturing semiconductor device 10 according to this invention will now be described in detail with reference to FIGS. 2(A) and 2(B).

A first semiconductor chip 5 comprised in the image-capturing semiconductor device 10 comprises a sensor portion 14 which serves as a light-receiving element portion constituted by a plurality of circuit elements, and a peripheral circuit portion 15 constituted by a plurality of circuit elements and the like which drive the sensor portion 14.

In this constitutional example, the sensor portion 14 is formed such that a light-receiving surface (not shown) of the light-receiving element, such as a photodiode for example, is exposed on a main surface 5a of the first semiconductor chip 5. In the regions of the main surface 5a of the first semiconductor chip 5 other than the sensor portion 14, electrode pads 16 which are electrically connected to the circuit elements in the peripheral circuit portion 15 are disposed at a predetermined pitch around the outer periphery of the main surface 5a of the first semiconductor chip 5. Here, these electrode pads will be referred to as first pads. The first pads 16 are formed from aluminum (Al), for example. In the example in FIG. 2(A), the planar form of the first semiconductor chip 5 is square, and thus the first pads 16 are arranged linearly along each edge of the square. Note that the disposal number and disposal positions of the first pads 16 may be set at will in accordance with design specifications (likewise in each of the following embodiments).

A light-transmitting insulating film (for example an epoxy resin film, silicone resin film, or similar if visible light is used) 18, for example, is formed on the first semiconductor chip 5 such that the top face of the first pads 16 is exposed. Note that if the insulating film 18 is not a light-transmitting film (for example a polyimide film or the like if visible light is used), then an opening should be formed in the insulating film such that the light-receiving surface of the sensor portion 14, as well as the top face of the first pads 16, is exposed through the insulating film.

A plane parallel plate-form glass plate 17, for example, serving as a light-transmitting portion for transmitting incoming light to the sensor portion 14, is formed opposite the sensor portion 14 so as to cover the sensor portion 14 and sandwich the insulating film 18. At this time, the sensor portion 14 and glass plate 17 are fixed (bonded) by a light-transmitting film (not shown) such as epoxy resin serving as an adhesive. Note that the material for the light-transmitting portion is not limited to glass alone, and any material which does not cause a deterioration in the transmittivity of incoming light to the sensor portion 14 and which is capable of suppressing external impacts and the like on the sensor portion 14 may be selected and used appropriately.

Each first pad 16 is individually electrically connected to copper post portions 26 via a dedicated wiring layer 24 made of copper, for example, which extends over the insulating film 18 in the direction of the center of the first semiconductor chip 5. This wiring layer 24 functions as a rewiring layer which allows the solder balls 28 formed on the post portions 26 to be redisposed in desired positions regardless of the positions of the first pads 16. Note that the wiring layer 24 is formed by patterning and is therefore also referred to as a wiring pattern.

A sealing layer 30 formed from an epoxy resin or the like is formed on the upper side of the first semiconductor chip 5 such that the top face (i.e. the end face) 26a of the post portions 26 and an upper face 17a of the glass plate 17 are exposed. More specifically, the sealing layer 30 is provided on the insulation film 18, on the wiring layer 24, and on side surfaces of the post portions 26, and surrounds a side surface of the glass plate 17, as shown in FIG. 2(B). The sealing layer 30 may be formed to be in direct contact with the side surface of the glass plate 17, as shown in FIG. 2(B). The solder balls 28 serving as external terminals for connecting the image-capturing semiconductor device 10 to the second printed circuit board 53 are formed on the top face of each post portion 26. Note that in this constitutional example, the upper face 17a of the glass plate 17 indicates the surface of the glass plate 17 which opposes the exposed face of the sensor portion 14, or in other words the surface of the glass plate on the opposite side to a rear face 17b of the glass plate.

The image-capturing semiconductor device 10 in this constitutional example converts an image received by the sensor portion 14 via the lens 51 into an image signal (electrical signal) and outputs the image signal to the image processing device 45 such as a DSP. In the image processing device 45, the inputted image signal is conversion processed into image data and outputted to a display device (not shown). An image corresponding to the image data is then displayed on the display device.

More specifically, an output signal from the first semiconductor chip 5 in this constitutional example is transmitted along a path from the first pads 16 via the wiring layer 24 and post portions 26 to the solder balls 28. Note that the transmission path is not limited thereto and may be formed as a variety of wiring paths in accordance with the intended purpose and design specifications.

Next, a manufacturing method for the image-capturing semiconductor device 10 will be described with reference to FIG. 3.

First, as a wiring layer forming step, the first semiconductor chip 5 comprising the light-receiving element portion (i.e. the sensor portion) 14 is prepared such that the first pads 16 are provided on the main surface 5a thereof and a light-receiving surface 14a is exposed on the main surface 5a. Then, the wiring layer 24 is formed so as to extend over the main surface 5a of the first semiconductor chip 5 and such that one end thereof is connected to the first pads 16.

Figure 3A:
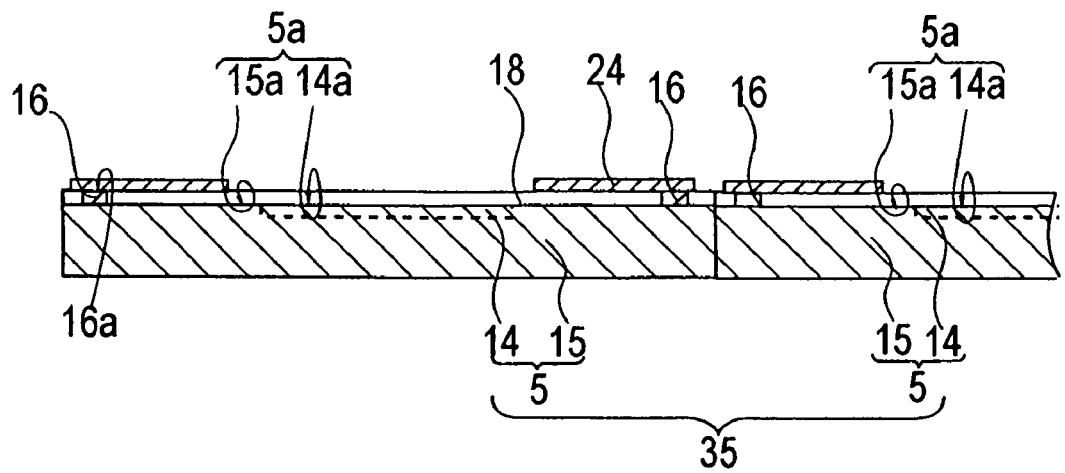
FIGS. 3(A) through (C) are schematic sectional views illustrating manufacturing processes for the semiconductor device according to the first embodiment of this invention.

More specifically, as shown in FIG. 3(A), a semiconductor wafer 35 comprising a plurality of first semiconductor chips 5 is prepared. As well as the sensor portion 14, the first semiconductor chip 5 also comprises the peripheral circuit portion 15 comprising circuit elements and the like for driving the sensor portion 14. The first pads 16 are provided in a plurality in the regions of the main surface 5a of the first semiconductor chip 5 other than the light-receiving surface 14a of the sensor portion 14, or in other words a peripheral surrounding region 15a which surrounds the light-receiving surface. The first pads 16 are formed from aluminum, for example, and connected to predetermined circuit elements provided on the first semiconductor chip 5. Note that for convenience, only approximately two first semiconductor chips 5 are illustrated in the drawing, but the present invention is not limited thereto.

Next, the insulating film 18 constituted by a light (visible light) transmitting epoxy resin film is formed over the entire main surface 5a of the first semiconductor chip 5 such that the top face 16a of the first pads 16 is exposed. In this constitutional example, the epoxy resin film 18 has a light-transmitting property which does not hinder the transmission of incoming light (visible light in this case) to the sensor portion 14, and is therefore provided so as to cover the sensor portion 14. If a film such as a polyimide film which does not transmit visible light is used as the insulating film 18, however, an opening is formed in the insulating film through which the light-receiving surface 14a of the sensor portion 14 is exposed.

Next, the wiring layer 24 made of copper, for example, is formed by sputtering, photolithography, and the like such that one end thereof is connected to each of the first pads 16 and extending over the main surface 5a of the first semiconductor chip 5. Note that the wiring layer 24 is formed by patterning and is therefore also referred to as a wiring pattern.

Next, as a light-transmitting portion forming step, the glass plate 17 serving as a light-transmitting portion for transmitting incoming light to the sensor portion 14 is formed in a position so as to cover the sensor portion 14.

Figure 3B:
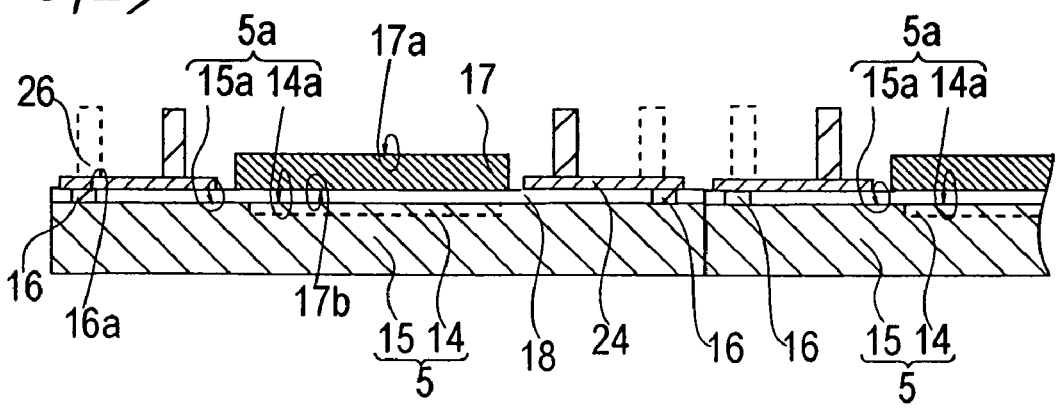

First, as shown in FIG. 3(B), the post portions 26 made of copper are formed by photolithography, plating, and the like on the wiring layer 24 which extends over the surface of the insulating film 18. Note that gold (Au) or the like may be used instead of copper in the formation of the post portions 26. Once the copper post portions 26 have been formed, a thin oxidation film may be formed on the side surface of the post portions 26 by thermal oxidation or the like. In so doing, adhesion between the post portions 26 and the sealing layer 30 to be described below is improved and moisture penetration through the interface between the two members can be suppressed. As a result, reliability is further improved.

Next, the glass plate 17 is provided on the insulating film 18 in a position covering the entire light-receiving surface 14a of each sensor portion 14. The glass plate 17 is an individual light-transmitting portion and is fixed (bonded) individually to each first semiconductor chip 5 by an adhesive (not shown) such as an epoxy resin. Note that the upper face of the glass plate 17 is subjected to mirror polishing in order to improve transmittivity.

Next, as an external terminal forming step, external terminals are formed so as to be electrically connected to the first pads 16 via the wiring layer 24.

Figure 3C:
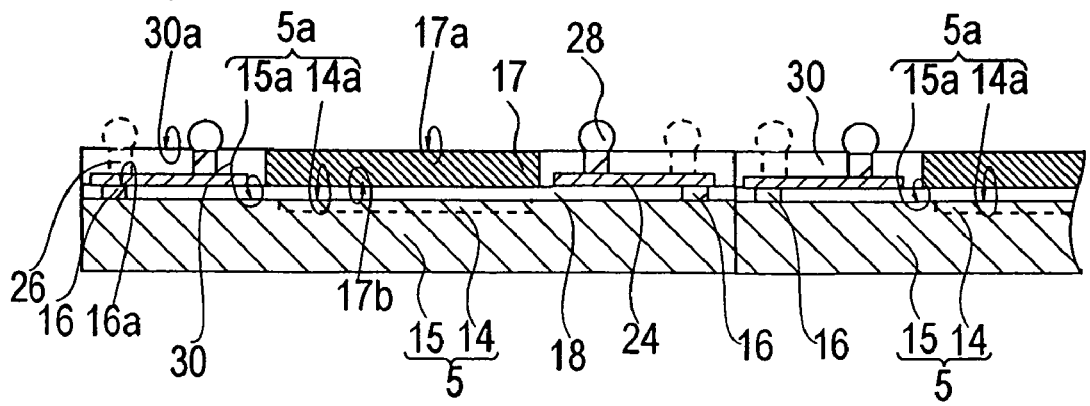

As shown in FIG. 3(C), the sealing layer 30 constituted by a sealing material such as epoxy resin is formed using a transfer mold method or a printing method such that the post portions 26 are hidden. The top face 26a of the post portions 26 and an upper face 30a of the sealing layer 30 are then ground (polished) using a grinder (polishing tool) or the like so as to become equal to the height of the upper face 17a of the glass plate 17. By means of this polishing, the top faces 26a of all of the post portions 26 are exposed to form carrying surfaces for the external terminals (solder balls).

The solder balls 28 are then formed on the exposed external terminal carrying surfaces by reflowing. These solder balls 28 function as external terminals for connecting the image-capturing semiconductor device 10 to the second printed circuit board 53. Note that when necessary, a barrier metal layer or the like may be formed between the external terminal carrying surfaces and solder balls 28.

The wafer 35 is then cut into individual semiconductor devices (packages) 10 (see FIG. 2(B)) using a regular scribing high-speed rotary blade (cutting tool) or the like (not shown) As can be understood from the above description, an image-capturing semiconductor device having a WCSP constitution can be obtained in this embodiment by means of fewer processes than conventionally.

As a result, the manufacturing costs of the image-capturing semiconductor device are reduced in comparison with a conventional device, and thus an increase in productivity can be expected.

Moreover, the package size of an image-capturing semiconductor device obtained in this manner is reduced in comparison with a conventional constitution in which a wire bonding method is employed, and thus a further expansion in the scope of application of the device can be expected.

Second Embodiment

An image-capturing semiconductor device 95 according to a second embodiment of this invention and a manufacturing method therefor will now be described with reference to FIGS. 4 through 7.

Figure 5A:
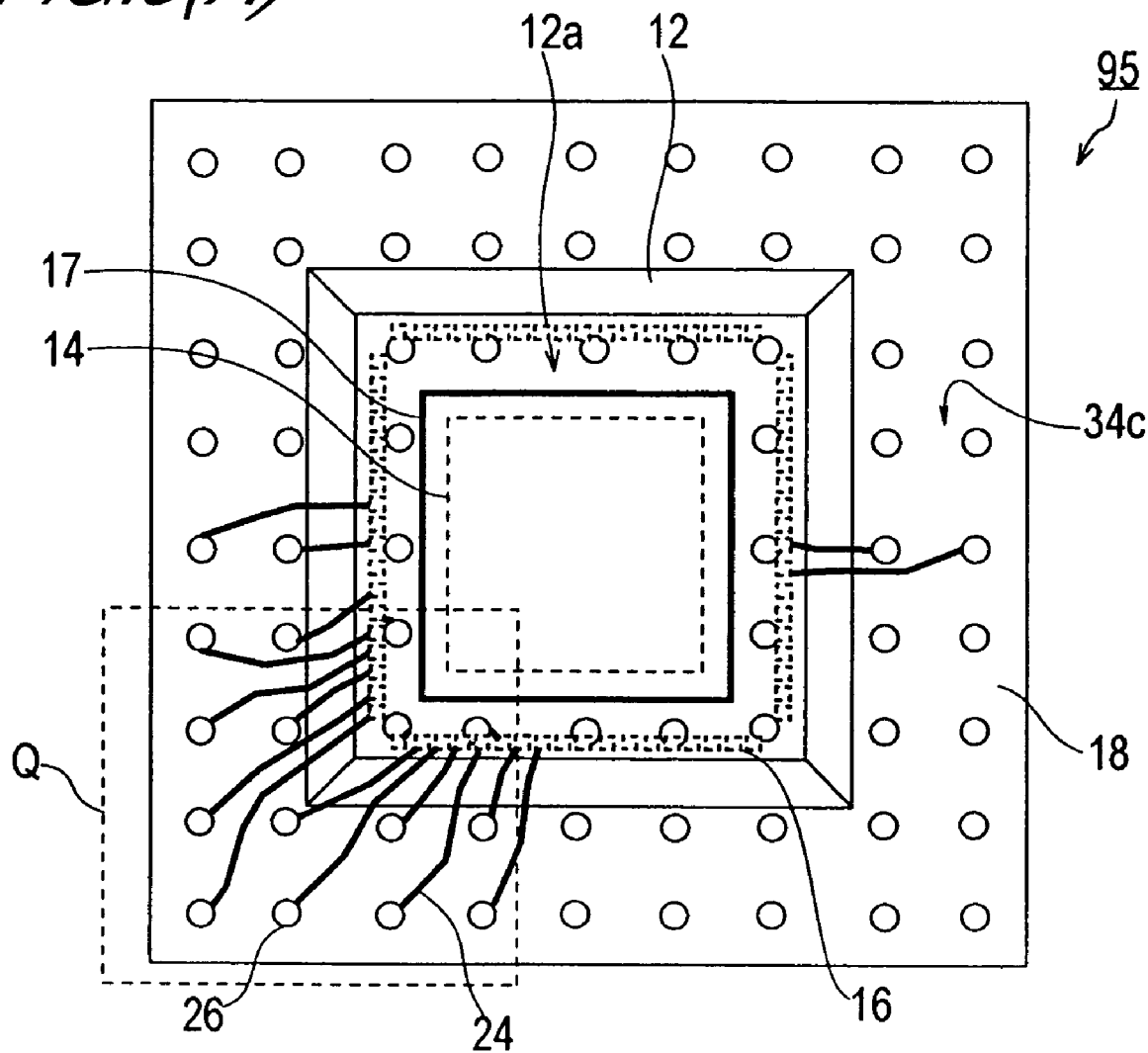
FIG. 5(A) is a schematic plan view showing the semiconductor device according to the second embodiment of this invention.
Figure 5B:
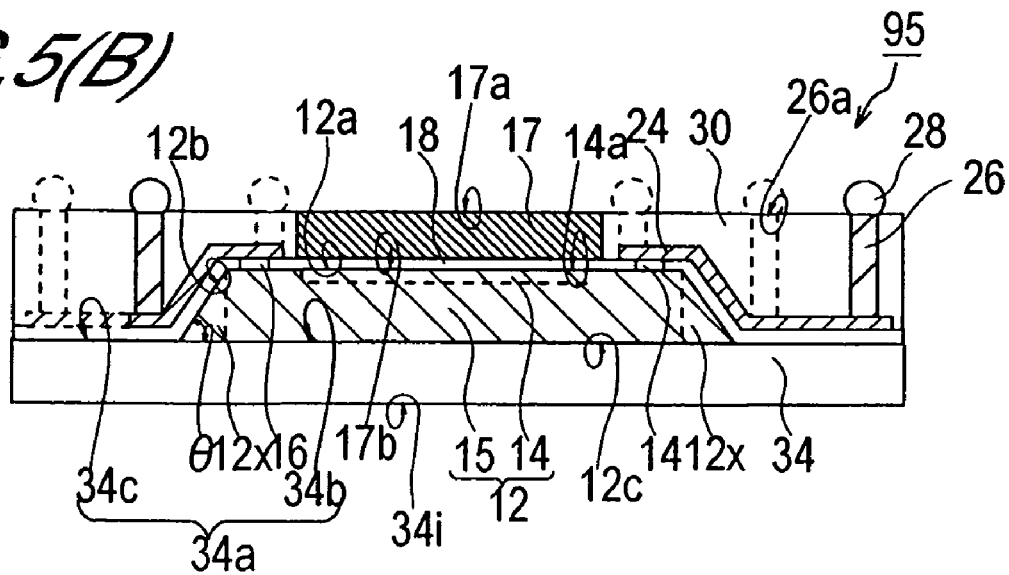
FIG. 5(B) is a schematic sectional view showing a part of the semiconductor device according to the second embodiment of this invention.

FIG. 4 is a partial schematic cross section of a camera system 140 according to this embodiment for illustrating an example of the main constitutional parts thereof. FIG. 5(A) is a schematic plan view of the image-capturing semiconductor device 95 provided in a camera portion 80 of the camera system 140 of this embodiment. FIG. 5(B), although not corresponding exactly to FIG. 5(A), is a schematic sectional view showing a modification of the connection relationships and disposal positions of each constitutional element of the image-capturing semiconductor device 95 in order to illustrate these connection relationships and disposal positions.

As shown in FIG. 4, the camera system 140 of this embodiment is constituted by the camera portion 80 and an image processing device 45 such as a DSP arranged on a common first printed circuit board (mother board) 46.

This constitutional example has a similar face-down constitution to that of the first embodiment, but differs therefrom in the constitution of the image-capturing semiconductor device 95.

The image-capturing semiconductor device 95 according to this invention will now be described in detail with reference to FIGS. 5(A) and 5(B).

Similarly to the first embodiment, a first semiconductor chip 12 comprised in the image-capturing semiconductor device 95 has a sensor portion 14 provided on a main surface 12a thereof, which serves as a first main surface, such that a light-receiving surface of the sensor portion 14 is exposed. The sensor portion 14 is covered by a glass plate 17. The sensor portion 14 and glass plate 17 are fixed together by a light-transmitting adhesive (not shown) such as epoxy resin. First pads 16 are disposed on the main surface 12a of the first semiconductor chip 12 at a predetermined pitch around the outer periphery of the main surface 12a.

In this constitutional example, the first semiconductor chip 12 is placed on and fixed to a carrying surface 34a which serves as a third main surface of a semiconductor chip carrying portion 34. A substrate 34 is used as the semiconductor chip carrying portion in this constitutional example.

More specifically, the first semiconductor chip 12, which has smaller outer dimensions than the carrying surface 34a, is placed on the substrate carrying surface 34a. A first region of the carrying surface 34a serving as the third main surface on which the first semiconductor chip 12 is actually placed, or in other words the region facing a rear face 12c of the first semiconductor chip 12 which serves as a second main surface opposing the first main surface 12a, is set as a placement face 34b.

Four side walls 12x of the first semiconductor chip 12 in this constitutional example are formed as inclined walls. Side wall surfaces (inclined side wall surfaces) 12b of the inclined walls intersect the placement face 34b at an acute angle θ (0°<θ<90°). Note that in this constitutional example, each side wall 12x has one inclined side wall face 12b, but this invention is not limited thereto. That is, as long as wiring layer patterning can be performed by sputtering or the like, a plurality of steps may be formed in each side wall.

The rear face 12c serving as the second main surface of the first semiconductor chip 12 and the placement face 34b are fixed (bonded) by an adhesive (not shown) such as a die bonding agent. In the following description, a second region of the carrying surface 34a serving as the third main surface, which is the region other than the first region 34b on which the first semiconductor chip 12 is placed, or in other words the region which surrounds the first region 34b, will be referred to as a non-placement face 34c. A single-sided substrate, double-sided substrate, or multi-sided substrate of an inorganic material, such as a silicon (Si) substrate, ceramic substrate, metallic base substrate, or similar, or a single-sided substrate, double-sided substrate, or multi-sided substrate of an organic material, such as a glass epoxy substrate, polyimide substrate, or similar, may be used as the substrate 34. In this constitutional example, the substrate 34 is described as an example of a semiconductor chip carrying portion, but the present invention is not limited thereto, and any object which functions as a semiconductor chip carrying portion may be used. Further, by setting the angle of intersection between the carrying surface 34a and side wall surfaces 12b as the acute angle θ and setting this acute angle θ at a value within a range of 45° to 60°, not only can the number of chips integrated on one wafer be increased, but also a margin can be ensured such that damage to the chips caused by unintentional movements of the blade and so on is avoided when the chips are divided. Hence setting of the acute angle θ to such a value is desirable.

The light-transmitting insulating film 18 constituted by epoxy resin or the like is provided on the non-placement face 34c and the main surface 12a and side wall surfaces 12b of the first semiconductor chip 12 such that the end portions, or top faces, of the first pads 16 on the main surface 12a of the first semiconductor chip 12 are exposed. Note that when the insulating film 18 is a polyimide film or the like which does not transmit light, an opening is formed therein such that the light-receiving surface 14a of the sensor portion 14, as well as the top face of the first pads 16, is exposed.

The wiring layer 24 of this constitutional example is then connected to the first pads 16 by one end thereof. From the first pads 16 the wiring layer 24 is formed so as to extend over the side wall surfaces 12b of the first semiconductor chip 12 and the non-placement face 34c and such that the cross section thereof bends in accordance with the difference of elevation (step) between the main surface 12a of the first semiconductor chip 12 and the non-placement face 34c. The wiring layer 24 is electrically connected to the solder balls 28, which are allocated as the connection destination of the first pads 16, via the post portions 26.

The sealing layer 30 made of epoxy resin or the like is then formed on the main surface 12a side of the first semiconductor chip 12 so as to cover the insulating film 18, wiring layer 24, and so on, and such that the top face of the post portions 26 and the upper face 17a of the glass plate 17, which is one of the plate surfaces thereof, are exposed. The solder balls 28 are formed on the top face of each post portion 26 to serve as external terminals for connecting the image-capturing semiconductor device 10 to the second printed circuit board 53.

In this constitutional example, an output signal from the first semiconductor chip 12 is transmitted along a path from the first pads 16 through the wiring layer 24 and post portions 26 to the solder balls 28. Note that the transmission path is not limited thereto, and various wiring paths may be formed in accordance with the intended purpose and design specifications.

Next, a manufacturing method for this semiconductor device 95 will be described with reference to FIGS. 6 and 7.

First, as a side wall face forming step, the side wall surfaces 12b are formed on the first semiconductor chip 12 comprising the first main surface 12a on which the first pads 16 are formed and the second main surface 12c which opposes the first main surface 12a and has a larger surface area than the first main surface 12a such that the first main surface 12a and second main surface 12c are connected. In so doing, the first semiconductor chip 12 is obtained in a mesa form in which the surface area of the second main surface 12c is larger than that of the first main surface 12a.

Figure 6A:
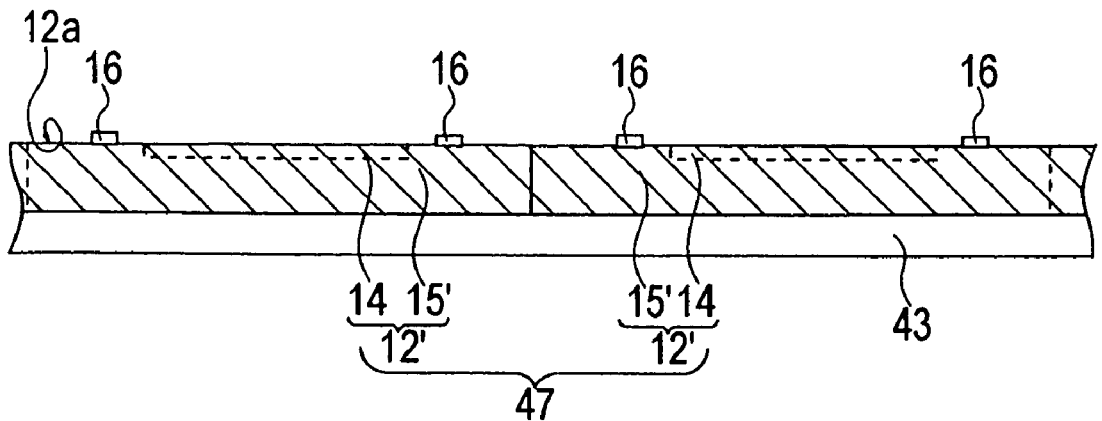
FIGS. 6(A) through (C) are schematic sectional views illustrating manufacturing processes for the semiconductor device according to the second embodiment of this invention.

In order to achieve this, first a semiconductor wafer 47 comprising a plurality of pre-separation first semiconductor chips 12', which each comprise the sensor portion 14 and a peripheral circuit portion 15', is prepared as shown in FIG. 6(A). The first pads 16 are formed on the main surface 12a of each pre-separation first semiconductor chip 12' at a predetermined pitch. The rear face side of the wafer 47 is adhered to and fixed by wafer fixing tape 43 to which an adhesive (not shown) has been applied. Note that for convenience, approximately two precursor first semiconductor chips 12' are illustrated in the drawing, but this invention is not limited thereto. Note also that scribe lines not shown in the drawing are formed between adjacent pre-separation first semiconductor chips 12' on the semiconductor wafer 47.

Figure 6B:
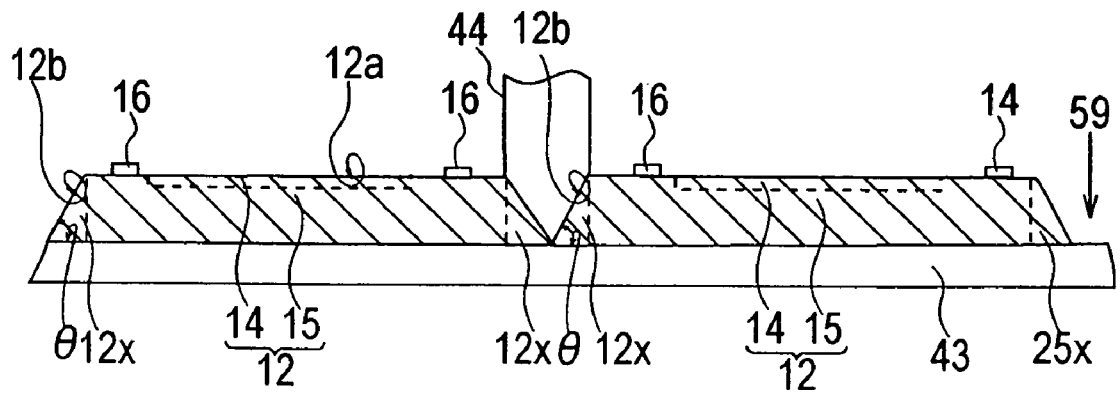

Next, as shown in FIG. 6(B), each individual first semiconductor chip 12 is separated, or divided, along the scribe lines (not shown) using the high-speed rotary blade (cutting tool) 44 or the like. At this time, the cutting edge of the blade 44 in use has an angle (vertical angle) $\phi$ (approximately $60°<\phi<90°$, for example) whereby the cross sectional form of the distal end of the blade 44 has a V shape. Thus grooves 59 cut in a V shape are formed when the side wall surfaces 12b are formed at the acute angle $\theta$ ($0°<\theta<90°$) on the side walls 12x of the first semiconductor chip 12. The adhesiveness of the adhesive is then reduced by UV radiation or the like, whereby the individual first semiconductor chips 12 are removed from the wafer fixing tape 43.

Next, as a placing step, the first semiconductor chips 12 formed with the side wall surfaces 12b are placed at a predetermined pitch on the first region 34b of the semiconductor chip carrying portion 34 which comprises the third main surface 34a comprising the first region 34b and the second region 34c which surrounds the first region 34b and a fourth main surface 34i which opposes the third main surface 34a.

Figure 6C:
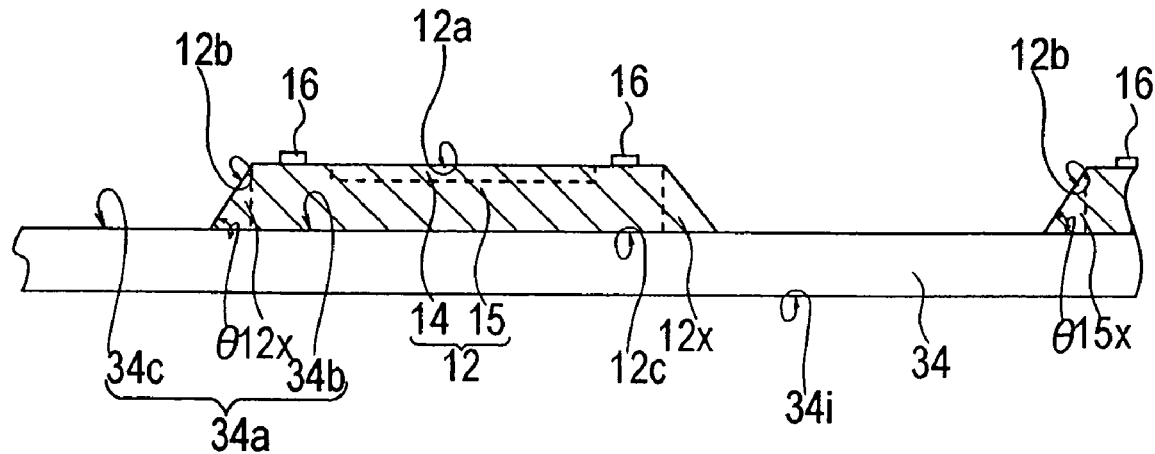

As shown in FIG. 6(C), the separated first semiconductor chips 12 are placed at a predetermined pitch on the placement face 34b which is the first region of the carrying surface 34a serving as the third main surface of the substrate 34. At this time, the rear face 12c of the first semiconductor chip 12 and the placement face 34b are fixed by a die bonding agent (not shown) or the like, for example.

Next, as a wiring layer forming step, the wiring layer (rewiring layer) 24 is formed so as to be electrically connected to the first pads 16 and extending from the first pads 16 along the first main surface 12a and inclined side wall surfaces 12b to the upper side of the non-placement face 34c which is the second region of the carrying surface 34a on the periphery of the first semiconductor chip 12.

Figure 7A:
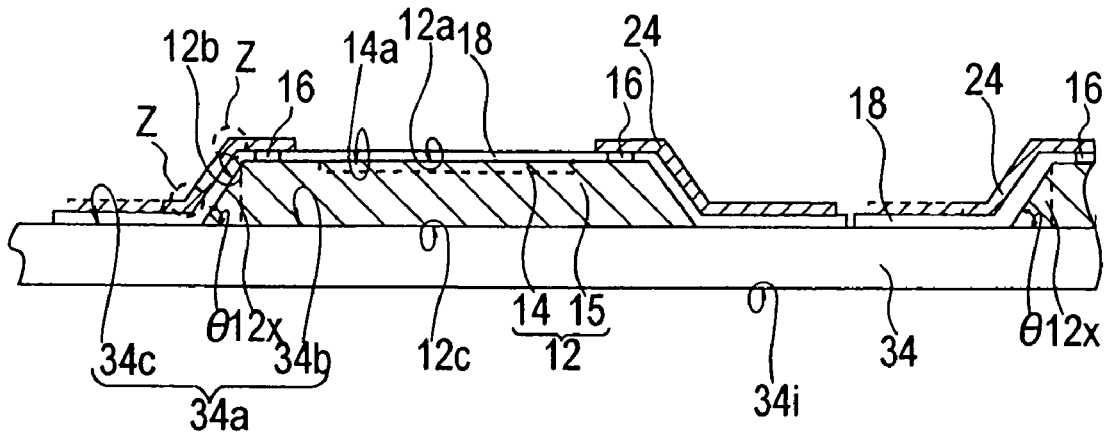
FIGS. 7(A) through (C) are schematic sectional views illustrating manufacturing processes for the semiconductor device according to the second embodiment of this invention.

In order to achieve this, first, as shown in FIG. 7(A), the insulating film 18 constituted by an epoxy resin film is formed over the first main surface 12a and side wall surfaces 12b of the first semiconductor chip 12 and the non-placement face 34c such that the top face of the first pads 16 is exposed.

Here, a difference of elevation (step) exists between the main surface 12a of the first semiconductor chip 12, which forms a base surface for the insulating film 18, and the non-placement face 34c, and thus the insulating film 18 is formed in accordance with this step.

Next, the wiring layer 24 made of copper is pattern-formed by photolithography, sputtering, and the like on top of the insulating film 18 from the sidewall surfaces 12b of the inclined walls (side walls) 12x to the non-placement face 34c such that one end thereof is connected to the first pads 16 and such that the cross section thereof bends in accordance with the aforementioned difference of elevation between the first main surface 12a and non-placement face 34c.

Here, the width of the wiring layer 24 in a substantially orthogonal direction to the direction of extension thereof at the parts of the wiring layer 24 positioned on the boundary between the first main surface 12a and side wall surfaces 12b and the boundary between the side wall surfaces 12b and the non-placement face 34c (surrounded by a broken line and indicated by z in the drawing) is preferably increased to be wider than the other (remaining) parts of the wiring layer.

As a result, the wiring layer 24 on these boundaries, which are susceptible to shock and stress, can be reinforced. Note that since the wiring layer 24 is formed by patterning, it is also referred to as a wiring pattern.

Next, as a light-transmitting portion forming step, the glass plate 17 which is a light-transmitting portion for transmitting incoming light to the sensor portion 14 serving as a light-receiving element portion is formed in a position covering the light-receiving surface 14a of the sensor portion 14. Note that the light-receiving surface 14a is formed so as to occupy a part of the first main surface 12a.

Figure 7B:
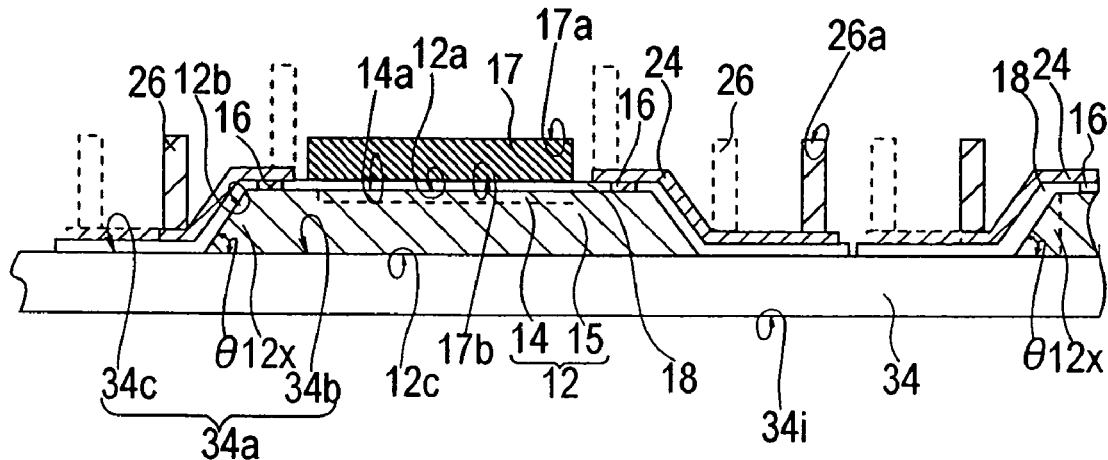

First, as shown in FIG. 7(B), the copper post portions 26 are formed by photolithography, plating, and the like on the wiring layer 24 which extends over the surface of the insulating film 18. Once the copper post portions 26 have been formed, a thin oxidation film may be formed on the side surface of the post portions 26 by thermal oxidation or the like. In so doing, adhesion between the post portions 26 and the sealing layer 30 to be described below is improved and moisture penetration through the interface between the two members can be suppressed. As a result, reliability is further improved.

The glass plates 17 serving as light-transmitting portions are then fixed (bonded) individually to each first semiconductor chip 12 by an adhesive (not shown) such as an epoxy resin in a position covering the entire light-receiving surface 14a of each sensor portion 14. Note that the upper face 17a of the glass plate 17 is subjected to mirror polishing in order to improve transmittivity.

Next, as an external terminal forming step, external terminals are formed so as to be electrically connected to the first pads 16 via the wiring layer 24.

Figure 7C:
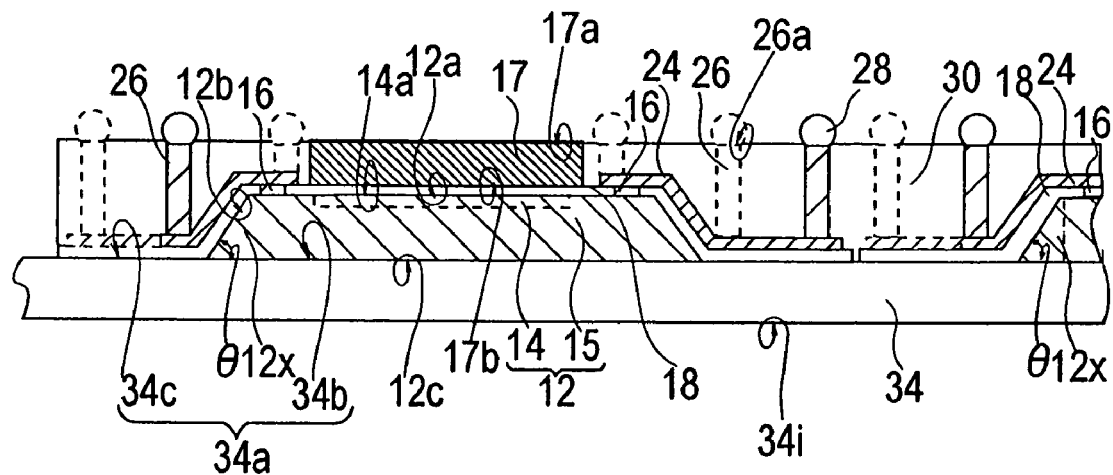

As shown in FIG. 7(C), the sealing layer 30 constituted by a sealing material such as epoxy resin is formed using a transfer mold method or printing method such that the post portions 26 are hidden. The top face 26a of the post portions 26 and the upper face 30a of the sealing layer 30 are then ground (polished) using a grinder (polishing tool) or the like so as to become equal to the height of the upper face 17a of the glass plate 17. By means of this polishing, the top faces of all of the post portions 26 are exposed to form carrying surfaces for the solder balls which serve as the external terminals. Note that when the post portions 26 are formed, if each of the post portions 26 is formed at an equal height in a vertical direction in respect of the carrying surface 34a, the polishing step for forming external terminal carrying surfaces using a film formation method or the like may be omitted.

The solder balls 28 serving as external terminals for connecting the image-capturing semiconductor device 95 to the second printed circuit board 53 are then formed on the exposed external terminal carrying surfaces by reflowing. Note that when necessary, a barrier metal layer or the like may be formed between the external terminal carrying surfaces and solder balls 28.

The wafer 47 is then cut into individual semiconductor devices (packages) 95 (see FIG. 5(B)) using a regular scribing high-speed rotary blade (cutting tool) or the like (not shown).

As can be understood from the above description, in this embodiment an image-capturing semiconductor device can be obtained by means of a simpler process than conventionally.

As a result, the manufacturing costs of the image-capturing semiconductor device are reduced in comparison with a conventional device, and thus an increase in productivity can be expected.

Moreover, the package size of an image-capturing semiconductor device obtained in this manner is reduced in comparison with a conventional constitution in which a wire bonding method is employed, and thus the scope of application of the device can be expanded even further.

Further, by placing the first semiconductor chip on a semiconductor chip carrying portion, the semiconductor device of this embodiment not only achieves a constitution (fan-in constitution) in which external terminals are formed above the first semiconductor chip (i.e. the fan-in portion), but also achieves a constitution (fan-out constitution) in which external terminals are formed in regions (i.e. the fan-out portion) other than above the first semiconductor chip by means of the wiring layer which extends from the main surface of the first semiconductor chip to the side wall surfaces and non-placement face. Thus a semiconductor device which is capable of corresponding to a larger number of pins than that of the first embodiment can be obtained.

In conventional semiconductor devices, regular WCSP chip size has been increased reluctantly simply in order to increase the number of pins, and as a result the number of chips integrated onto one wafer has decreased. In this embodiment, however, in contrast to such a conventional case, a semiconductor device can be formed with a fan-out constitution by means of the semiconductor chip carrying portion which functions as an extension portion allowing an increase in the number of external terminal disposal positions.

Furthermore, in this embodiment, unlike in the first embodiment, external terminals are not only formed in positions opposing the first semiconductor chip, and thus the size of the first semiconductor chip can be reduced beyond that of the first embodiment. As a result of this reduction in chip size, the manufacturing cost of the semiconductor device can be reduced.

Third Embodiment

A semiconductor device 95 according to a third embodiment of this invention and a manufacturing method therefor will now be described with reference to FIG. 8.

The main difference between this embodiment and the second embodiment is that in the light-transmitting portion forming step during the manufacture of the semiconductor device 95 of the second embodiment, a light-transmitting portion continuous body 91 is used in respect of the plurality of first semiconductor chips 12 placed on the carrying surface 34a to form light-transmitting portions 17 on the plurality of first semiconductor chips 12 simultaneously.

In the light-transmitting portion forming step in the second embodiment, glass plates 17 are formed individually on each sensor portion 14 (see FIG. 7(B)).

In this embodiment, on the other hand, the glass continuous body 91 which serves as a light-transmitting portion continuous body comprising glass plates 17 corresponding to the plurality of sensor portions 14 provided on the carrying surface 34a is used such that the glass plates 17 are formed simultaneously in respect of the plurality of first semiconductor chips 12.

The glass continuous body 91 is a plane parallel glass plate-form constitutional body comprising square block-form convex portions 91a having a flat top face in positions corresponding respectively to the first semiconductor chips 12. The part of the convex portion 91a on the head portion side corresponds to the glass plate 17 described above. Accordingly, the top face of the convex portion 91a is fixed to the first semiconductor chip 12 via the insulating film 18 so as to cover the light-receiving surface 14a of the sensor portion 14.

The glass continuous body 91 is also formed with an even concave portion, or in other words a groove 91b, on the periphery of each convex portion 91a. This groove 91b is formed by etching or the like to accommodate post portions 26 which are provided in a protruding manner on the upper side of a first main surface 12a and a non-placement face 34c.

More specifically, the depth of the concave portion is set such that when the convex portions 91a facing downward from the glass continuous body 91 are disposed in a predetermined position covering each sensor portion 14, the glass continuous body 91 does not contact the protruding post portions 26 and the light-receiving surface 14a of the sensor portion 14 is covered. Note that the convex portion of the glass continuous body 91 and the sensor portion 14 are fixed by a light-transmitting adhesive (not shown), and thus from the point of view of increasing transmittivity, the concave portion is preferably designed and formed such that the adhesive layer is as thin as possible.

Upon the manufacture of the image-capturing semiconductor device 95, the steps from the formation of the inclined side wall surfaces to the formation of the post portions 26 are performed in a similar fashion to the second embodiment.

Figure 8:
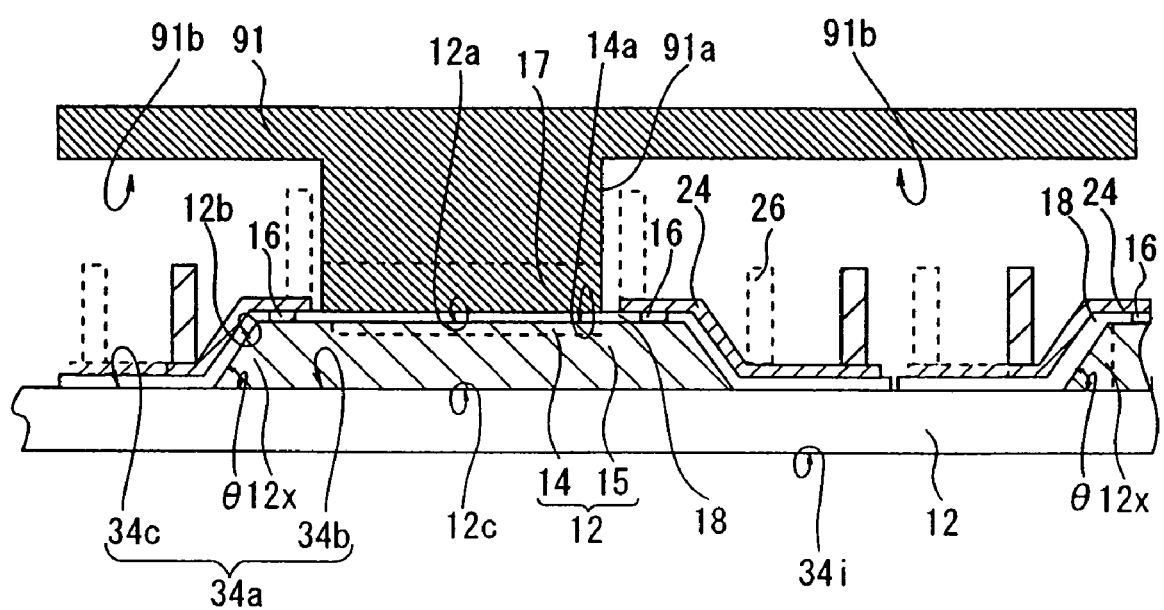
FIG. 8 is a schematic sectional view illustrating a manufacturing process for a semiconductor device according to a third embodiment of this invention.

Then, as shown in FIG. 8, the glass continuous body 91 having a form as described above is fixed using a light-transmitting adhesive (not shown) such as epoxy resin by disposing the convex portions 91a of the glass continuous body 91 in positions covering each sensor portion 14.

In this constitutional example, the parts corresponding to the glass plate 17 are formed simultaneously in positions covering the sensor portions 14 of all of the first semiconductor chips 12 placed on the carrying surface 34a.

An external terminal forming step (including sealing layer formation and grinding) is then performed in a similar fashion to the second embodiment, whereupon the semiconductor device 95 is obtained (see FIG. 5(B)). Note that in this constitutional example, grinding includes mirror polishing of the upper face of the glass plate 17.

As can be understood from the above description, similar effects to the second embodiment can be expected in this embodiment.

Unlike the second embodiment, however, the glass plates 17 are not formed individually on each semiconductor chip 12 in this embodiment, and thus a further simplification of the manufacturing process in comparison with that of the second embodiment can be achieved.

Hence the manufacturing costs of the semiconductor device can be reduced even further than that of the second embodiment, allowing an improvement in productivity.

Fourth Embodiment

A semiconductor device 95 according to a fourth embodiment of this invention and a manufacturing method therefor will now be described with reference to FIG. 9.

The main difference between this embodiment and the third embodiment is that in the light-transmitting portion forming step during the manufacture of the semiconductor device 95 of the second embodiment, light-transmitting portions 17 on a jig 88 to which a plurality of light-transmitting portions 17 is adhered at predetermined distances are disposed in predetermined positions covering an exposed face of light-receiving element portions 14, or in other words light-receiving surfaces 14a, whereupon the light-transmitting portions 17 are formed by being removed from the jig 88 to remain in place.

An advantage of the third embodiment is that the glass plates 17 can be formed simultaneously in respect of a plurality of first semiconductor chips 12 provided on a carrying surface 34a.

In the third embodiment, however, trimming and mirror polishing of the glass face must be performed anew during the grinding process following the formation of the sealing layer 30.

As a result, the transmittivity of the glass face is lower than when a glass plate with an upper face which is mirror polished with high precision in advance is used (see second embodiment (glass plate 17 in FIG. 7(B)), and thus reliability may decrease.

Hence in this constitutional example, a light-transmitting portion continuous body 77 is used and trimming and mirror polishing of the glass face in subsequent steps is made unnecessary.

Figure 9A:
FIGS. 9(A) through (C) are schematic sectional views illustrating manufacturing processes for a semiconductor device according to a fourth embodiment of this invention.

In order to achieve this, first a first constitutional body 71 constituted by a precursor jig 88' made of glass, silicon wafer, or the like on which a plane parallel preparatory glass plate 29 is formed is prepared as shown in FIG. 9(A). The face of the preparatory glass plate 29 which opposes the precursor jig 88' has been mirror polished.

At this time, the precursor jig 88' and preparatory glass plate 29 are adhered using an adhesive (not shown) which allows the jig 88 to be easily removed (peeled away) from the glass plate 17 in a manufacturing step to be described below. A high softening point wax (for example FNP-0115, manufactured by Nippon Seiro Co., Ltd.), a tape which foams at high temperatures such that its adhesiveness decreases (for example the thermal release sheet "Revalpha", manufactured by Nitto Denko Corporation), an ultraviolet curable adhesive (for example dicing UV tape manufactured by Furukawa Electric Co., Ltd.), or similar may be used as this adhesive.

Figure 9B:
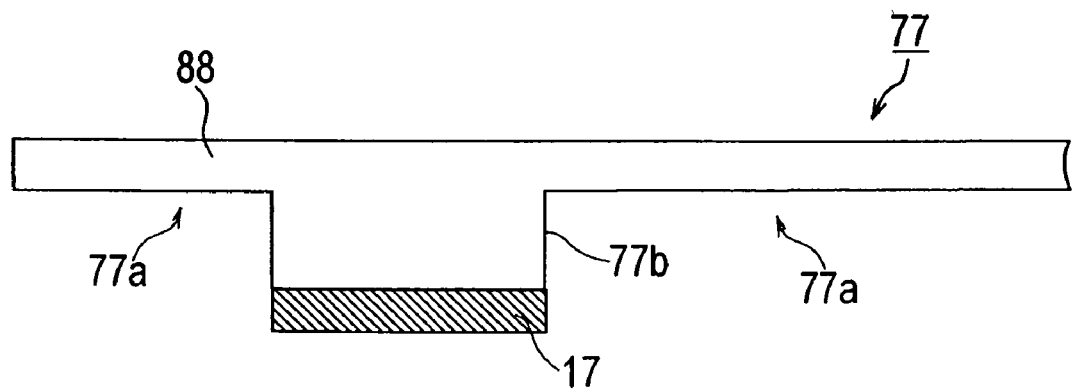

Next, as shown in FIG. 9(B), processing is performed on the preparatory glass plate 29 and precursor jig 88' to obtain a second constitutional body 77 comprised of the jig 88 having glass plates 17 remaining thereon. First, cutting, etching, or the like is performed on the first constitutional body 71 from the preparatory glass plate 29 side using a blade. By means of this working or processing, a concave portion (groove portion) corresponding to the post portions 26 which protrude from the upper side of a first main surface 12a and a non-placement 34c may be formed on the face of the first constitutional body 71 which opposes the carrying surface 34a. As a result, the second constitutional body 77 serving as a light-transmitting portion continuous body is obtained.

More specifically, the depth of the concave portion 77a is set such that when the convex portions 77b facing downward from the second constitutional body 77 are disposed in predetermined positions covering each sensor portion 14, the second constitutional body 77 does not contact the protruding post portions 26 and the like. Note that the convex portion 77b of the second constitutional body 77 and the sensor portion 14 are fixed by a light-transmitting adhesive (not shown), and thus from the point of view of increasing transmittivity, the concave portion is preferably designed and formed such that the adhesive layer is as thin as possible.

Upon the manufacture of the image-capturing semiconductor device 95, the steps from the formation of the inclined side wall surfaces to the formation of the post portions 26 are performed in a similar fashion to the second embodiment.

Figure 9C:
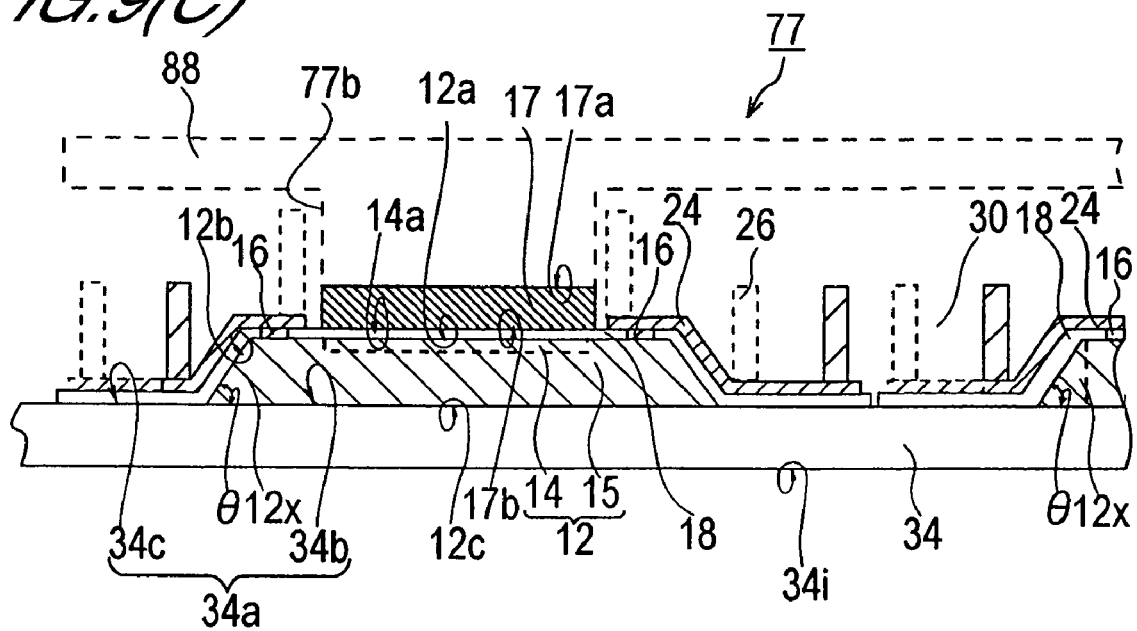

The second constitutional body 77 in the form described above is then provided with the glass plate 17 on the front end thereof as shown in FIG. 9(C). The exposed face of the glass plate 17 is disposed in a position covering the light-receiving surface 14a of each sensor portion 14 and fixed using a light-transmitting adhesive (not shown) such as epoxy resin.

Processing (for example heating, ultraviolet radiation, or similar) is then performed in accordance with the type of the adhesive layer described above to remove only the jig 88 from the second constitutional body 77, leaving the glass plate 17 disposed in a position covering the sensor portion 14.

An external terminal forming step (including sealing layer formation and grinding) is then performed in a similar fashion to the second embodiment, whereupon the semiconductor device 95 is obtained (see FIG. 5(B)).

As can be understood from the above description, similar effects to the second embodiment can be expected in this embodiment.

Moreover, in this embodiment the jig can be used repeatedly unlike the glass continuous body made of a glass material which is used in the third embodiment, and thus a reduction in manufacturing costs can be achieved.

Further, since the upper face of the glass plate 17 is mirror polished in advance, a mirror surface does not have to be formed after the glass continuous body has been cut as in the third embodiment. As a result, a further simplification of the manufacturing process can be achieved.

Unlike the third embodiment, a glass plate having an upper face which has been mirror polished with high precision in advance is used, and thus an increase in transmittivity can be achieved.

Fifth Embodiment

A semiconductor device 76 according to a fifth embodiment of this invention and a manufacturing method therefor will now be described with reference to FIGS. 10 through 12.

This embodiment is similar to the second embodiment in having a face-down constitution, but differs from the second embodiment mainly in that the semiconductor chip carrying portion is a second semiconductor chip 73 comprising a circuit element and the second semiconductor chip 73 is electrically connected to a wiring layer 24.

Figure 10:
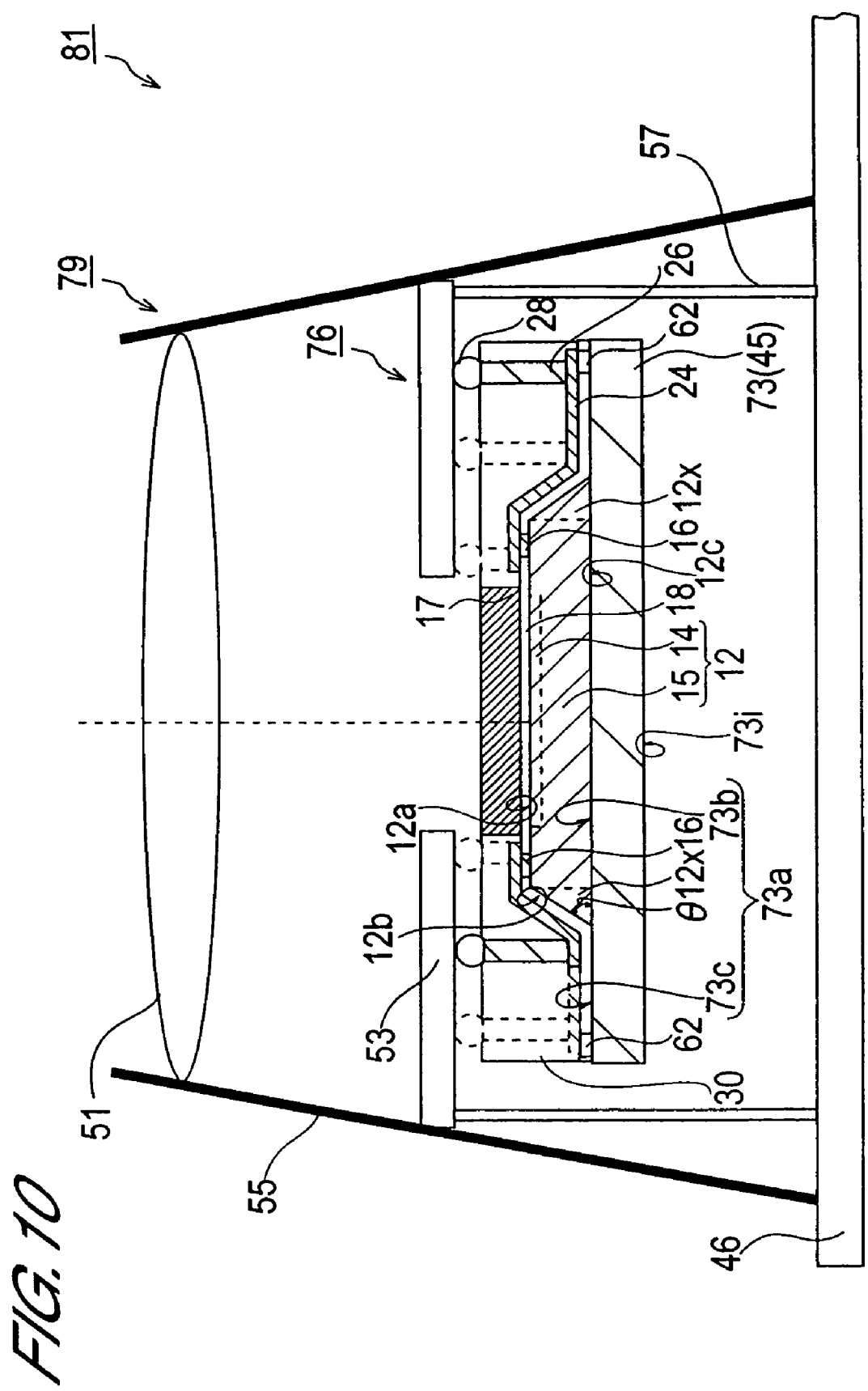
FIG. 10 is a schematic sectional view showing a camera system comprising a semiconductor device according to a fifth embodiment of this invention.
Figure 11A:
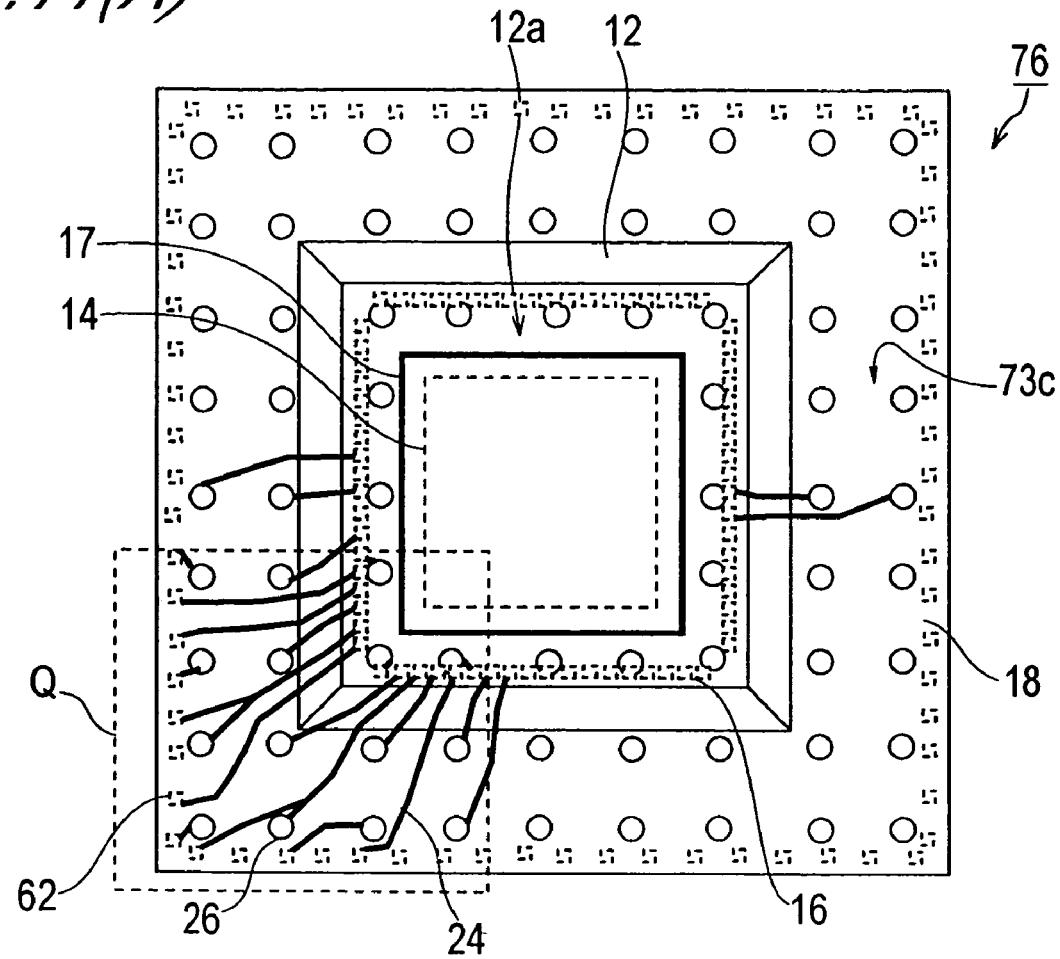
FIG. 11(A) is a schematic plan view showing the semiconductor device according to the fifth embodiment of this invention.
Figure 11B:
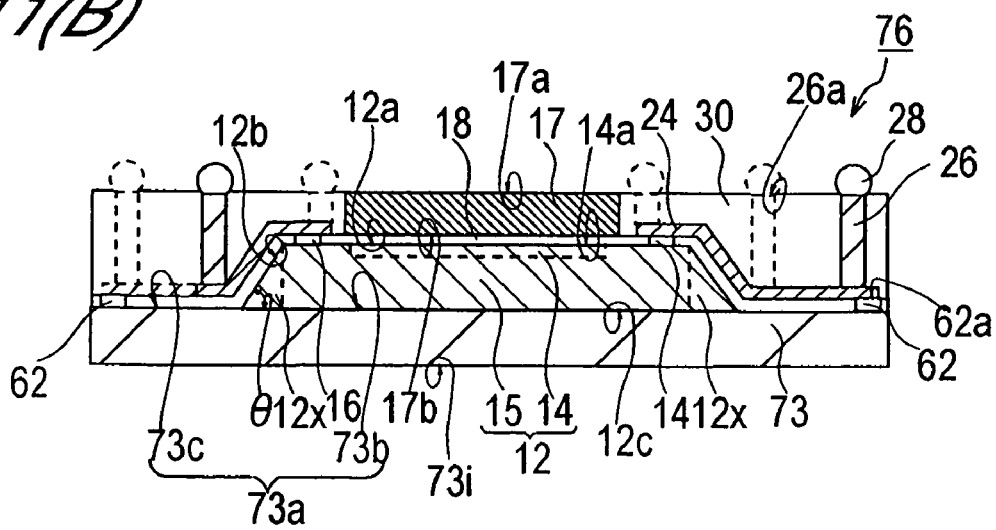
FIG. 11(B) is a schematic sectional view showing a part of the semiconductor device according to the fifth embodiment of this invention.

FIG. 10 is a partial schematic cross section of a camera system 81 according to this embodiment for illustrating an example of the main constitutional parts thereof. FIG. 11(A) is a schematic plan view of the image-capturing semiconductor device 76 provided in a camera portion 79 of the camera system 81 of this embodiment. FIG. 11(B), although not corresponding exactly to FIG. 11(A), is a schematic sectional view showing a modification of the connection relationships and disposal positions of each constitutional element of the image-capturing semiconductor device 76 in order to illustrate these connection relationships and disposal positions.

As shown in FIG. 10, the camera system 81 in this embodiment is constituted such that only the camera portion 79 is disposed on a first printed circuit board (mother board) 46. That is, no space is provided here for disposing an image processing device 45 such as a DSP.

The image-capturing semiconductor device 76 of this invention will now be described in detail with reference to FIGS. 11(A) and 11(B).

A first semiconductor chip 12 is placed on and fixed to a carrying surface 73a which is a third main surface of the second semiconductor chip 73 serving as the semiconductor chip carrying portion. Second pads made of aluminum, or in other words electrode pads 62, are disposed on the carrying surface 73a, which is the main surface of the second semiconductor chip 73, at a predetermined pitch around the outer periphery of the second semiconductor chip 73. The second semiconductor chip 73 is electrically connected to the wiring layer 24 via the second pads 62. Note that the disposal number and positions of the second pads 62 are not limited to this example.

Here, the second semiconductor chip is a DSP 73, for example. Thus the image-capturing semiconductor device 76 becomes a multi-stacked package MCP constituted by the first semiconductor chip 12 stacked on a placement face 73b of the DSP 73.

As a result, the semiconductor device is highly packaged and hence there is no need to provide space on the first printed circuit board 46 for mounting the DSP 73. As a result, the size of the camera system 81 itself can be reduced in comparison with a conventional camera system.

An output signal from the first semiconductor chip 12 in this constitutional example is transmitted along both a path from the first pads 16 through the wiring layer 24 and post portions 26 to the solder balls 28 and a path from the first pads 16 through the wiring layer 24 and second pads 62 to the DSP 73 serving as the second semiconductor chip, or along either one of these paths. Note that the transmission path is not limited thereto, and various wiring paths may be formed in accordance with the intended purpose and design specifications.

Next, a manufacturing method for this semiconductor device 76 will be described with reference to FIG. 12.

First, similar processing to the second embodiment is performed up to the side wall face forming step (see FIG. 6(B)).

Figure 12A:
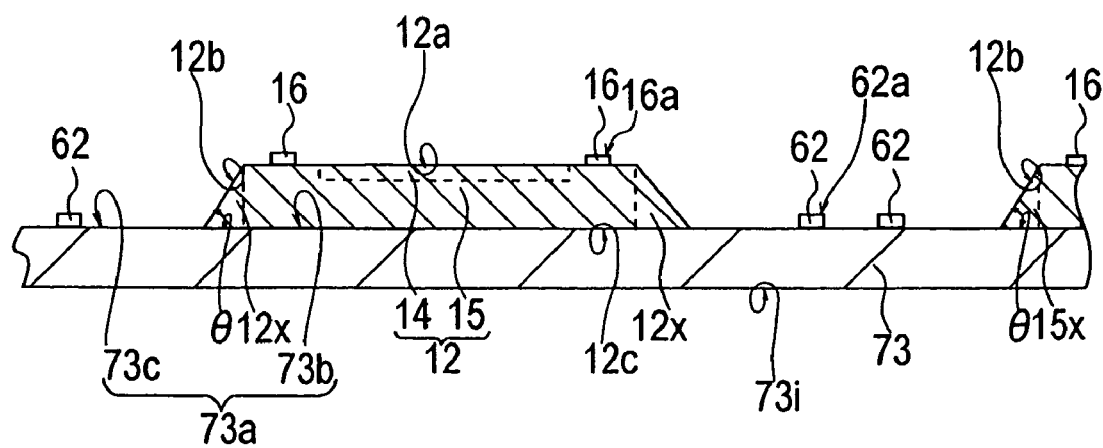
FIGS. 12(A) and (B) are schematic sectional views illustrating manufacturing processes for the semiconductor device according to the fifth embodiment of this invention.

Next, in a placing step as shown in FIG. 12(A), the separated first semiconductor chips 12 are placed at a predetermined pitch on a first region 73b of the second semiconductor chip 73 which comprises a third main surface 73a, comprising the first region 73b and a second region 73c which surrounds the first region 73b, and a fourth main surface 73i which opposes the third main surface 73a. At this time, a rear face 12c of the first semiconductor chip 12 and the placement face 73b are fixed by a die bonding agent (not shown) or the like, for example.

Then, in a wiring layer forming step, an insulating film 18 made of epoxy resin is formed such that a top face 16a of the first pads 16 and a top face 62a of the second pads 62 are exposed.

Once the insulating film 18 has been formed, the wiring layer 24 is formed from the side wall surfaces 12b to a non-placement face 73c similarly to the second embodiment. Here, however, the other end of a part of the wiring layer 24 is formed so as to be connected to the second pads 62.

Figure 12B:
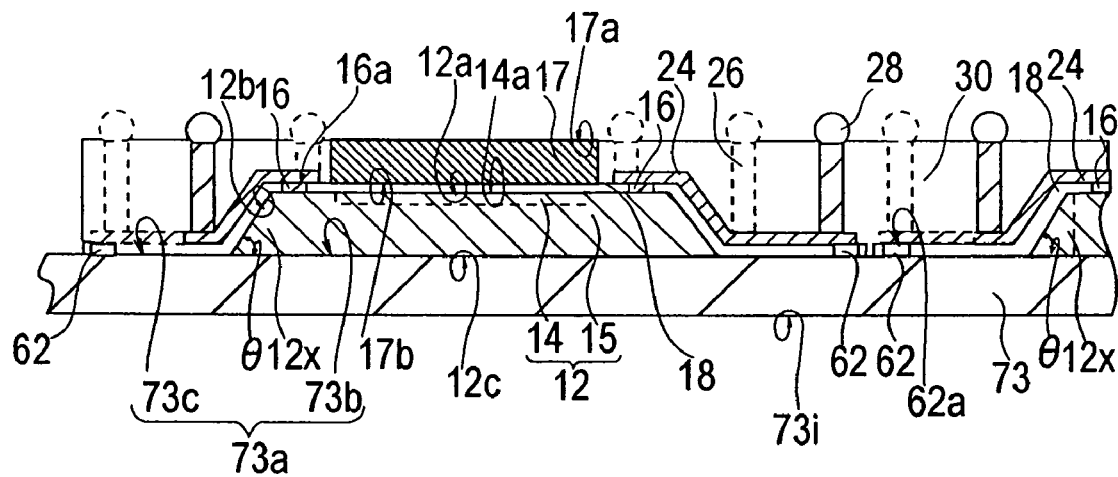

The light-transmitting portion forming step and external terminal forming step are then performed in succession similarly to the second embodiment (FIG. 12(B)), whereupon the semiconductor device 76 is obtained (see FIG. 11(B)). Note that the manufacturing method described in the second embodiment is used here as an example, but the present invention is not limited thereto, and the methods described in the third and fourth embodiments may be appropriately applied.

As can be understood from the above description, similar effects to the second embodiment can be expected in this embodiment.

Moreover, the semiconductor device in this embodiment can be provided with a multi-stacked package MCP constitution, and thus a smaller camera system than conventionally can be realized.

Sixth Embodiment

A semiconductor device 25 according to a sixth embodiment of this invention and a manufacturing method therefor will now be described with reference to FIGS. 13 through 16.

Figure 14A:
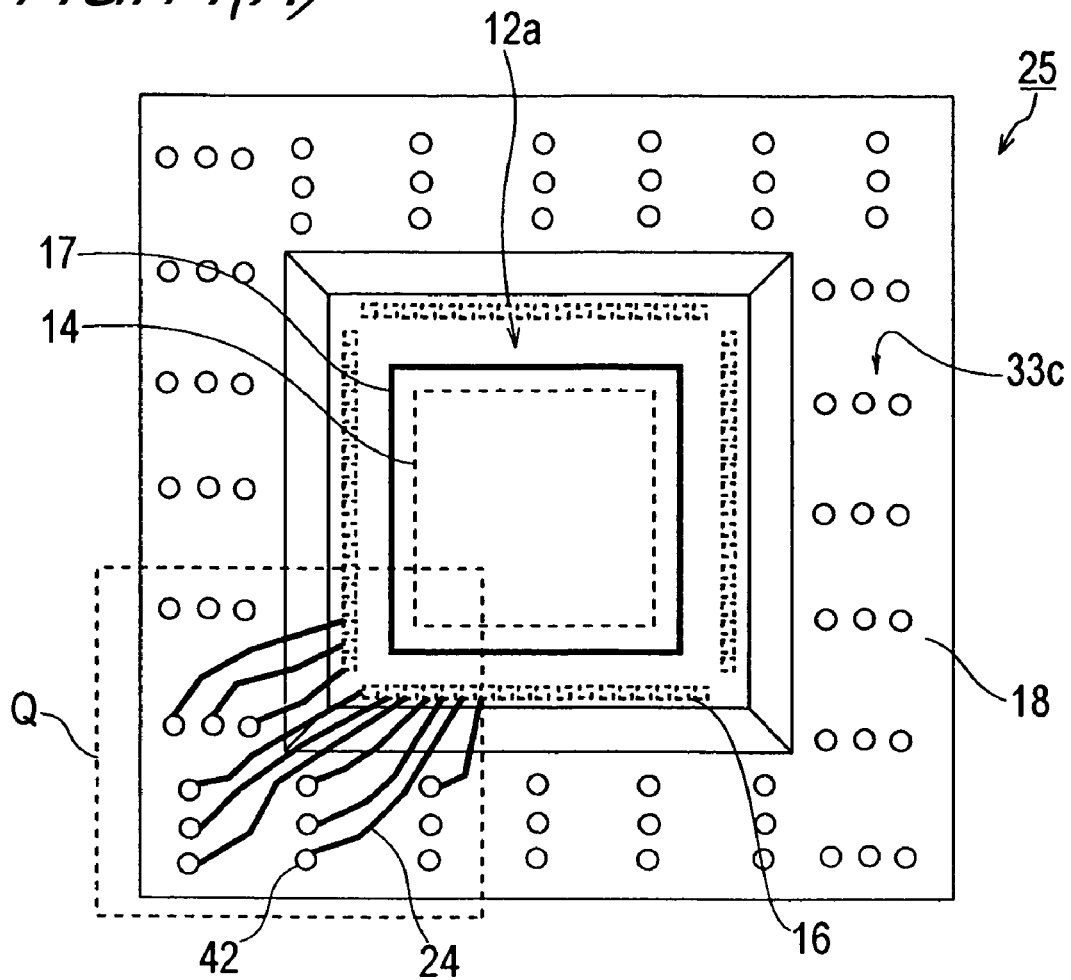
FIG. 14(A) is a schematic plan view showing the semiconductor device according to the sixth embodiment of this invention.
Figure 14B:
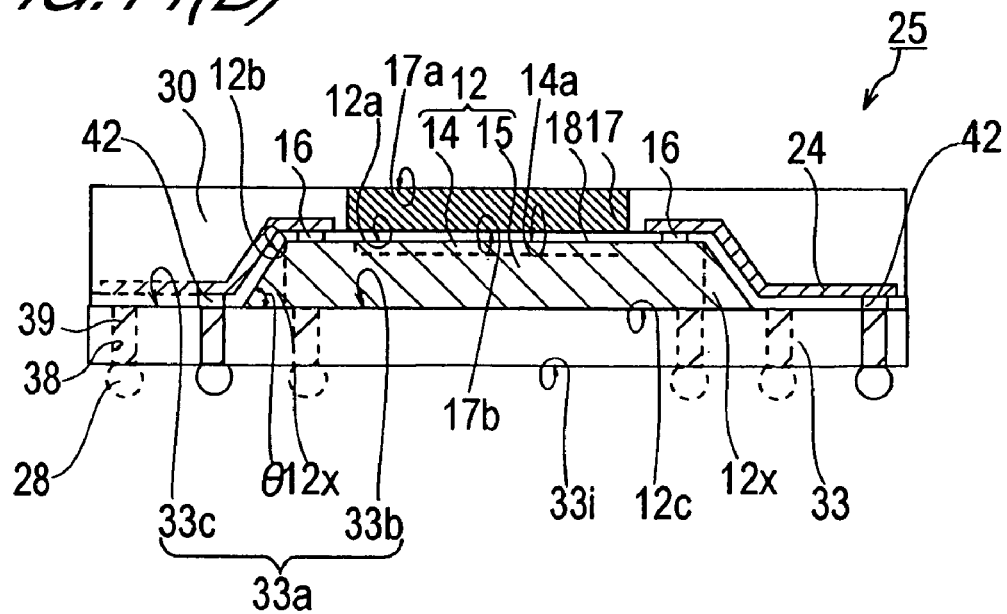
FIG. 14(B) is a schematic sectional view showing a part of the semiconductor device according to the sixth embodiment of this invention.

FIG. 13 is a partial schematic cross section of a camera system 120 according to this embodiment for illustrating an example of the main constitutional parts thereof. FIG. 14(A) is a schematic plan view of the image-capturing semiconductor device 25 provided in a camera portion 69 of the camera system 120 of this embodiment. FIG. 14(B), although not corresponding exactly to FIG. 14(A), is a schematic sectional view showing a modification of the connection relationships and disposal positions of each constitutional element of the image-capturing semiconductor device 25 in order to illustrate these connection relationships and disposal positions.

As shown in FIG. 13, the camera system 120 of this embodiment is constituted such that the camera portion 69 and an image processing device 45 such as a DSP are arranged on a common first printed circuit board (mother board) 46. Note that in the camera portion 69 in this constitutional example, solder balls 28 provided on the image-capturing semiconductor device 25 are directly mounted on the first printed circuit board 46.

In this constitutional example, a glass plate 17 serving as a light-transmitting portion in the packaged image-capturing semiconductor device 25 is formed on the opposite plane to the surface on which the solder balls 28 are formed. In other words, a face-up constitution is provided.

The image-capturing semiconductor device 25 according to this invention will now be described in detail with reference to FIGS. 14(A) and 14(B).

Similarly to the first embodiment, a first semiconductor chip 12 provided in the image-capturing semiconductor device 25 comprises a sensor portion 14 arranged on a main surface 12a which serves as a first main surface such that a light-receiving surface thereof is exposed. Also similarly to the first embodiment, a rear face 17b of the glass plate 17 is fixed in a position covering the light-receiving surface 14a of the sensor portion 14 using a light-transmitting adhesive (not shown) such as epoxy resin. First pads 16 are disposed on the main surface 12a of the first semiconductor chip 12 at a predetermined pitch around the outer periphery of the main surface 12a.

The first semiconductor chip 12 in this constitutional example is placed on and fixed to a carrying surface 33a which serves as a third main surface of a semiconductor chip carrying portion. A substrate 33 is used as this semiconductor chip carrying portion.

Through holes 38 comprising a conductor portion (copper plating layer) 39 for allowing conduction between the front and rear faces of the substrate are formed in the substrate 33. A first land 42 made of copper foil is formed on the end portion of a first flat surface side of each conductor portion 39. The conductor portions 39 are electrically connected to a wiring layer 24 via the first lands 42. Solder balls 28 for mounting the image-capturing semiconductor device 25 onto the first printed circuit board 46 are formed on the end portion of the conductor portions 39 on a fourth main surface 33i side. Note that a single-sided substrate, double-sided substrate, or multi-sided substrate of an inorganic material, such as a silicon (Si) substrate, ceramic substrate, metallic base substrate, or the like, or a single-sided substrate, double-sided substrate, or multi-sided substrate of an organic material, such as a glass epoxy substrate, polyimide substrate, or the like, may be used as the substrate 33.

More specifically, the first semiconductor chip 12 having smaller outer dimensions than those of the carrying surface 33a of the substrate is placed on and fixed to the carrying surface 33a. A first region of the carrying surface 33a, which serves as a third main surface, on which the first semiconductor chip 12 is actually placed, or in other words the region facing a rear face 12c of the first semiconductor chip 12, which serves as a second main surface opposing the first main surface 12a, is set as a placement face 33b.

Further, four side walls 12x of the first semiconductor chip 12 in this constitutional example are formed as inclined walls similarly to the second embodiment. That is, side wall surfaces (inclined side wall surfaces) 12b of the inclined walls 12x intersect the placement face 33b at an acute angle θ (0°<θ<90°). The rear face 12c of the first semiconductor chip 12, serving as the second main face, and the placement face 33b are fixed by an adhesive (not shown) such as a die bonding agent. In the following description, a second region of the carrying surface 33a serving as the third main surface, which is the region other than the first region 33b on which the first semiconductor chip 12 is placed, or in other words the region which surrounds the first region 33b, will be referred to as a non-placement face 33c.

An insulating film 18 made of epoxy resin is formed on the main surface 12a and side wall surfaces 12b of the first semiconductor chip 12 and the non-placement face 33c such that the top face of the first pads 16 and the top face of the first lands 42 on the main surface 12a of the first semiconductor chip 12 are exposed. Note that when the insulating film 18 is a film which does not transmit light such as a polyimide film, an opening is formed therein such that the top face of the sensor portion 14, as well as the top face of the first pads 16, is exposed.

The wiring layer 24 in this constitutional example is then connected to the first pads 16 by one end thereof, and from the first pads 16 the wiring layer 24 is formed so as to extend over the side wall surfaces 12b of the first semiconductor chip 12 and the non-placement face 33c and such that the cross section thereof bends in accordance with the difference of elevation (step) between the main surface 12a of the first semiconductor chip 12 and the non-placement face 33c. The wiring layer 24 is also connected to the first lands 42, which are allocated as the connection destinations of the first pads 16.

In other words, the first pads 16 are constituted so as to be individually electrically connected to the solder balls 28 which correspond to the first pads 16 via the wiring layer 24 and conductor portions 39 successively.

A sealing layer 30 made of epoxy resin or the like is then formed on the main surface 12a side of the first semiconductor chip 12 such that an upper face 17a of the glass plate 17 is exposed.

In this constitutional example, an output signal from the first semiconductor chip 12 is transmitted along a path from the first pads 16 through the wiring layer 24, first lands 42, and conductor portions 39 to the solder balls 28.

Next, a manufacturing method for this image-capturing semiconductor device 25 will be described with reference to FIGS. 15 and 16.

First, as a side wall face forming step, the side wall surfaces 12b are formed on the first semiconductor chip 12 comprising the first main surface 12a on which the first pads 16 are formed and the second main surface 12c which opposes the first main surface 12a and has a larger surface area than the first main surface 12a such that the first main surface 12a and second main surface 12c are connected. In so doing, the first semiconductor chip is obtained with a mesa form in which the surface area of the second main surface 12c is larger than that of the first main surface 12a.

The side wall face forming step maybe performed as already described in the second embodiment (see FIG. 6(B)), and hence detailed description thereof has been omitted here.

Next, as a placing step, each of the first semiconductor chips 12 formed with the side wall surfaces 12b is placed at a predetermined pitch on the first region 33b of the semiconductor chip carrying portion 33 comprising the third main surface 33a, which comprises the first region 33b and the second region 33c which surrounds the first region 33b, and the fourth main surface 33i which opposes the third main surface 33a.

Figure 15A:
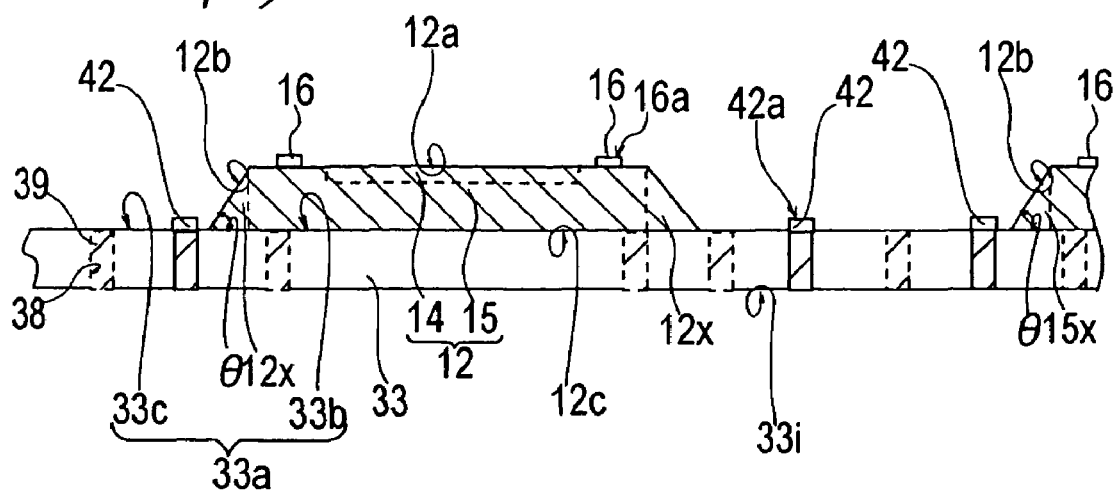
FIGS. 15(A) through (C) are schematic sectional views illustrating manufacturing processes for the semiconductor device according to the sixth embodiment of this invention.

As shown in FIG. 15(A), the separated first semiconductor chips 12 are placed at a predetermined pitch on the placement face 33b which serves as the first region of the carrying surface 33a of the common substrate 33 on which the through holes 38 and exposed first lands 42 are formed in predetermined positions. At this time, the rear face 12c of the first semiconductor chip 12 and the placement face 33b are fixed by die bonding agent (not shown) or the like, for example. Note that the through holes (penetrating portions) 38 provided in the substrate 33 are obtained by forming through holes in the substrate 33 using a drill or the like and then forming the copper plating layer 39 serving as the conductor portion in the inner wall of the through holes by a plating method or the like.

Next, as a wiring layer forming step, the wiring layer (rewiring layer) 24 is formed such that one end thereof is connected to the first pads 16 and extending from the first pads 16 along the first main surface 12a and inclined side wall surfaces 12b to the upper side of the non-placement face 33c on the periphery of the carrying surface 33a of the first semiconductor chip 12.

Figure 15B:
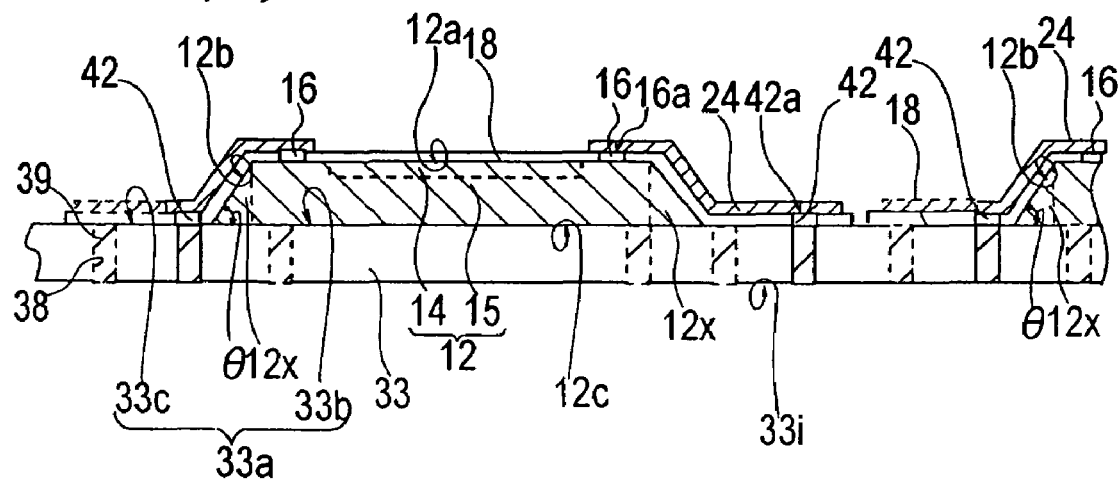

As shown in FIG. 15(B), first the insulating film 18 made of epoxy resin is formed over the main surface 12a and inclined side wall surfaces 12b of the first semiconductor chip 12 and the non-placement face 33c such that the top face of the first pads 16 and a top face 42a of the first lands 42 are exposed.

Here, a difference of elevation (step) exists between the main surface 12a of the first semiconductor chip 12, which forms a base surface for the insulating film 18, and the non-placement face 33c, and thus the insulating film 18 is formed to correspond to this step.

Next, the wiring layer 24 made of copper is pattern-formed by photolithography, sputtering, and the like on top of the insulating film 18 from the inclined side wall surfaces 12b of the inclined walls (side walls) 12x to the non-placement face 33c such that one end thereof is connected to the respective first pads 16, such that the cross section thereof bends in accordance with the aforementioned difference of elevation between the first main surface 12a and non-placement face 33c, and such that the other end thereof is connected to the first lands 42.

Next, in a light-transmitting portion forming step, the plane parallel form glass plate 17 which is a light-transmitting portion for transmitting incoming light to the sensor portion 14, which is a light-receiving element portion, is formed in a position so as to cover the light-receiving surface 14a of the sensor portion 14.

Figure 15C:
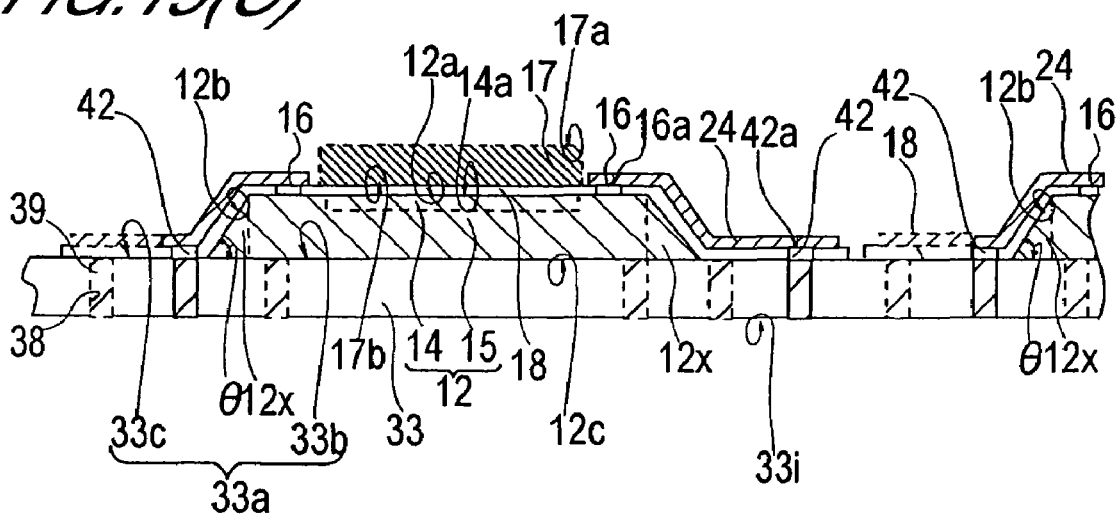

As shown in FIG. 15(C), the glass plate 17 serving as a light-transmitting portion is fixed (bonded) in a position covering the entire light-receiving surface 14a of each sensor portion 14 using an adhesive (not shown) such as epoxy resin applied to a rear face 17b side thereof. Note that the upper face of the glass plate 17 is subjected to mirror polishing in order to improve transmittivity.

Next, as an external terminal forming step, the external terminals 28 are formed so as to be electrically connected to the wiring layer 24 via the conductor portions 39 connecting the front and rear faces of the carrying portion 33.

Figure 16:
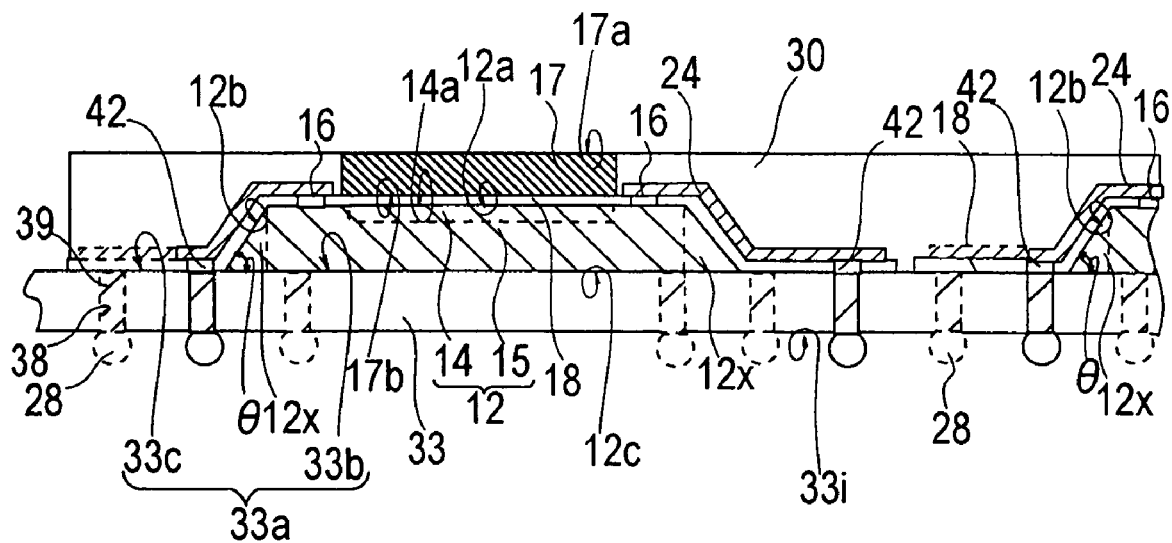
FIG. 16 is a schematic sectional view illustrating a manufacturing process for the semiconductor device according to the sixth embodiment of this invention.

As shown in FIG. 16, first the sealing portion 30 is formed by applying a sealing material constituted by an organic resin (epoxy resin or the like) using a bonding method or printing method to a height at which the surface of the glass plate 17 is exposed (the height of the upper face of the glass plate 17) and then curing the sealing material. The substrate 33 on which the surface of the glass plate 17 is exposed is then turned over, whereupon the solder balls 28 serving as bumps for connecting the image-capturing semiconductor device 25 to the first printed circuit board 46 are formed by reflowing on the top face of the exposed conductor portions 39.

The wafer is then cut into individual semiconductor devices (packages) 25 (see FIG. 14(B)) using a regular scribing high-speed rotary blade (cutting tool) or the like (not shown)

As can be understood from the above description, similar effects to the second embodiment can be expected in this embodiment.

Moreover, in this embodiment there is no need for a second printed circuit board such as that used in a face-down constitution for attaching the package. Hence the constitution of the camera portion can be simplified and manufacturing costs can be reduced.

Seventh Embodiment

A semiconductor device 65 according to a seventh embodiment of this invention and a manufacturing method therefor will now be described with reference to FIGS. 17 and 18.

An image-capturing semiconductor device 65 according to this embodiment differs mainly from that of the sixth embodiment in that a glass plate 17 serving as a light-transmitting portion is formed not only on the sensor portion, but also covering the entire surface of a substrate 33 which serves as a carrying portion.

This constitutional example has a similar face-up constitution to that of the sixth embodiment, and thus when the glass plate serving as a light-transmitting portion is disposed, the post portions, solder balls, and so on are not subject to disposal restrictions as in a face-down constitution.

Hence the glass plate 17 may be provided covering a part of a wiring layer 24 provided on a main surface 12a of a semiconductor chip 12, overhanging the semiconductor chip 12, or in a position covering the entire substrate 33, that is formed over the entire surface layer of the semiconductor device (package). When the glass plate 17 is constituted in this manner, a margin can be ensured upon disposal of the glass plate 17 in a position covering a light-receiving surface 14a of a sensor portion 14, and this is preferable from the point of view of improving reliability in the semiconductor device.

Figure 17:
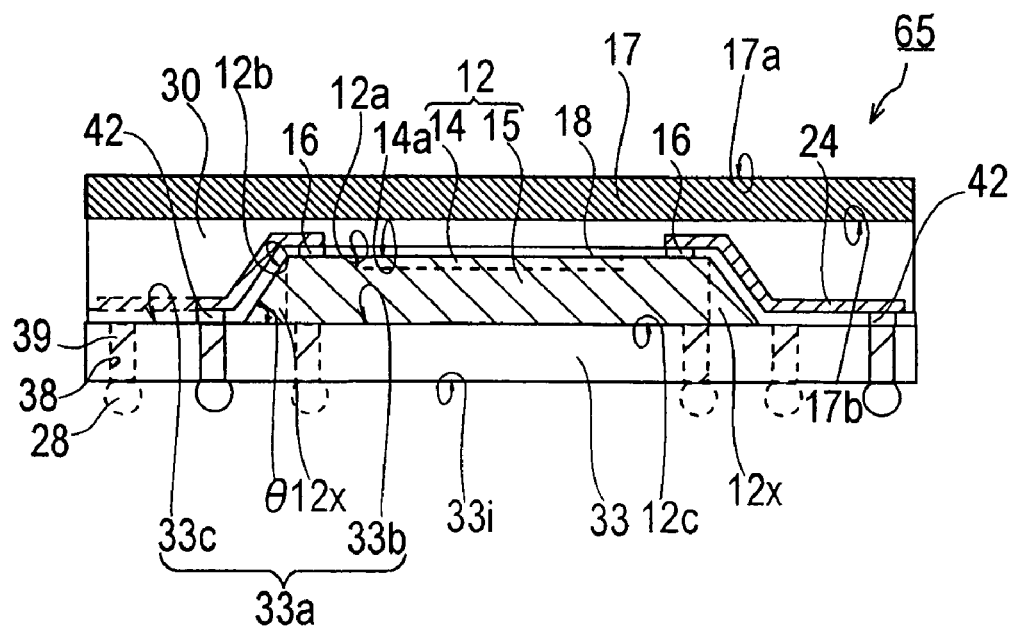
FIG. 17 is a schematic sectional view showing a semiconductor device according to a seventh embodiment of this invention.

In this embodiment, as shown in FIG. 17, it is assumed that the glass plate 17 is formed in a position covering the entire substrate 33.

A manufacturing method for the semiconductor device 65 of this embodiment is performed similarly to that of the sixth embodiment up to and including the wiring layer forming step (see FIG. 15(B)).

Figure 18A:
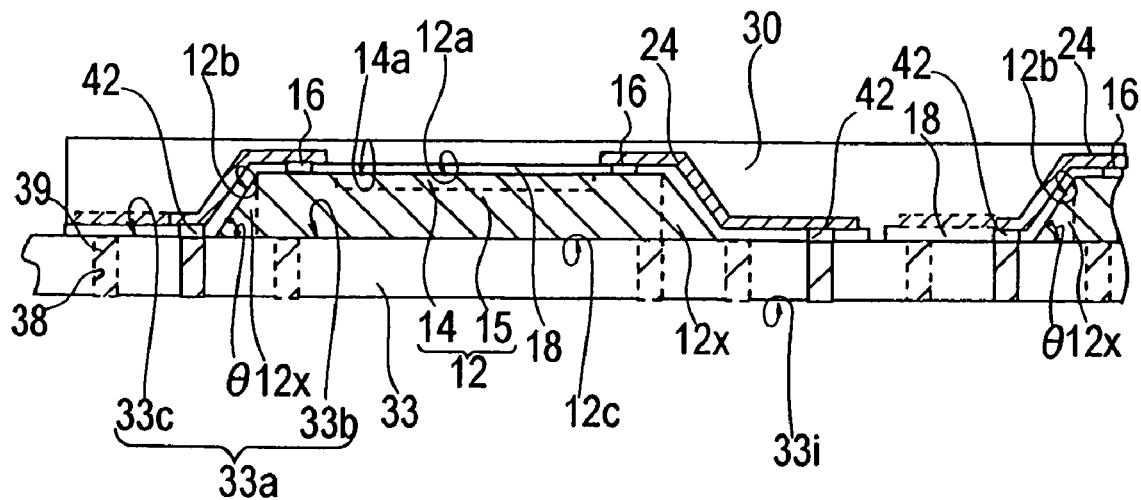
FIGS. 18(A) and (B) are schematic sectional views illustrating manufacturing processes for the semiconductor device according to the seventh embodiment of this invention.

Then, in a sealing material applying step, epoxy resin serving as a light-transmitting sealing material is spin-coated onto the main surface 12a of the first semiconductor chip 12 and a non-placement face 33c so as to bury the first semiconductor chip 12 (FIG. 18(A)).

In this constitutional example, the light-transmitting portion forming step is performed before the applied sealing material is hardened by curing or the like to form the sealing layer 30.

In this constitutional example, a large plane parallel form glass plate 23 is used as a light-transmitting portion continuous body formed from continuous glass plates 17 corresponding to each sensor portion 14 of the plurality of first semiconductor chips 12 on the carrying surface 33a.

Figure 18B:
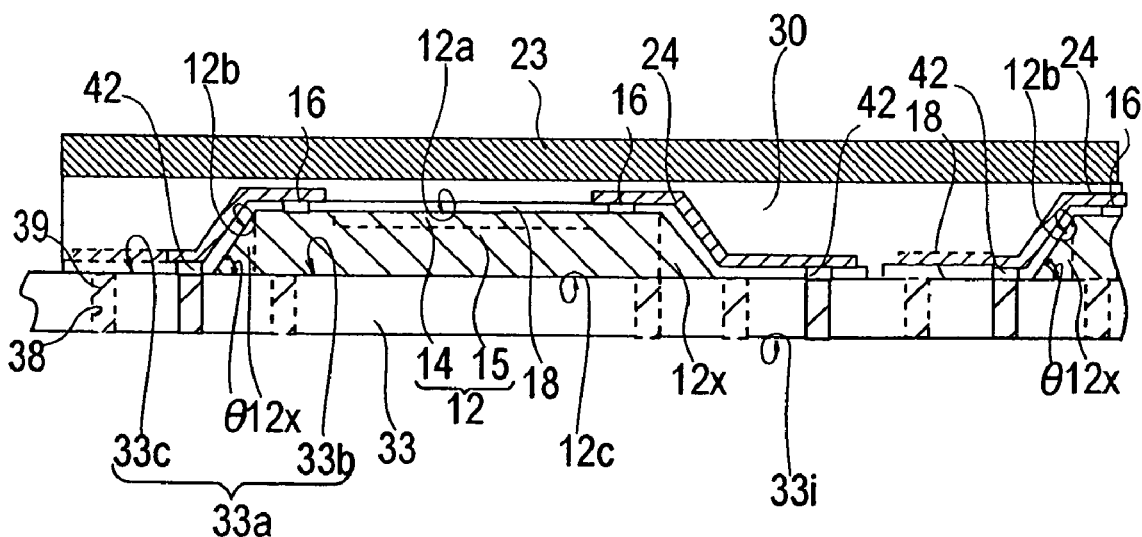

This glass plate 23 is disposed facing the carrying surface 33a of the substrate 33, and thus the individual glass plates 17 are formed simultaneously in respect of the plurality of sensor portions 14 (FIG. 18(B)).

Hence individual glass plates 17 can be formed simultaneously in respect of all of the semiconductor chips 12 on the carrying surface 33a, and moreover, the epoxy resin formed as the sealing layer 30 can also be used as an adhesive for fixing the glass plates 17.

An external terminal forming step is then performed similarly to the sixth embodiment, whereupon the semiconductor device 65 is obtained (see FIG. 17).

As can be understood from the above description, similar effects to the sixth embodiment can be expected in this embodiment.

Moreover, in this embodiment, unlike with the sixth embodiment, the glass plates 17 do not have to be formed individually for each semiconductor chip 12, and thus the manufacturing process can be simplified in comparison with that of the sixth embodiment.

As a result, the manufacturing costs of the semiconductor device are reduced in comparison with the sixth embodiment, and thus an increase in productivity can be expected.

Eighth Embodiment

A semiconductor device according to an eighth embodiment of this invention and a manufacturing method therefor will now be described with reference to FIGS. 19 and 20.

The image-capturing semiconductor device 75 according to this embodiment differs mainly from that of the seventh embodiment in that when a light-transmitting portion 17 is fixed in a position covering a light-receiving surface 14a, which is the exposed face of a light-receiving element portion 14, with a light-transmitting film having a larger expansion coefficient than the expansion coefficient of a carrying portion 33 serving as an adhesive layer 30a, a sealing layer 30b is formed from a sealing material having a smaller expansion coefficient than the expansion coefficient of the light-transmitting film when a part of a sealing layer 30 which buries and thereby seals a first semiconductor chip 12 contacts a non-placement face.

It is well-known that a light-transmitting material such as light-transmitting epoxy resin has a large linear expansion coefficient.

Hence in the case of a semiconductor device (see seventh embodiment) having a sealing layer 30 formed from epoxy resin alone, package warp may occur as a result of a difference in the thermal expansion coefficients between the sealing layer 30 and the substrate 33 serving as a carrying portion. This may lead to a decrease in reliability.

Hence in the sealing layer 30, the sealing layer 30a which doubles as an adhesive for at least the sensor portion 14 and glass plate 17 serves as a light-transmitting layer made of epoxy resin or the like, and at least a part of the remaining sealing layer is set as the layer 30b constituted by a sealing material having a linear expansion coefficient which causes a reduction in warp.

Figure 19:
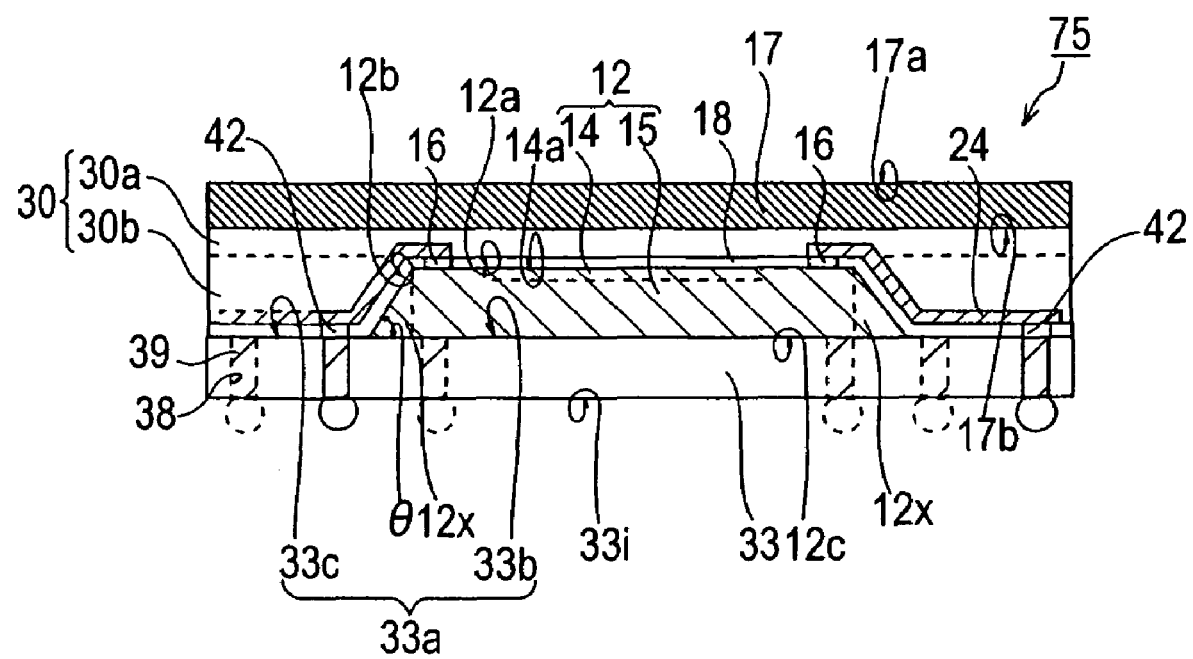
FIG. 19 is a schematic sectional view showing a semiconductor device according to an eighth embodiment of this invention.

As shown in FIG. 19, the sealing layer 30b of the sealing layer 30 on the image-capturing semiconductor device 75, which extends to the height of an insulating film 18 on a main surface 12a of the first semiconductor chip 12, has a smaller expansion coefficient (in this case linear expansion coefficient) than the light-transmitting layer 30a which is applied on the upper side of the insulating film 18 to a height at which the first semiconductor chip 12 is buried.

As a result, undesirable warping of the package caused by a difference in the expansion coefficients of the sealing layer 30 and substrate 33 can be suppressed.

A manufacturing method for the semiconductor device 75 of this embodiment is performed similarly to that of the seventh embodiment up to and including the wiring layer forming step.

Figure 20A:
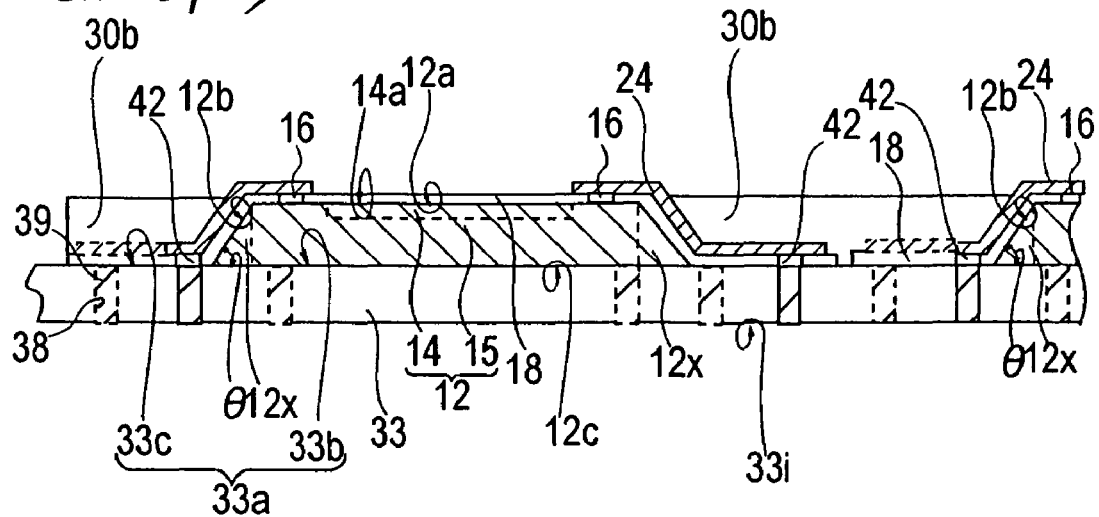
FIGS. 20(A) through (C) are schematic sectional views illustrating manufacturing processes for the semiconductor device according to the eighth embodiment of this invention.

Thereafter, a sealing layer applying step is performed similarly to that of seventh embodiment, but in this embodiment, first the epoxy resin (linear expansion coefficient: 0.8 to 1.5× $10^{-5}/°$ C.) 30b comprising a filler is applied to the height of the insulating film 18 on the main surface 12a of the first semiconductor chip 12 by potting or printing (FIG. 20(A)).

Figure 20B:
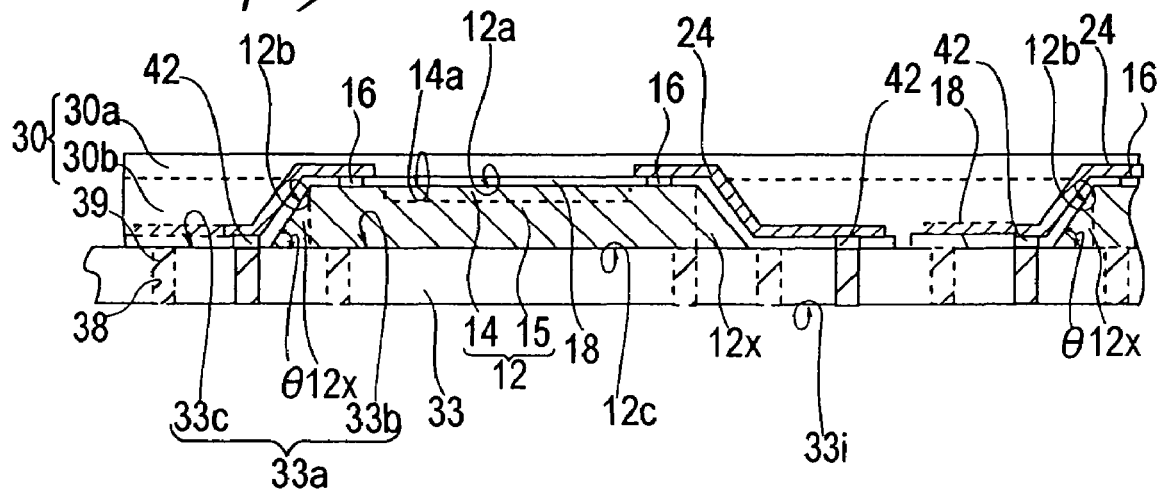

Next, the epoxy resin (linear expansion coefficient: 4 to 7×$10^{-5}/°$ C.) 30a is formed on the upper side of the insulating film 18 up to a height at which the first semiconductor chip 12 is buried by spin coating, potting, printing, or a similar method (FIG. 20(B)). Note that by adjusting the combination of the sealing layers 30a and 30b in consideration of the modulus of elasticity of each sealing material, warp can be reduced even further.

Figure 20C:
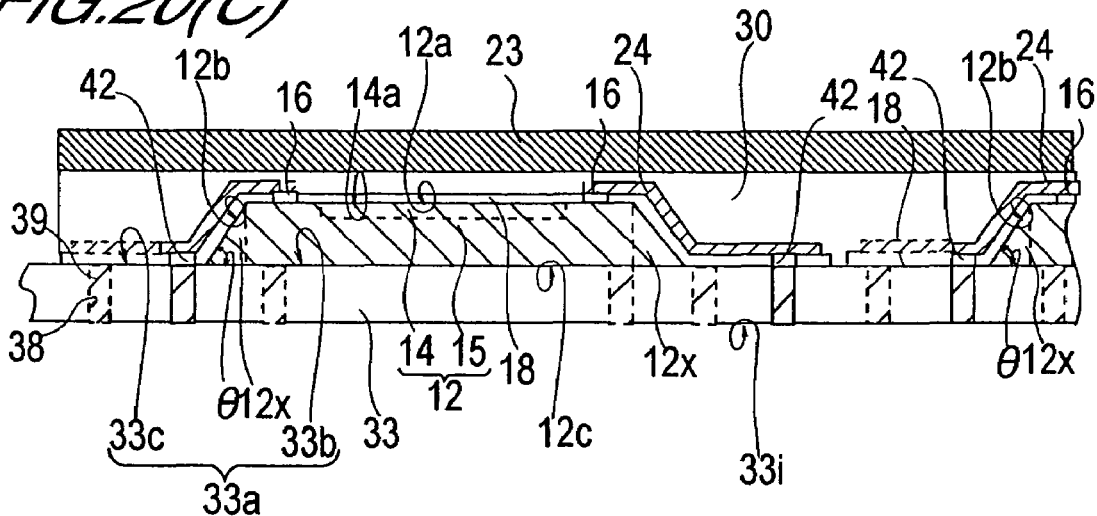

Following the sealing material applying step and prior to hardening the sealing material by curing or the like to form the sealing layer 30, a light-transmitting portion forming step is performed (FIG. 20(C)).

An external terminal forming step is performed similarly to the seventh embodiment, whereupon the semiconductor device 75 is obtained (see FIG. 19).

As can be understood from the above description, similar effects to the seventh embodiment can be expected in this embodiment.

Moreover, in this embodiment warping of the package caused by a difference in the thermal expansion coefficients of the sealing layer and the substrate serving as a carrying portion can be reduced, and thus decreases in reliability can be effectively suppressed.

Ninth Embodiment

A semiconductor device 85 according to a ninth embodiment of this invention and a manufacturing method therefore will now be described with reference to FIGS. 21 and 22.

The image-capturing semiconductor device 85 of this embodiment differs mainly from that of the seventh embodiment in that a concave portion is formed in a face of a light-transmitting portion 17 on the side which opposes an exposed face of the light-receiving element portion 14 corresponding to a convex portion formed through a wiring layer which is connected to first pads 16 on a first main surface 12a of a first semiconductor chip 12.

The thickness of an adhesive film (not shown) made of epoxy resin or the like which is used for fixing the glass plate 17 in a position covering the exposed surface of the sensor portion 14, or in other words the light-receiving surface 14a, is preferably made thin so as not to impair the transmittivity of the incoming light onto the sensor portion 14.

Figure 21:
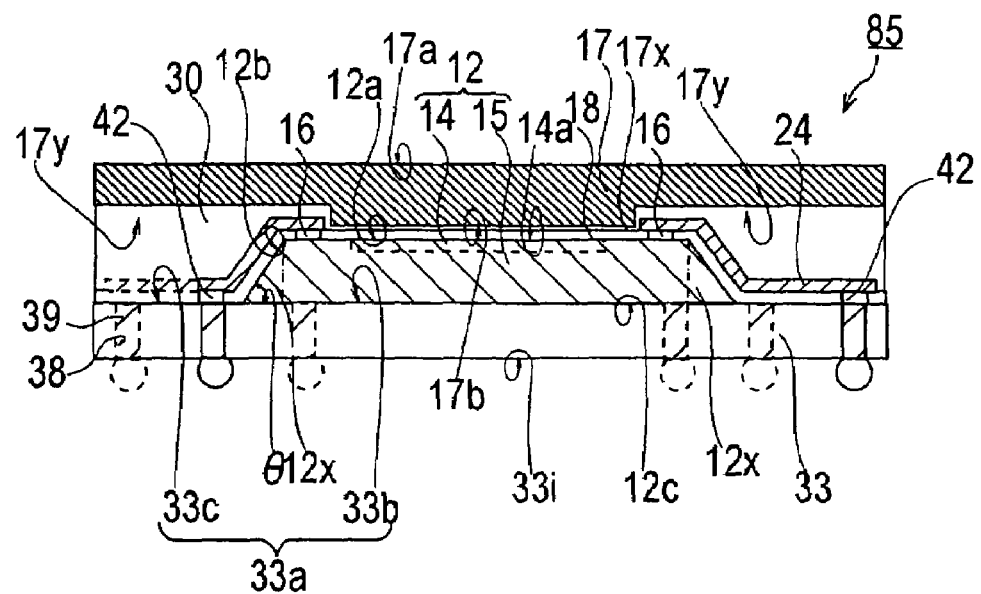
FIG. 21 is a schematic sectional view showing a semiconductor device according to a ninth embodiment of this invention.

As shown in FIG. 21, similarly to the glass continuous body 91 described with reference to FIG. 8, the glass plate 17 comprises a plurality of convex portions 17x opposing the light-receiving surface 14a and concave portions 17y provided on the periphery of the convex portions 17x. In this case, however, post portions are not provided on the glass plate 17 side of the substrate 33, and thus the protruding height of the convex portions 17x is lower than the height of the convex portions 91a of the glass continuous body 91. In other words, in this constitutional example, a concave portion (groove portion) 17y is formed in a face of the glass plate 17 on the side which opposes the light-receiving surface 14a of the sensor portion 14 corresponding to a convex portion formed on the upper face 12a of the first semiconductor chip 12 through the wiring layer 24 which is connected to the first pads 16 on the first main surface 12a. By means of this concave portion 17y, the glass plate 17 and wiring layer 24 are prevented from contacting one another.

As a result, the adhesive film between the glass plate 17 and sensor portion 14 can be made thinner than that of the seventh embodiment, whereby an improvement in transmittivity can be achieved.

Upon the manufacture of the semiconductor device 85 of this embodiment, first, in a concave form glass 41 serving as a light-transmitting portion continuous body, a concave portion (groove portion) corresponding to the wiring layer 24 protruding from the upper side of the first main surface 12a is formed by etching or the like on the surface of a large plate-form glass plate 23 similar to that used in the seventh embodiment which opposes the carrying surface 33a.

A similar wiring layer forming step and sealing material applying step to those of the seventh embodiment are then performed (see FIG. 18(A)).

Figure 22:
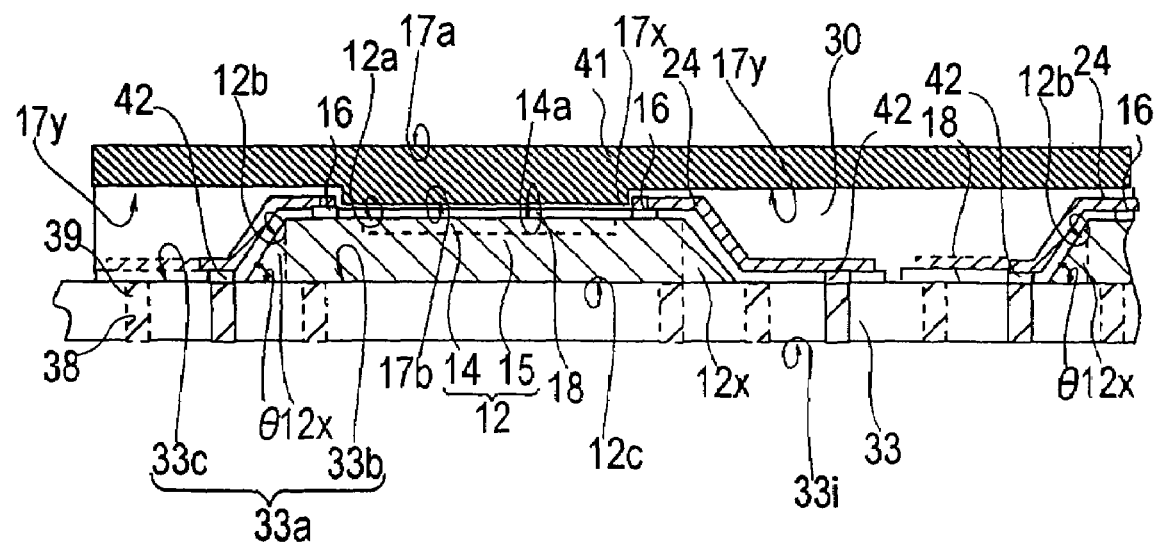
FIG. 22 is a schematic sectional view illustrating a manufacturing process for the semiconductor device according to the ninth embodiment of this invention.

Next, prior to hardening the sealing material by curing or the like, as a light-transmitting portion forming step, the concave form glass 41 described above is disposed and fixed in a position whereby the convex portions of the concave form glass 41 cover each sensor portion 14 (FIG. 22).

A similar external terminal forming step to that of the seventh embodiment is then performed, whereupon the semiconductor device 85 is obtained (see FIG. 21).

As can be understood from the above description, similar effects to the seventh embodiment can be expected in this embodiment.

Moreover, in this embodiment the adhesive film between the sensor portion and glass can be made thinner than that of the seventh embodiment, and thus an improvement in transmittivity can be expected.

Tenth Embodiment

Figure 24A:
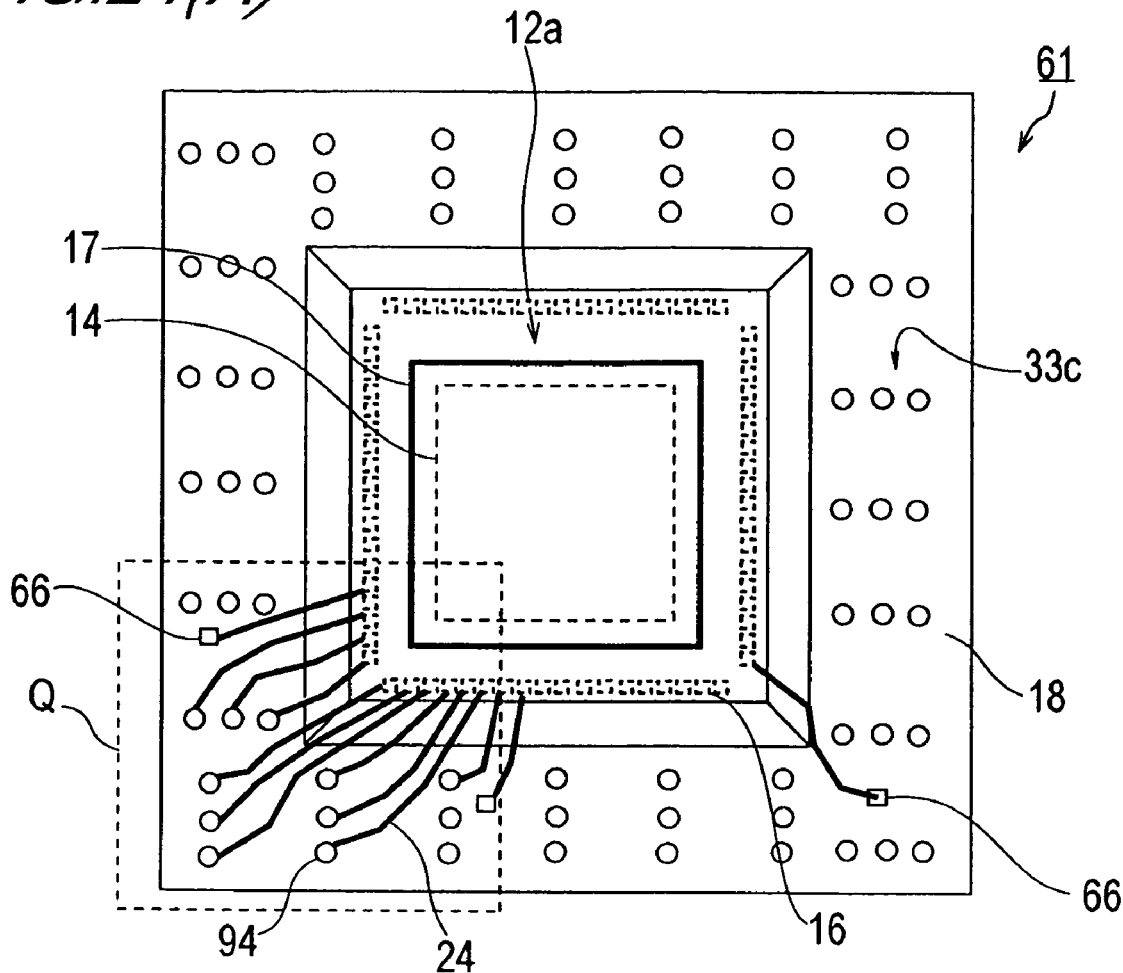
FIG. 24(A) is a schematic plan view showing the semiconductor device according to the tenth embodiment of this invention.
Figure 24B:
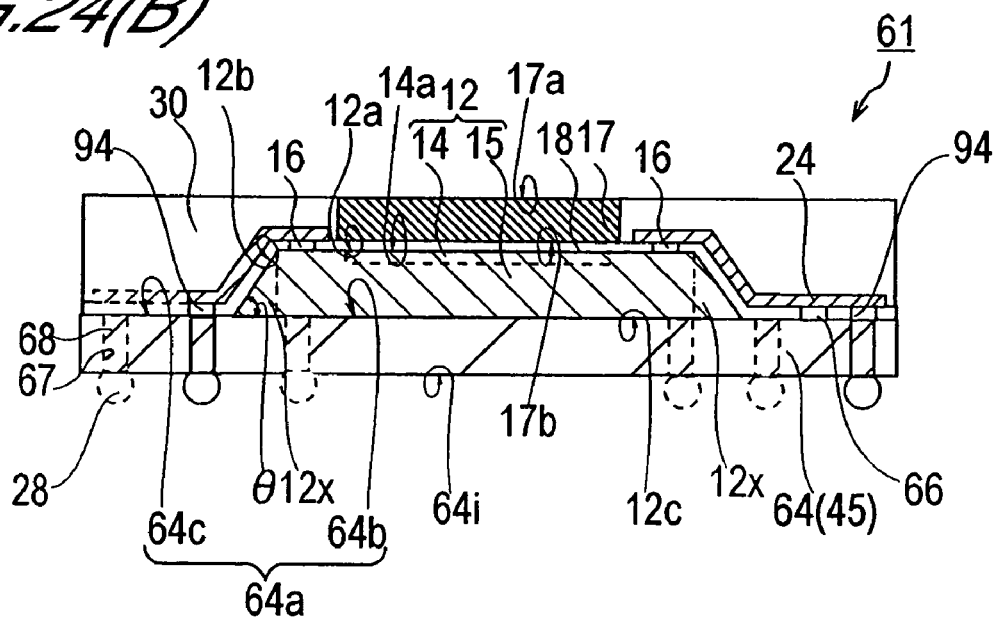
FIG. 24(B) is a schematic sectional view showing a part of the semiconductor device according to the tenth embodiment of this invention.
Figure 25A:
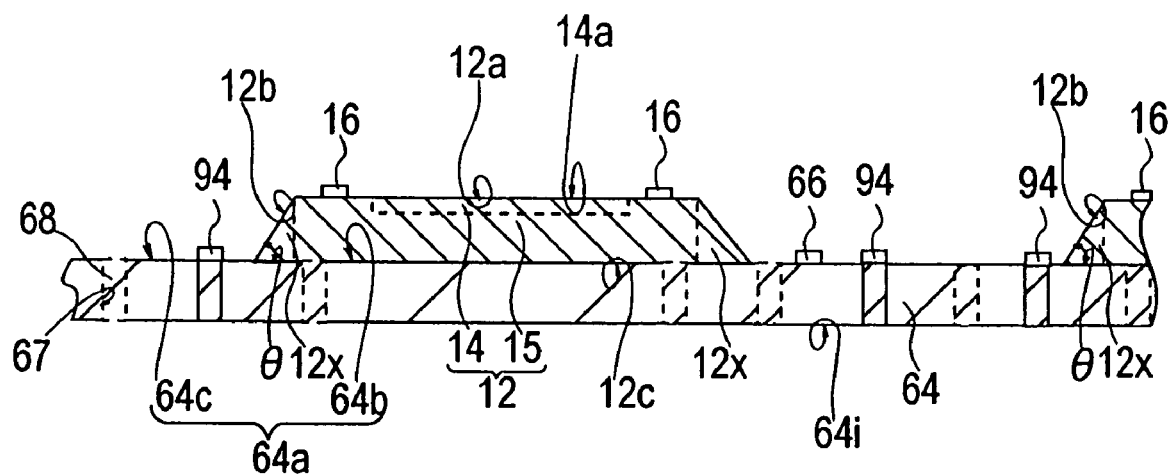
FIGS. 25(A) and (B) are schematic sectional views illustrating manufacturing processes for the semiconductor device according to the tenth embodiment of this invention.
Figure 25B:
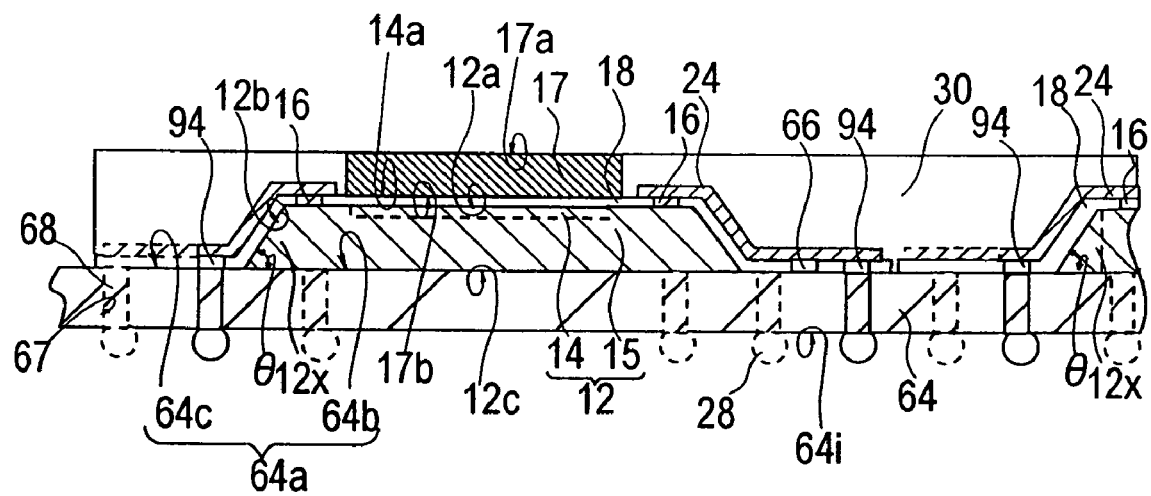

A semiconductor device 61 according to a tenth embodiment of this invention and a manufacturing method therefor will now be described with reference to FIGS. 23 through 25.

This embodiment has a similar face-up constitution to that of the sixth embodiment, but differs mainly from the sixth embodiment in that the semiconductor carrying portion is set as a second semiconductor chip 64 comprising a circuit element, and this second semiconductor chip 64 is electrically connected to a wiring layer 24.

Figure 23:
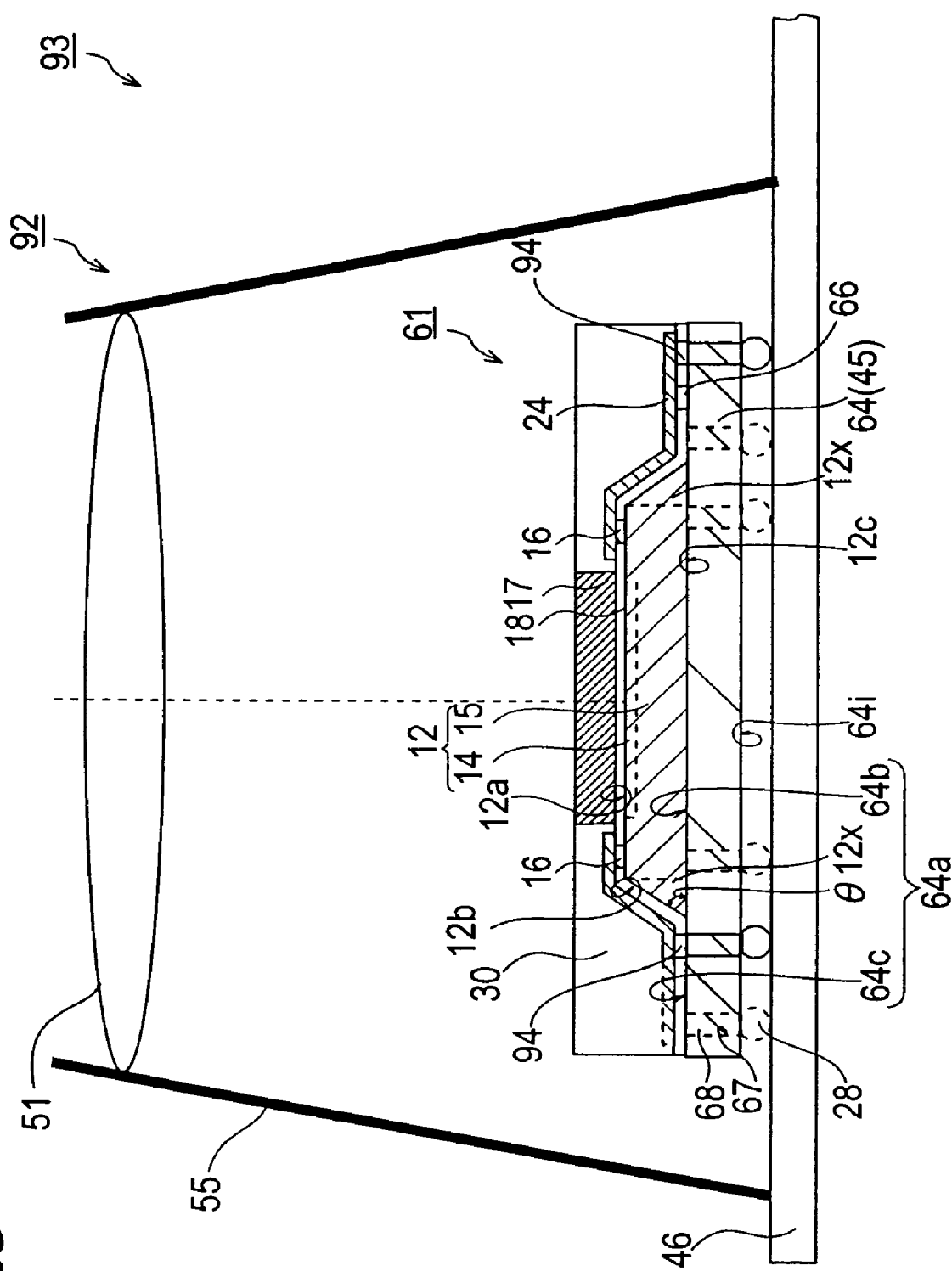
FIG. 23 is a schematic sectional view showing a camera system comprising a semiconductor device according to a tenth embodiment of this invention.

FIG. 23 is a partial schematic cross section of a camera system 93 according to this embodiment for illustrating an example of the main constitutional parts thereof. FIG. 24 (A) is a schematic plan view of the image-capturing semiconductor device 61 provided in a camera portion 92 of the camera system 93 of this embodiment. FIG. 24(B), although not corresponding exactly to FIG. 24(A), is a schematic sectional view showing a modification of the connection relationships and disposal positions of each constitutional element of the image-capturing semiconductor device 61 in order to illustrate these connection relationships and disposal positions.

As shown in FIG. 23, in the camera system 93 of this embodiment only the camera portion 92 is provided on a first printed circuit board 46. That is, no space is provided here for an image processing device such as a DSP.

Next, the image-capturing semiconductor device 61 according to this embodiment will be described in detail with reference to FIGS. 24(A) and 24(B).

A first semiconductor chip 12 is placed on and fixed to a second semiconductor chip 64 serving as a carrying portion. Third pads 66 made of aluminum are disposed on a carrying surface 64a, which is the main surface of the second semiconductor chip 64, at a predetermined pitch. The second semiconductor chip 64 is electrically connected to the wiring layer 24 via the third pads 66. Note that the disposal number and positions of the third pads 66 are not limited to this example.

Here, the second semiconductor chip is a DSP 64, for example. Thus the image-capturing semiconductor device 61 becomes a multi-stacked package MCP constituted by the first semiconductor chip 12 stacked on a placement face 64b of the DSP 64.

Thus the semiconductor device is highly packaged and there is no need to provide space on the first printed circuit board 46 for mounting the DSP 64. As a result, the size of the camera system 93 itself can be reduced in comparison with a conventional camera system.

Further, through holes 67 comprising a conductor portion (copper plating layer) 68 for allowing conduction between the front and rear faces of the DSP 64 are formed in the DSP 64. A second land 94 made of copper foil is formed on the end portion of a first flat surface side of each conductor portion 68. The conductor portions 68 are thus electrically connected to the wiring layer 24 via the second lands 94. Solder balls 28 for mounting the image-capturing semiconductor device 25 onto the first printed circuit board 46 are formed on the end portion of a second flat surface side of the conductor portions 68. Note that the disposal number and positions of the through holes 67 is not limited to this example. The position of the solder balls 28 serving as external terminals is also not limited to the end portion of the conductor portions 68 on a fourth main surface 64i side, and the wiring can be further extended to form solder balls on lands provided in predetermined positions.

An output signal from the first semiconductor chip 12 in this constitutional example is transmitted along both a path from the first pads 16 through the wiring layer 24, second lands 94, and conductor portions 68 to the solder balls 28 and a path from the first pads 16 through the wiring layer 24 and third pads 66 to the second semiconductor chip 64, or along either one of these paths.

Next, a manufacturing method for the semiconductor device 61 will be described with reference to FIG. 25.

First, a similar side wall face forming step to that of the sixth embodiment is performed.

Then, in a placing step, the separated first semiconductor chips 12 are placed at a predetermined pitch on the placement face 64b serving as a first region of the carrying surface 64a which serves as a third main surface of the DSP 64 which serves as the second semiconductor chip. At this time, a rear face 12c of the first semiconductor chip 12 and the placement face 64b are fixed by a die bonding agent (not shown) or the like, for example (FIG. 25(A)). Note that the through holes 67 provided in the DSP 64 may be formed by applying dry etching to through hole forming regions, insulating the inner walls of the through holes with a silicon oxide film (SiO2) or silicon nitride film (SiN), and then filling the through holes with copper or the like.

Next, in a wiring layer forming step, an insulating film 18 made of epoxy resin is formed such that the respective top faces of the first pads 16, third pads 66, and second lands 94 are exposed.

Once the insulating film 18 has been formed, the wiring layer 24 is formed from the side wall surfaces 12b to a non-placement face 64c similarly to the sixth embodiment. At this time, however, the other end of the wiring layer 24 is connected to the third pads 66 or second lands 94 each having prescribed connection relationships.

A similar external terminal forming step to that of the sixth embodiment is then performed, whereupon the semiconductor device 61 is obtained (FIG. 24(B)). Note that the manufacturing method described in the sixth embodiment is cited here as an example, but this invention is not limited thereto, and the methods described in the seventh through ninth embodiments may be appropriately applied.

As can be understood from the above description, similar effects to the seventh embodiment can be expected in this embodiment.

Further, in this embodiment a semiconductor device with a multi-stacked package MCP constitution can be obtained, and thus a smaller the camera system than a conventional camera system can be realized.

Eleventh Embodiment

A semiconductor device 150 according to an eleventh embodiment of this invention will now be described with reference to FIGS. 26 through 29.

Figure 27A:
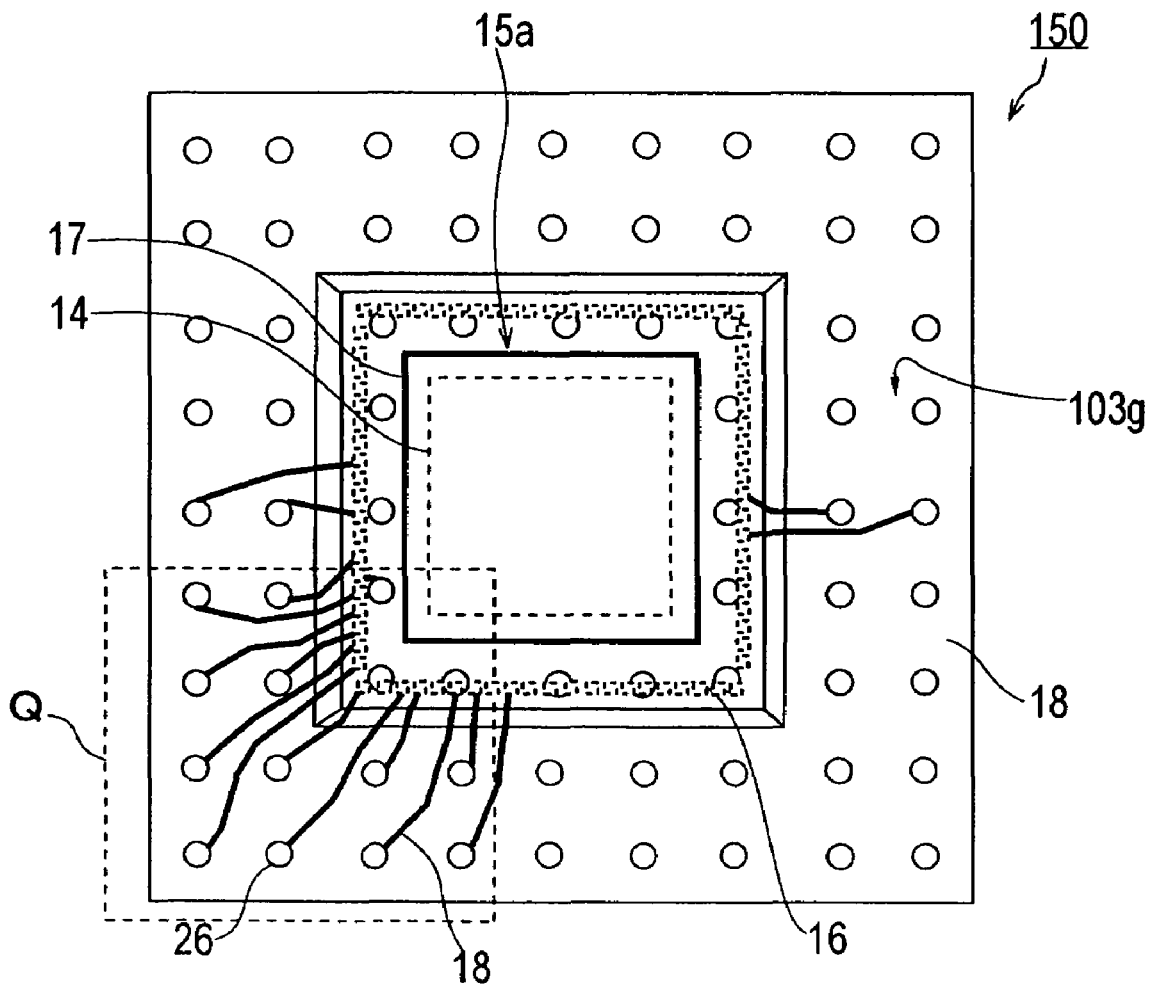
FIG. 27(A) is a schematic plan view showing the semiconductor device according to the eleventh embodiment of this invention.
Figure 27B:
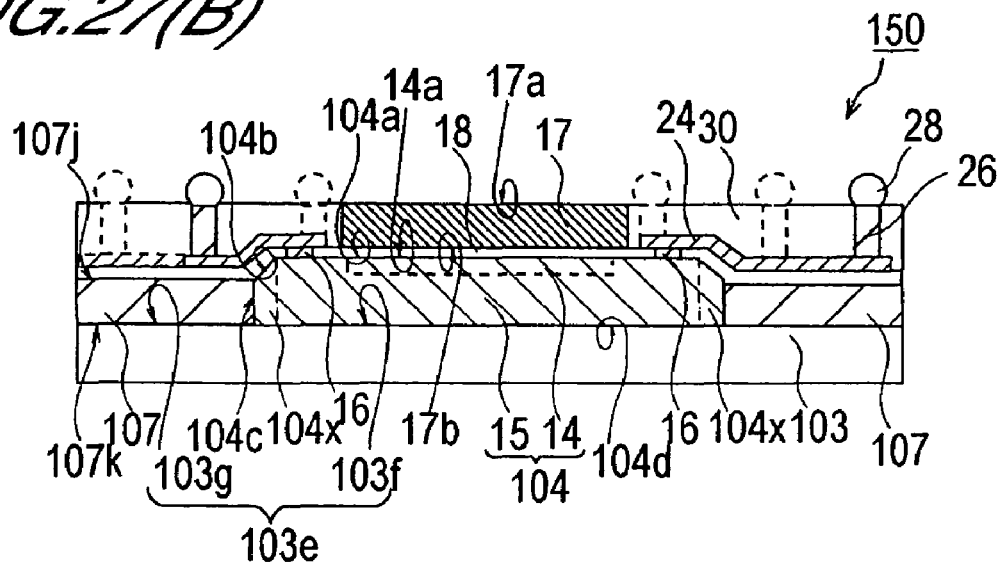
FIG. 27(B) is a schematic sectional view showing a part of the semiconductor device according to the eleventh embodiment of this invention.

FIG. 26 is a partial schematic cross section of a camera system 170 according to this embodiment for illustrating an example of the main constitutional parts thereof. FIG. 27(A) is a schematic plan view of the image-capturing semiconductor device 150 provided in a camera portion 160 of the camera system 170 of this embodiment. FIG. 27(B), although not corresponding exactly to FIG. 27(A), is a schematic sectional view showing a modification of the connection relationships and disposal positions of each constitutional element of the image-capturing semiconductor device 150 in order to illustrate these connection relationships and disposal positions.

As shown in FIG. 26, in the camera system 170 of this embodiment, the camera portion 160 and an image processing device 45 such as a DSP are disposed on a common first printed circuit board (mother board) 46.

This constitutional example has a similar face-down constitution to that of the first embodiment, but differs therefrom in the constitution of the image-capturing semiconductor device 150.

Next, the image-capturing semiconductor device 150 according to this invention will be described in detail with reference to FIGS. 27(A) and 27(B).

Similarly to the first embodiment, a first semiconductor chip 104 provided in the image-capturing semiconductor device 150 has a main surface 104a serving as a first main surface on which a sensor portion 14 is disposed such that a light-receiving surface thereof is exposed. The light-receiving surface 14a of the sensor portion 14 is covered by a glass plate 17. Note that the sensor portion 14 and glass plate 17 are fixed together by a light-transmitting adhesive (not shown) such as epoxy resin similarly to the first embodiment.

First pads 16 are disposed on the main surface 104a of the first semiconductor chip 104 at a predetermined pitch around the outer periphery of the main surface 104a.

In this constitutional example, the first semiconductor chip 104 is placed on and fixed to a carrying surface 103e for the first semiconductor chip 104 on a substrate 103 which serves as a support portion. The region of the carrying surface 103e in which the first semiconductor chip 104 is actually placed is set as a placement face 103f, and the region other than the placement face 103f is set as a non-placement face 103g.

In this constitutional example, the first semiconductor chip 104 comprises a rear face 104d which serves as a second main surface on the substrate 103 side, the main surface 104a serving as a first main surface on the opposite side to the rear face 104d, a continuous inclined side wall face 104b around the periphery of the main surface 104a, and a perpendicular side wall 104c which is perpendicular to the carrying surface 103e of the substrate 103 and formed continuously in respect of the inclined side wall face 104b.

The inclined side wall face 104b is formed by diagonally chamfering the edge portion of a wall face which intersects the main surface 104a of the first semiconductor chip. The remaining portion becomes the perpendicular wall face 104c.

The rear face 104d of the first semiconductor chip and the placement face 103f of the substrate are fixed (bonded) together by a die bonding agent or the like (not shown). Any of the various substrates described above may be used as the substrate 103 serving as a support portion in this constitutional example as long as a supporting function is achieved thereby.

A frame-shape portion 107 made of a photosensitive resin (photosensitive polyimide or the like) and comprising a third main surface 107j which surrounds the first semiconductor chip 104 at a height reaching the inclined side wall face 104b, for example, of side walls 104x of the first semiconductor chip 104 and a fourth main surface 107k which opposes the third main surface 107j is provided on the non-placement face 103g of the substrate so as to surround the side walls of the first semiconductor chip 104 and such that at least a part of the inclined side wall face 104b is exposed.

An insulating film 18 is provided on the upper side of the main surface 104a and inclined side wall face 104b of the first semiconductor chip 104 and the non-placement face 103g such that the top face of the first pads 16 on the main surface 104a of the first semiconductor chip 104 is exposed. The first pads 16 are individually electrically connected to solder balls 28 for mounting the image-capturing semiconductor device 150 on a second printed circuit board 53 via the dedicated wiring layer 24.

More specifically, the wiring layer 24 in this constitutional example is connected to the first pads 16 by one end thereof and extends over the inclined side wall face 104b of the first semiconductor chip 104 and the third main surface 107j of the frame-shape portion 107, and the cross section thereof bends in accordance with the difference of elevation between the main surface 104a and the third main surface 107j of the frame-shape portion 107.

The extending part of the wiring layer 24 is electrically connected to the solder balls 28, which have a designated electrical connection to the first pads 16, via post portions 26.

A sealing layer 30 made of epoxy resin or the like is formed on the upper side of the first semiconductor chip 104 and the frame-shape portion 107 so as to cover the insulating film 18, wiring layer 24, and so on, and such that the top face of the post portions 26 and the upper face of the glass plate 17 are exposed. The upper face of the sealing layer 30 is planar. The solder balls 28 serving as external terminals for connecting the image-capturing semiconductor device 150 to the second printed circuit board 53 are formed on the post portions 26.

An output signal from the first semiconductor chip 104 in this constitutional example is transmitted along a path from the first pads 16 through the wiring layer 24 and post portions 26 to the solder balls 28. Note that this invention is not limited to such a path, and various wiring paths may be formed in accordance with the intended purpose and design specifications.

A manufacturing method for the semiconductor device 150 will now be described with reference to FIGS. 28 and 29.

First, as an inclined side wall face forming step, chamfering of the edge portion between the first main surface 104a and side wall face of the first semiconductor chip 104 comprising the first main surface 104a on which the first pads 16 are formed, the second main surface 104d which opposes the first main surface 104a, and the side wall face which connects the first and second main surfaces (104a, 104d) is performed, whereby a mesa form first semiconductor chip 104 is obtained comprising the inclined side wall face 104b and a second main surface 104d with a larger surface area than the first main surface 104a.

Figure 28A:
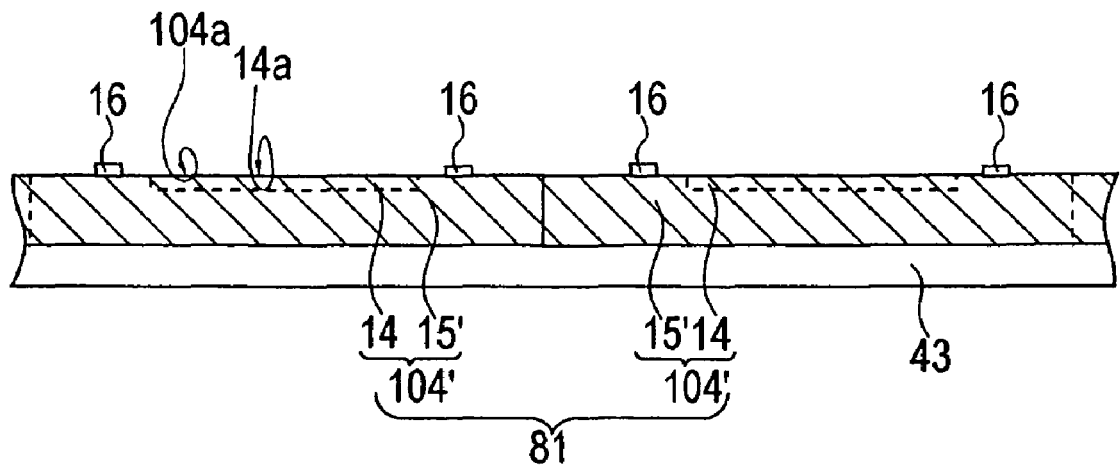
FIGS. 28(A) through (C) are schematic sectional views illustrating manufacturing processes for the semiconductor device according to the eleventh embodiment of this invention.

In order to achieve this, as shown in FIG. 28(A), first a semiconductor wafer 81 comprising a plurality of pre-separation first semiconductor chips 104' is prepared.

The first pads 16 are formed on the main surface 104a of each pre-separation first semiconductor chip 104' at a predetermined pitch. The rear face side of the wafer 81 is adhered to and fixed by wafer fixing tape 43 to which an adhesive (not shown) has been applied. Note that for convenience, approximately two pre-separation first semiconductor chips 104' are illustrated in the drawing, but this invention is not limited thereto. Note also that scribe lines (not shown) are formed between adjacent precursor first semiconductor chips 104' on the semiconductor wafer 81.

Figure 28B:
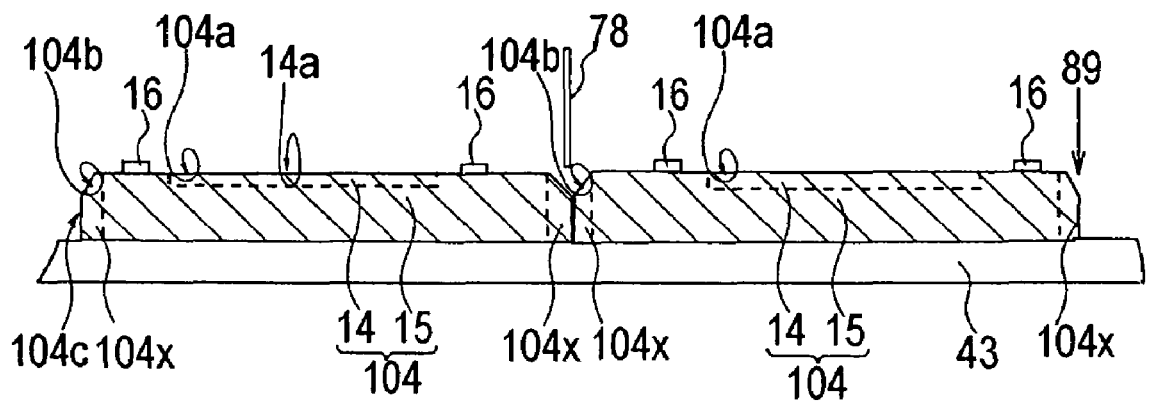

Next, as shown in FIG. 28(B), the edge portion of each precursor first semiconductor chip 104' is chamfered using a high-speed rotary blade (cutting tool) 78 or the like. At this time, the cutting edge of the blade in use has an angle (vertical angle) $\phi$ (approximately $60°<\phi<90°$, for example) such that the cross sectional form of the distal end of the blade 78 has a V shape. Thus grooves 89 cut in a V shape are formed to thereby form the inclined side wall face 104b on the precursor first semiconductor chips 104'. After forming the inclined side wall face 104b, the first semiconductor chips 104 are separated, or divided, using a regular scribing blade 78 or the like.

Next, as a frame-shape portion forming step, the frame-shape portion 107 having an opening portion into which the first semiconductor chip 104 can be fitted is formed on the support portion 103 such that at least a part of the inclined side wall face 104b is exposed.

That is, the frame-shape portion 107 is formed on the substrate 103 serving as a support portion, and in a subsequent process to be described below, the first semiconductor chip 104 is accommodated in the interior of the frame such that the side wall thereof is surrounded and at least a part of the inclined side wall face 104b is exposed.

Figure 28C:
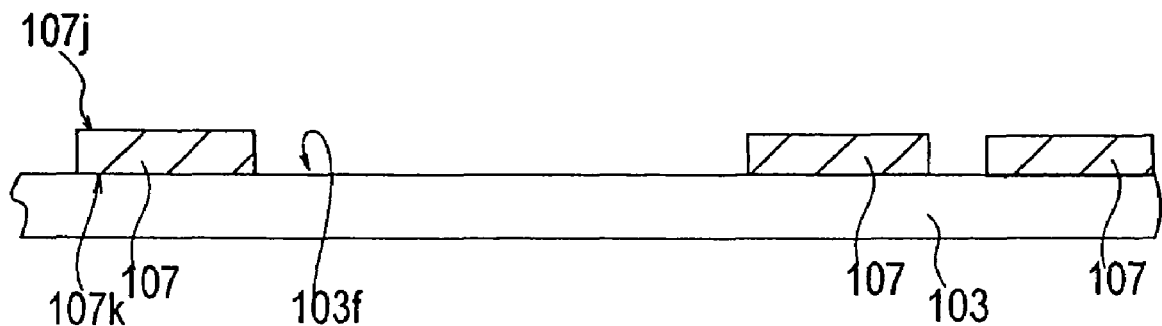

As shown in FIG. 28(C), a photosensitive resin material constituting the frame-shape portion 107 is spin-coated onto the common substrate 103, whereupon the frame-shape portion 107 comprising the third main surface 107j and fourth main surface 107k is formed by photolithography and curing processing, for example. Note that other processing, such as high precision printing, may be applied to the formation of the frame-shape portion 107. The exposed surface of the substrate 103 surrounded by the frame-shape portion 107 is the placement face 103f of the substrate carrying surface 103e.

Next, as a placing step, the first semiconductor chip 104 is fitted into the opening portion and thereby placed on the support portion 103. In order to achieve this, the first semiconductor chip 104 is formed at a magnitude which enables the first semiconductor chip 104 to be fitted into the frame-shape portion 107 with substantially no gaps therebetween.

Figure 29A:
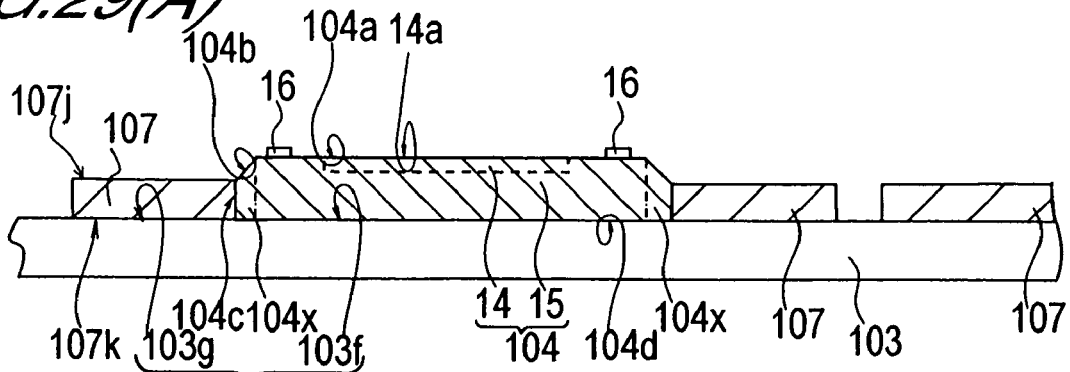
FIGS. 29(A) through (D) are schematic sectional views illustrating manufacturing processes for the semiconductor device according to the eleventh embodiment of this invention.

As shown in FIG. 29(A), each separated first semiconductor chip 104 is placed in a predetermined position on the common substrate 103 which in this case is on the placement face 103f. When the first semiconductor chip 104 is placed on the placement face 103f, the side wall of the first semiconductor chip 104 is surrounded by the frame-shape portion 107. At this time, the rear face 104d of the first semiconductor chip 104 and the placement face 103f are fixed by a die bonding agent (not shown) or the like, for example. Note that in this constitutional example, the first semiconductor chip 104 is placed on the placement face 103f before the photosensitive resin which constitutes the frame-shape portion 107 is completely hardened (at a preliminary hardening stage or the like, for example), and thus adhesiveness between the first semiconductor chip 104 and photosensitive resin 107 can be improved. As a result, the occurrence of gaps (voids) between the first semiconductor chip 104 and photosensitive resin 107 can be suppressed, and an interface with an excellent moisture resistant quality can be formed.

Next, as a wiring layer forming step, the wiring layer 24 is formed such that one end thereof is electrically connected to the first pads 16 and so as to extend from the first pads 16 along the first main surface 104a and inclined side wall face 104b to the upper side of the main surface 107j which is a first plane of the frame-shape portion 107.

Figure 29B:
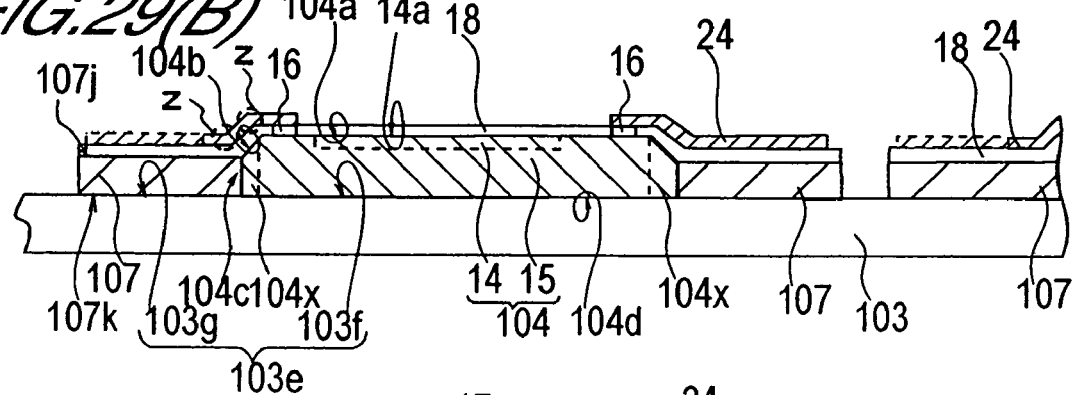

In order to achieve this, as shown in FIG. 29(B), first the insulating film 18 made of epoxy resin is formed over the main surface 104a and inclined side wall face 104b of the first semiconductor chip 104 and the main surface 107j of the frame-shape portion 107 such that the top face of the first pads 16 is exposed.

Here, a difference of elevation (step) exists between the main surface 104a of the first semiconductor chip 104, which forms a base surface for the insulating film 18, and the surface of the frame-shape portion 107, and thus the insulating film 18 is formed to correspond to this step.

Next, the wiring layer 24 made of copper is pattern-formed by photolithography, sputtering, and the like on top of the insulating film 18 from the inclined side wall face 104b to the main surface 107j of the frame-shape portion 107 such that one end thereof is connected to the first pads 16, and such that the cross section thereof bends in accordance with the aforementioned difference of elevation between the main surface 104a and the third main surface 107j of the frame-shape portion 107.

Here, the width of the wiring layer 24 in a substantially orthogonal direction (an orthogonal direction to the paper surface in the drawing) to the direction of extension thereof at the parts of the wiring layer 24 positioned on the boundary between the main surface 104a and inclined side wall face 104b and the boundary between the inclined side wall face 104b and the third main surface 107j (surrounded by a broken line and indicated by z in the drawing) is preferably increased to be wider than the other (remaining) parts of the wiring layer 24.

As a result, the wiring layer 24 on these boundaries, which are susceptible to shock and stress, can be reinforced.

Next, as a light-transmitting portion forming step, the glass plate 17 which is a light-transmitting portion for transmitting incoming light to the sensor portion 14, which is a light-receiving element portion, is formed in a position so as to cover the light-receiving surface 14a of the sensor portion 14.

Figure 29C:
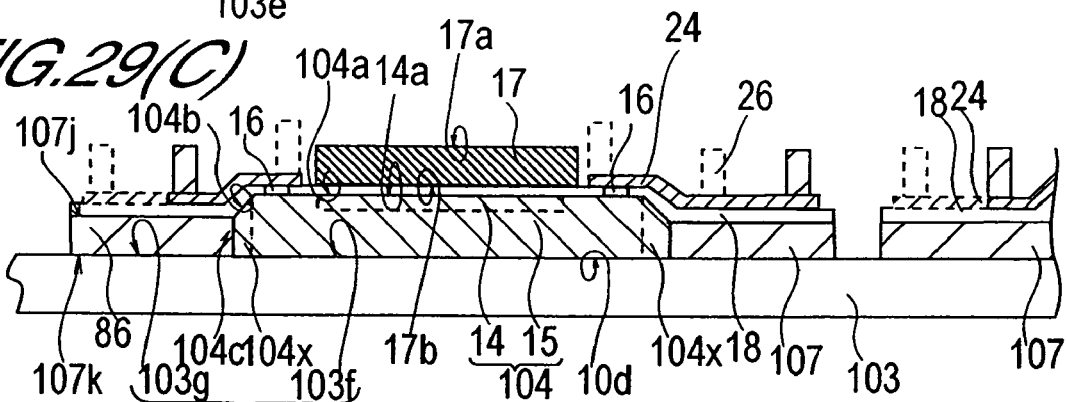

First, as shown in FIG. 29(C), the copper post portions 26 are formed by photolithography, plating, and the like on the wiring layer 24 which extends over the surface of the insulating film 18. Once the copper post portions 26 have been formed, a thin oxidation film may be formed on the side surface of the post portions 26 by thermal oxidation or the like. In so doing, adhesion between the post portions 26 and the sealing layer 30 to be described below is improved and moisture penetration through the interface between the two members can be suppressed. As a result, reliability is further improved.

Next, the glass plate 17 serving as a light-transmitting portion is provided in a position so as to cover the entire light-receiving surface 14a of each sensor portion 14 and fixed (bonded) individually to each first semiconductor chip 104 by an adhesive (not shown) such as an epoxy resin. The upper face 17a of the glass plate 17 is subjected to mirror polishing in order to improve transmittivity.

Next, as an external terminal forming step, external terminals are formed so as to be electrically connected to the first pads 16 via the wiring layer 24.

Figure 29D:
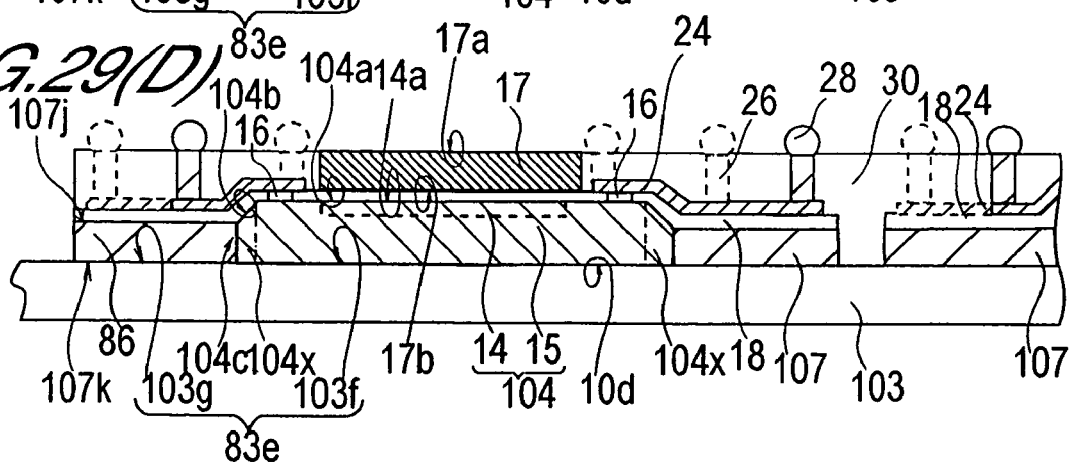

As shown in FIG. 29(D), the sealing layer 30 constituted by a sealing material such as epoxy resin is formed using a transfer mold method or a printing method such that the post portions 26 are hidden. The post portions 26 and sealing layer 30 are then ground (polished) using a grinder (polishing tool) or the like so as to become equal to the height of the upper face of the glass plate 17. By means of this polishing, the top faces of all of the post portions 26 are exposed to form carrying surfaces for the external terminals (solder balls). Note that when the post portions 26 are formed, if each of the post portions 26 is formed at an equal height in a vertical direction, the polishing step for forming external terminal carrying surfaces using a film formation method or the like may be omitted.

The solder balls 28 serving as external terminals for connecting the image-capturing semiconductor device 150 to the second printed circuit board 53 are then formed on the exposed external terminal carrying surfaces by reflowing. Note that when necessary, a barrier metal layer or the like may be formed between the external terminal carrying surfaces and solder balls 28.

The wafer 81 is then cut into individual semiconductor devices (packages) 150 (see FIG. 27(B)) using a regular scribing high-speed rotary blade (cutting tool) or the like (not shown).

As can be understood from the above description, similar effects to the second embodiment can be expected in this embodiment.

Moreover, in this embodiment an inclined side wall face such as that described above is provided on a part of the side walls of the first semiconductor chip, and thus the part of the first semiconductor chip side walls which is exposed from the frame-shape portion may be formed as an inclined side wall face. Hence in this embodiment the side walls of the first semiconductor chip other than the inclined side wall face may be formed as perpendicular walls (perpendicular end faces).

Thus dicing for forming the inclined side wall face can be performed at a shallower level than in the second embodiment, in which the inclined side wall surfaces are formed by dicing up to the rear face of the chip, and hence the breadth of the dicing line on the wafer can be reduced.

As a result, the number of chips integrated onto one wafer can be increased such that rises in the manufacturing cost of the semiconductor device can be suppressed.

Moreover, the amount of usage of the V-shaped blade which is prone to abrasion is reduced and thus, in comparison with the first embodiment, the longevity of the blade can be increased and the cutting time when the first semiconductor chips are separated can be reduced.

Twelfth Embodiment

A semiconductor device 180 according to a twelfth embodiment of this invention will now be described with reference to FIG. 30.

Figure 30:
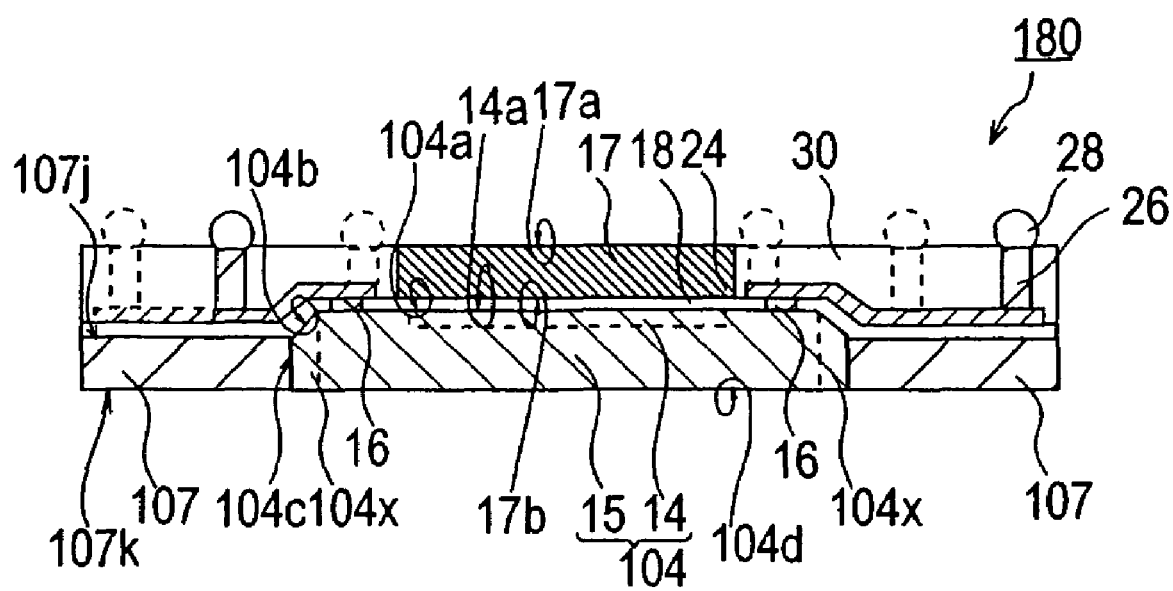
FIG. 30 is a schematic sectional view showing a semiconductor device according to a twelfth embodiment of this invention.

As shown in FIG. 30, the semiconductor device 180 of this embodiment differs from that of the eleventh embodiment in that the substrate 103 serving as a support portion is not provided.

In a manufacturing method for the semiconductor device 180 of this embodiment, a substrate (not shown) having a mildly adhesive surface characteristic is used as a support portion during the placing step described in the eleventh embodiment. Note that a cured polyimide film or the like on which ashing processing using optical plasma has been implemented or into which hydrophobic groups have been introduced by means of CF4 plasma processing may be used as the substrate having a mildly adhesive surface characteristic.

After performing an external terminal forming step in a similar manner to that of the eleventh embodiment, a support portion removing step is performed in this embodiment for removing the substrate 103 by peeling the substrate 103 away using a vacuum or the like, whereby the semiconductor device 180 is obtained.

As can be understood from the above description, similar effects to the second embodiment can be expected in this embodiment.

Moreover, in this embodiment the substrate 103 serving as a support portion is not provided, and thus the film thickness of the semiconductor device can be reduced in comparison to that of the eleventh embodiment.

The above descriptions are not limited only to the combinations described in the above embodiments. Hence preferred conditions can be inserted at any stage and applied to this invention.

For example, a BGA form was described in each of the embodiments described above, but this invention may also be favorably applied to an LGA form.

As can be understood from the above description, according to this invention a semiconductor device which is used favorably as an image-capturing semiconductor device can be obtained with a simplified constitution and by means of a smaller number of processes than a conventional device.

As a result, the manufacturing costs of the semiconductor device and a camera system which uses the semiconductor device can be reduced in comparison with a conventional device and the productivity thereof can be improved.

As described below, a camera system can be favorably constructed in accordance with the semiconductor device of this invention.

A camera system comprises the semiconductor device of this invention, a lens which is disposed opposite a light-receiving element portion of the semiconductor device of this invention for condensing incoming light to the light-receiving element portion, and an image processing device for processing an electrical signal outputted by the semiconductor device of this invention in response to the incident light on the light-receiving element portion of the semiconductor device of this invention.

What is claimed is:

1. A semiconductor device comprising:
    a semiconductor chip;
    first pads provided on a main surface of said semiconductor chip such that a light-receiving surface thereof is exposed;
    a light-receiving element portion provided on said main surface of said semiconductor chip such that a light-receiving surface thereof is exposed;
    a light-transmitting portion provided so as to cover the light-receiving surface of said light-receiving element portion for transmitting incoming light to said light-receiving element portion;
    an insulating film provided over said main surface of said semiconductor chip, the insulating film having a first region and a second region, the light-transmission portion being disposed on a surface of the first region, the second region surrounding said first pads so as to expose surface portions of said first pads, the first and second regions having substantially the same thickness;
    wiring patterns electrically connected to said first pads, the wiring patterns extending from said surface portions of said first pads and over said insulating film;

post portions provided on said wiring patterns, a combination of the wiring patterns and the post portions thereon having substantially the same thickness as the light-transmitting portion;

a sealing layer provided on said wiring patterns, on said insulating film, on a side surface of said light-transmitting portion, and on side surfaces of said post portions, such that an upper surface of said light-transmitting portion and top surfaces of said post portions are exposed, said sealing layer having cut side surfaces which are cut by a blade and which are substantially in the same plane of side surfaces of said semiconductor chip; and external terminals provided on the top surfaces of said post portions.

2. The semiconductor device according to claim 1, further comprising an oxidation film formed on the side surfaces of said post portions.

3. The semiconductor device according to claim 1, wherein the sealing layer directly contacts the side surface of said light-transmitting portion.

4. The semiconductor device according to claim 1, wherein said wiring patterns physically and directly contact said surface portions of said first pads.

5. The semiconductor device according to claim 1, wherein said wiring patterns are uniformly spaced apart from said main surface of said semiconductor chip.

6. The semiconductor device according to claim 1, wherein the light-transmission portion directly contacts the surface of the first region of the insulating film.

7. A semiconductor device comprising:
a semiconductor chip having a first main surface and a second main surface opposed to the first main surface;
a first pad formed on the first main surface;
a light-receiving element formed on the first main surface;
a light-transmitting member provided over said light-receiving element, said light-transmitting member transmitting incoming light to said light-receiving element;
an insulating film provided over said first main surface, the insulating film having a first region and a second region, the light-transmission portion being disposed on a surface of the first region, the second region surrounding said first pad so as to expose surface portions of said first pad, the first and second regions having substantially the same thickness;
a wiring pattern electrically connected to said first pad, the wiring pattern extending from said surface portions of said first pad and over the insulating film;
a post electrode formed on the wiring pattern, a combination of the wiring pattern and the post electrode thereon having substantially the same thickness as the light-transmitting member;
a sealing layer formed on said wiring pattern, on said insulating film, on a side surface of said light-transmitting member, and on a side surface of said post electrode, such that an upper surface of said light-transmitting member and a top surface of said post electrode are exposed, said sealing layer having cut side surfaces which are cut by a blade and which are substantially in the same plane of side surfaces of said semiconductor chip; and
an external terminal formed on a top surface of said post electrode.

8. The semiconductor device according to claim 7, further comprising an oxidation film formed on the side surface of said post electrode.

9. The semiconductor device according to claim 7, wherein the sealing layer directly contacts the side surface of said light-transmitting member.

10. The semiconductor device according to claim 7, wherein said wiring pattern physically and directly contacts said surface portions of said first pad.

11. The semiconductor device according to claim 7, wherein said wiring pattern is uniformly spaced apart from said first main surface of said semiconductor chip.

12. The semiconductor device according to claim 7, wherein the light-transmission member directly contacts the surface of the first region of the insulating film.

* * * * *